(12) United States Patent
Spotti

(10) Patent No.: US 10,873,000 B2
(45) Date of Patent: Dec. 22, 2020

(54) METHOD AND AUTOMATIC PRODUCTION PLANT FOR PRINTING ON PHOTOVOLTAIC CELLS

(71) Applicant: VISMUNDA SRL, Padua (IT)

(72) Inventor: Davide Spotti, Trieste (IT)

(*) Notice: Subject to any disclaimer, the term of this patent is extended or adjusted under 35 U.S.C. 154(b) by 34 days.

(21) Appl. No.: 16/076,832

(22) PCT Filed: Jun. 20, 2016

(86) PCT No.: PCT/IB2016/000868
§ 371 (c)(1),
(2) Date: Aug. 9, 2018

(87) PCT Pub. No.: WO2017/149347
PCT Pub. Date: Sep. 8, 2017

(65) Prior Publication Data
US 2019/0067508 A1 Feb. 28, 2019

(30) Foreign Application Priority Data
Feb. 29, 2016 (IT) .................. 102016000020710

(51) Int. Cl.
*H01L 31/18* (2006.01)
*B41F 15/12* (2006.01)
(Continued)

(52) U.S. Cl.
CPC .......... *H01L 31/1876* (2013.01); *B41F 15/12* (2013.01); *H01L 21/67259* (2013.01);
(Continued)

(58) Field of Classification Search
CPC .......... H01L 31/1876; H01L 21/67259; H01L 21/67288; H01L 21/67706; H01L 21/67778
See application file for complete search history.

(56) References Cited

U.S. PATENT DOCUMENTS

| 7,580,558 B2 | 8/2009 | McEvoy et al. |
| 10,308,446 B2 * | 6/2019 | Spotti .................... B65G 35/06 |

(Continued)

FOREIGN PATENT DOCUMENTS

| CN | 102514359 B | 1/2014 |
| EP | 1918101 A1 | 5/2008 |

(Continued)

OTHER PUBLICATIONS

International Search Report for corresponding PCT/IB2016/000868.

*Primary Examiner* — Austin Murata
(74) *Attorney, Agent, or Firm* — Egbert Law Offices, PLLC

(57) ABSTRACT

A method and related automatic production plant are disclosed for the silk-screen printing of inks or conductive pastes on photovoltaic cells or wafers, with an integrated handling system of the LSM moving coils drive type, wherein multiple shuttles with on-board coils act on a rail with permanent magnets in an independent but coordinated way, synchronous and/or asynchronous with respect to each other, to simultaneously perform missions different from each other in such a way as to advantageously carry out the printing operating steps provided by the method. Each shuttle is provided with an equipped tray of the removable type which is specifically configured to carry out the automated processing of the single cell, it also being intended to interact with the plant.

12 Claims, 35 Drawing Sheets

Figure 1A:
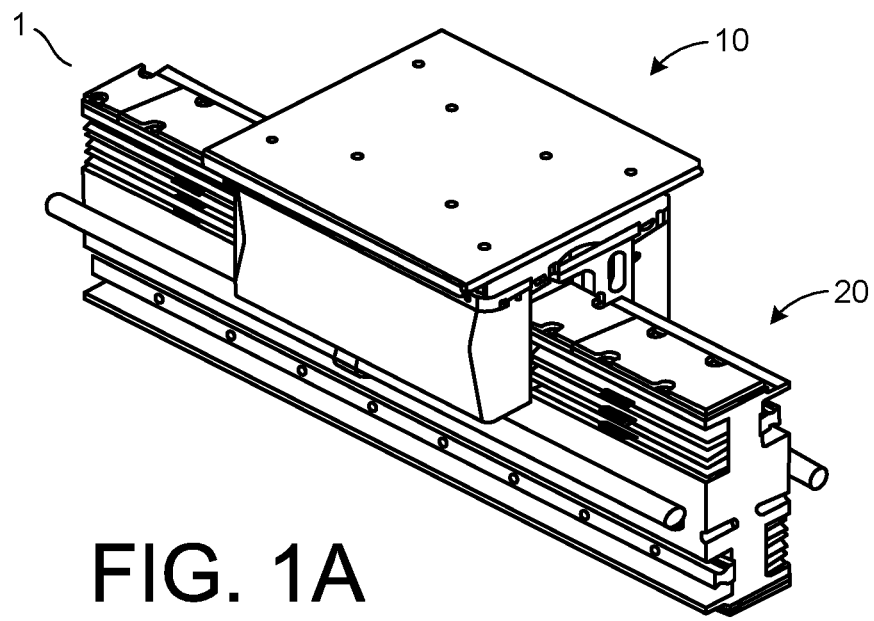

(51) Int. Cl.
*H01L 21/67* (2006.01)
*H01L 21/677* (2006.01)

(52) U.S. Cl.
CPC .. *H01L 21/67288* (2013.01); *H01L 21/67706* (2013.01); *H01L 21/67778* (2013.01); *H01L 31/18* (2013.01)

(56) References Cited

U.S. PATENT DOCUMENTS

| | | |
|---|---|---|
| 2005/0166772 A1 | 8/2005 | Schanz |
| 2012/0064250 A1 | 3/2012 | Baccini et al. |
| 2012/0109355 A1 | 5/2012 | Baccini et al. |
| 2015/0191104 A1 | 7/2015 | Zocco |

FOREIGN PATENT DOCUMENTS

| | | |
|---|---|---|
| EP | 2711183 A1 | 3/2014 |
| GB | 2452320 A | 3/2009 |
| WO | 2011026883 A1 | 3/2011 |

\* cited by examiner

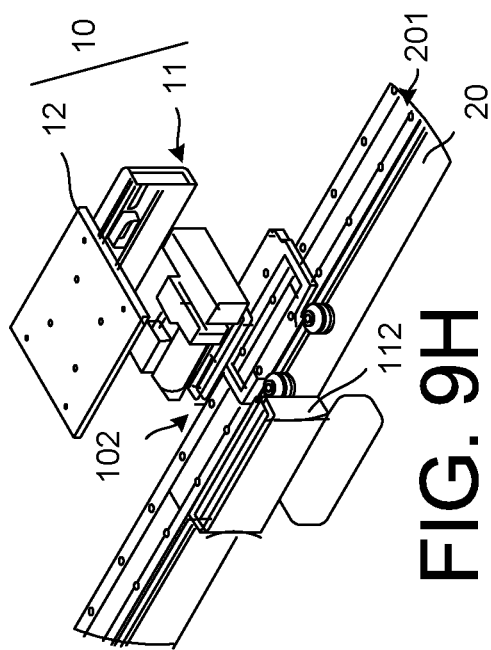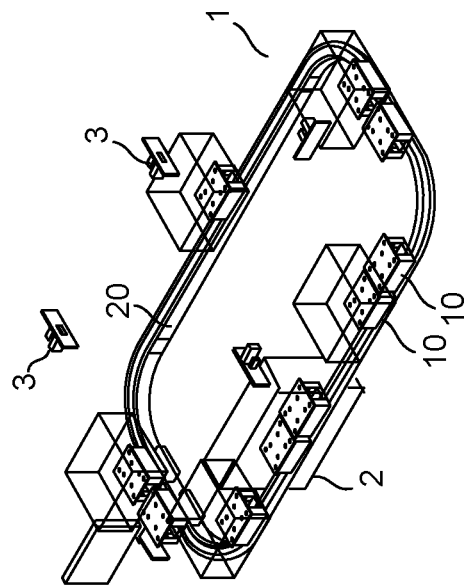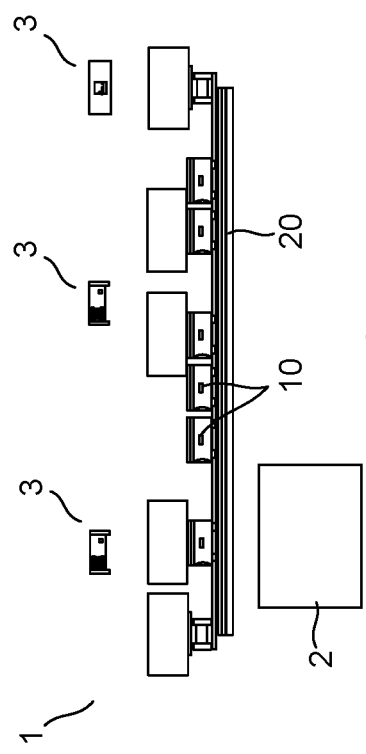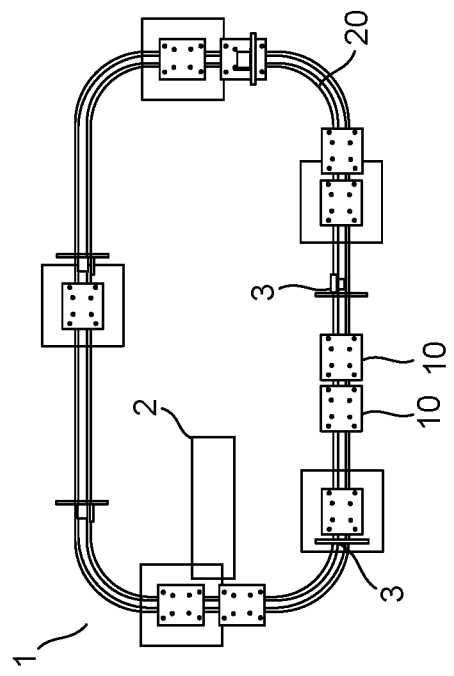
FIG. 9H
FIG. 9G
FIG. 9E
FIG. 9F

METHOD AND AUTOMATIC PRODUCTION PLANT FOR PRINTING ON PHOTOVOLTAIC CELLS

The present invention relates to a method and an automatic production plant for the silk-screen printing of inks or conductive pastes on photovoltaic cells or wafers.

FIELD OF THE INVENTION

The invention is used in the sector of modern automated production equipment for the industry, or industrial automation, with the need for large production volumes and great precision of the working processes; in particular, the invention is intended for the automated silk-screen printing on photovoltaic cells or wafers, with inks or conductive pastes. More widely, it is intended for the continuous silk-screen printing of flat semi-finished products, printed circuits and other circuit boards, with great quality and repeatability.

In general, the modern industrial silk-screen printing systems comprise automatic or semi-automatic handling systems of the pieces to be printed and also integrate vision systems for the automatic check of the position and of the quality of the working processes carried out; such systems, moreover, are electronically managed by means of at least one logic control unit provided with the programs of processing and execution of the operations, being for example a programmable PLC controller. The operators of the sector also know that in case of handling of very delicate and fragile products also with an extremely high level of printing accuracy, as it particularly occurs in the metallization of photovoltaic cells or in the printing on silicon wafers of the thin electrical conductors which are also called fingers and busbars, the conventional systems of positioning and control of the substrates with respect to the printhead are not adequate, it being necessary to provide evolved handling solutions, that is to say, improved and integrated in such a way as to ensure great precision, quality and repeatability of the silk-screen operations, also with large production volumes, low costs and little waste.

In more detail as to said metallization on cells or wafers, in order to obtain with precision said superficial conductive elements, a controlled deposition of inks or conductive pastes is provided by means of the silk-screen printing technique; however, it is known that the final efficiency of a photovoltaic cell depends directly on the quality of execution of said deposition, and it is also known that the final cost of the product largely depends on the overall cost of the silk-screen printing process comprising the costs due to waste and to plant downtime. Therefore, it has been observed that, since the width and/or the thickness of the single conductive element is of a few micrometres, the execution of said silk-screen printing with the methods and the plants available on the market can be largely improved; for years the main companies of the sector have been engaged in increasing the execution quality of said plants and also increasing productivity with innovative printing methods and, particularly, innovative systems of automated handling of the cells or wafers, which allow to considerably improve the repeatability and the precision of the relative positioning between the support and the printhead, also with automatic adaptation means as explained in the following.

Nowadays, in general, diversified technical solutions for industrial handling are available on the market, which are individually provided with a characteristic degree of complexity, flexibility of use, positioning accuracy, speed and cost. For example, one should remember the conventional conveyor belts and rotary tables or, conversely, the modern integrated electromagnetic drive systems with automated control wherein multiple coordinated vehicles, which are also called shuttles or movers, slide on a rail provided with sensors; such vehicles, in particular, are intended to individually carry the semi-finished products and also prearrange them in an optimal way in correspondence of the workstations. Therefore, it is evident that each handling system provides particular functions and characteristics, being for example selected depending on the cost, on the degree of accuracy and on production requirements. However, the operators of the sector know that, by integrating in the production line a more evolved and automated handling system, some problems of precision and repeatability of the positioning, short duration and/or low overall reliability may arise; for example, one should consider the systems with shuttles on a rail where the communication between one single shuttle and the centralized control system is sometimes difficult, little effective and/or not reliable, particularly in the systems with multiple shuttles having different missions. Furthermore, it is also known and desirable that the control system intended for the overall management of such an integrated handling system is of the robust and simple type, safe, easy to be maintained and modified and also easy to be interfaced and/or synchronized with external operating units, such as the single automated workstations.

All this considered, some problems were found in the most used handling systems, which are particularly relevant if applied to said silk-screen printing on cells or wafers. Mainly, one should remember the conveyor belts where on the same belt section the pieces or the trays move with a regular pace arrangement, or continuously, in any case all according to the same law of motion; it is also known that the synchronization of different belt sections imposes many sensors and many actuators and/or pacers. Moreover, a considerable energy absorption has been observed for the movement of useless sections or members, that is to say, not necessary for a specific working process. In general, all the handling solutions based on conveyor belts or rollers feature slipping and pivoting of the pieces or trays with low precision, that is to say, little positioning accuracy and repeatability, if not assisted by other accessory systems; furthermore, the problem of lack of opposition or support rigidity is known. Finally, in these systems the problems of sequential contamination of the successive pieces on sections of contaminated belt are also known, for example in the case of breaking or spilling, and high wear with the need for frequent adjustments, maintenance and replacements; to this purpose, for example, it has been observed that the breaking or replacement of only one belt normally leads to the stop of the whole handling system.

The above-mentioned disadvantages, in principle, can also be observed on handling systems with pallets on belts, with chains or pilgrim process. The known rotary table systems, on the other hand, feature during the operation some variable offsets which are difficult to be kept stable in time, in addition to said sequential contamination of the successive pieces arranged on the contaminated sections, to wear, to frequent maintenance; furthermore, in said systems there is more complexity in the operations of loading and unloading of said table.

In modern industrial handling one also uses linear units with gear wheels and/or worm screws where the trolley supporting the working processes is translated along a rectilinear rail, for example having a corresponding trapezoidal or similar profile for the purpose of stability; such solutions require additional driving means, for example a rotary electric motor, and also require a high level of maintenance. Among the others, one should remember the linear units with ball recirculation sliding, which require continuous and frequent lubrication. More generally, it has been observed that the linear units of the conventional type are suitable for isolated applications but not for integrated handling systems in which multiple shuttles simultaneously perform different missions, being expensive and limited in their versatility of use.

Among the systems with vehicles moving on tracks, or rails, the autonomous drive self-propelled trolleys are known, which are also called vehicles or shuttles, they being individually power-operated and mounted on a track of the substantially passive type; therefore, in such a system the movement of said vehicles is coordinated by means of a centralized logic unit connected to each motor. The power supply of each vehicle occurs with conventional wiring or with movable contact systems, of the type with conductive wheels or brushes on an electrified track. More evolved solutions are also known in which each vehicle is self-powered with accumulators and control occurs by means of wireless systems; for example, one should remember the integrated and modular system with independent shuttles with accumulators called Montrac, of the Swiss company Montratec AG—www.montratec.com, which today belongs to the German group Schmid GmbH.

The industrial automation sector has recently proposed high precision handling systems which are based on electromagnetic drive linear synchronous motors, which are also known by the acronym LSM or as linear actuators. Among the most evolved solutions, there are the integrated shuttle systems with on-board permanent magnets; such shuttles, which are not power supplied, slide on rails which integrate over their entire length coils, which are supplied in a selective way, that is to say, electronically controlled for the purpose of the positioning of each vehicle. For example, one should remember the integrated and modular system called XTS by the German company Beckoff Automation GmbH—www.beckoff.com, or the system called MM LITE™ by the American company MagneMotion Inc.—www.magnemotion.com, or even the system called ATS SuperTrak™ of the American company ATS Automation Tooling Systems Inc.—vmw.atsautomation.com. Such solutions provide substantially passive shuttles, without power supply and therefore without on-board logic and individually translated by attraction by said coils.

Nowadays, the principle of said linear synchronous motor or LSM is also used in the smart shuttle with on-board coils configuration, which is known as moving coils linear motor. In these cases the variable magnetic field is realized by coils integrated in the vehicle, said coils being suitably shaped, supplied and controlled selectively and individually in such a way as to slide on a rectilinear track or stator, which on the other hand integrates over its entire length a linear sequence of fixed modular magnetic plates with alternate polarity, which are also called permanent magnets, not supplied. The concatenation of the permanent magnetic field generated by the fixed magnets in the rail with the variable field generated by the coils on each shuttle depending on the position of the shuttle itself allows to change the law of motion of each shuttle in independent way. Such a solution is mainly adopted in the automated equipment in which handling occurs with an accurate and precise positioning of a semi-finished product or a tool or operating unit along a rectilinear axis of short length, performing isolated and repetitive missions, that is to say, missions which are not integrated or which are only partially integrated with other working processes. For example, one should remember the modern numerical control working centres, which are also known by the CNC acronym. The systems with on-board supplied coils, called moving coils, therefore, substantially use the LSM drive in an opposite way with respect to the integrated systems in which multiple shuttles with on-board permanent magnets, called moving magnets, are translated along a selectively supplied track, of more complex realization and shape, also in the form of a closed loop circuit.

Said linear synchronous motors used in industrial automation in said isolated solutions, that is to say, LSM moving coils, are mainly of three types: with a single-sided structure, called ironcore, in which the rail is flat and is provided with one single fixed magnetic track on which the slider or mover slides, which integrates coils wound around a core, or with a two-sided structure, called ironless, with a U-shaped rail or track, provided with two frontally symmetrical fixed magnetic tracks inside which the slider or mover integrating the coils slides, or even with a cylindrical or tubular structure. For example, one should remember the linear motors commercially called LMA, LMG and LMS Ironcore by the Swiss company Etel S.A.—www.etel.ch, or the linear motors called ILM and ILF Ironless by the same company.

The present invention aims at realizing an innovative method and the related automatic production plant for printing inks or conductive pastes on photovoltaic cells; said method and said plant implementing an integrated handling system of said LSM moving coils drive type, wherein multiple shuttles with on-board coils operate simultaneously on a rail provided with permanent magnets and position references, in an independent but coordinated way, to simultaneously perform missions different from each other, that is to say, sequentially carrying out in a continuous and automated way all the operating steps provided by said method; to this purpose, each shuttle can therefore be provided with an equipped tray for the automated processing of photovoltaic cells and intended to interact with said plant.

In more detail as far as industrial production is concerned, it is widely known that the silk-screen printing technology is the fastest, most reliable and cheapest printing solution for applying the metallization superficial layers on said photovoltaic cells or wafers of crystalline silicon. Said printing is carried out in adhesion since the matrix, which is also called printing screen, is placed horizontally in direct contact with the surface of the cell or wafer or at an adjustable distance, called snap-off, and deformable in such a way that the spatula or doctor blade, or a group of spatulas, by pushing on said screen, can distribute uniformly the paste, or the ink, to be then hardened or dried by means of heat or radiations.

In principle, nowadays, said silk-screen printing technology is considered as substantially conventional; however, the operators of the photovoltaic sector know that some aspects of the process can be significantly improved, particularly in case of large production volumes. For example it has been observed that from the industrial point of view it is possible to optimize the production flow considered as a whole and it is also possible to improve the accessory equipment such as, in particular, the system of handling and positioning of the single cells in correspondence of the deposition, that is to say, under the silk-screen printhead. Moreover, it is possible to enhance the level of automation of the system and to improve the quality of printing and of the finished product, that is to say, repeatability and cleanliness; furthermore, it is possible to reduce general costs, to improve the overall operating availability, which is also called uptime, and the flexibility of use. More generally, the operators of the sector know that in manufacturing processes one continuously searches for new solutions for increasing efficiency, quality and for reducing the cost of the finished product; the invention aims at meeting these requirements.

Among the solutions aimed at improving said printing operations on cells or wafers we would like to recall for example the rectilinear conveyor belts and rotary table systems as in documents US20070240588 (Dumenil), DE102006015686 (Hilpert et al.). Furthermore, some improved solutions of localised handling are known, which implement linear motors for locally translating the cells near the printhead, from conveyor belts, as for example is provided in CN104275916 (Yu Guofen et al.) or even in CN102233712 (Dongqin Chen ET al.) wherein two shuttles translate the cell along the same axis but on rails at a different level, that is to say, one below the other sliding in the central rail, in order to reciprocally alternate in the working processes, also with cam lifting means for elevating the cell to the printing operating level. Solutions of metallization of electronic substrates, such as printed circuits for electronics, are known, which provide the picking up with lifting of the single cell from the conveyor belt for the purpose of printing, from the bottom upwards towards the fixed printhead, by means of an elevator in the form of a vertical piston, as for example in U.S. Pat. No. 8,555,783 (Doyle). Combined solutions with conveyor belts and moving trolleys are also known, which are also provided with linear motor tracks for horizontally moving an orientable and liftable arm which is intended to locally transfer the cells from the belts to the printing station and align them correctly, as for example in CN102602703 (Pengcheng She et al.).

On the other hand, among the solutions aimed at improving the industrial handling systems with integrated and automated solutions, one should remember the evolved solutions with shuttles mobile on a rail with LSM electromagnetic drive and centralized electronic control. In these cases multiple modular and removable shuttles are provided, acting as mobile trolleys or for the fixing and/or the transport of products or materials, substantially of the passive type, they being provided with on-board permanent magnets to be translated like sliding shoes by the coils and are instead integrated over the entire length in the rail, which is thus of the smart type, that is to say, intended to supply them selectively to position said shuttles independently of one another; to this purpose position sensors are also provided, which are directly connected to the central control system. Among the most evolved solutions, we would like to recall U.S. Pat. No. 6,876,107 (Jacobs) wherein the path of the track is closed and comprises coils above and below to interact with laterally sliding trolleys, like shelves, being provided with an opposite double series of magnets; in U.S. Pat. No. 8,616,134 (King et al.), on the other hand, the shuttles are provided with angular protrusions which surmount the containment edges of the rail and interact with them facilitating possible changes in direction. Moreover, we also would like to recall WO200850760 (Peltier) and US20120145500 (Staunton et al.) where a handling system of the moving magnets type is subdivided into modular track sections with coils, individually controlled in an independent way by means of a logic unit of the PLC type and readers for linear encoders, each shuttle being provided with references of the linear encoder type sufficiently long to enable localization also during the passage to the following section; the global management of the system is ensured by a central controller directly connected to the single sections. An induction system is also provided, which is intended to individually supply each shuttle wirelessly, wherein the power is obtained from the track by means of two coils positioned on the shuttles on the sides of the permanent magnets.

Furthermore, among the most evolved handling solutions, we recall U.S. Pat. No. 5,626,080 (Trenner et al.) which provides an integrated system with independent shuttles, like autonomous vehicles, which are motorized and supplied wirelessly, and slide on a simplified rail which can include long and articulated paths; every vehicle is associated in the upper part with a plane for transporting the materials, it being constrained and rotatable by means of mobile joints. We also recall, as an example, U.S. Pat. No. 8,134,258 (Finkbeiner et al.) which proposes an electromagnetic drive linear electric motor of said LSM moving coil type, wherein the trolley with coils translates back and forth on the rail with permanent magnets being constrained with two rails differently oriented with respect to each other, that is to say, one upwards and one on the side, in such a way that the plane or tray associated with said trolley, being constrained to both said rails, can be configured and articulated in multiple supporting positions such as vertical or horizontal; said plane or tray comprises multiple thin-walled elements hingedly constrained to each other to rotate, also partially, in an autonomous way for the purpose of the specific working process.

PRIOR ART

For the purpose of determining the prior art related to the proposed solution a conventional check was made, searching public archives, which has led to find some prior art documents, among which:

D1: GB2452320 (Willshere et al.)
D2: US20120064250 (Baccini et al.)
D3: EP2711183 (Brosi et al.)
D4: U.S. Pat. No. 7,580,558 (McEvoy et al.)
D5: US2005166772 (Schanz)
D6: EP1918101 (Metzner et al.)
D7: US20150191104 (Zocco)
D8: US20120109355 (Baccini et al.)

D1 proposes a system for the handling and the silk-screen printing of printed circuit boards which comprises at least one processing unit and a feed unit intended to transfer workpieces from and to said processing unit, wherein the feed unit comprises input and output feed assemblies of the workpieces from the processing unit and a handling assembly for the processing zone. The processing units are silk-screen printing apparatuses located between the input and output feed assemblies; if one of the processing units is unavailable, the feed assemblies can still supply the printed circuit boards to be processed to remaining processing units, reducing the cycle time.

D2 describes a system of transport and printing on planar substrates, such as circuit boards and photovoltaic cells, with at least one print station having at least one printhead and a rotary table with the operating surface facing said printhead and moving said substrates during processing, said surface including portions of adhesive for the purpose of the movements.

D3 proposes a printing device with an adjusting device for aligning multiple photovoltaic cells with respect to the print mask. There is a detecting unit which detects the position of the substrates with respect to said mask and a mobile gripping device which grips the substrate removed from the support plate; an alignment system is included which displaces or rotates the support plate of the substrates.

D4 describes a silk-screen printing apparatus for printing on a planar substrate, such as a printed circuit, which comprises: an inspection station for determining the relative position of the substrate with means for detecting the upper and lower surface, an information processing unit, a printhead, a belt feed mechanism, a printing support of the mobile type and an alignment system with respect to the printing screen.

D5 and D6 propose an alignment system for silk-screen printing wherein, respectively, in D5 there is a printing screen which can rotate and translate while D6 discloses a device which positions the cells on the conveyor belt in an aligned way according to the printhead.

D7 describes a printing system wherein the semi-finished products are moved by independent shuttles on a loop track, said shuttles being electrically supplied and equipped with a stepper motor; they translate along the track stopping in correspondence of the printhead.

D8 proposes an evolved printing system on planar substrates, such as photovoltaic cells or wafers, which provides greater productivity and better performance with precise and repeatable processing; there are two mobile supporting elements for processing, in the form of sliding shoes or movers, being of the type with planar motor and controlled by the logic control unit of the system. The apparatus comprises: a planar stator, a first motor positioned on the planar stator and a second motor positioned on the planar stator which are configured to move laterally and longitudinally over the planar stator in an opposite way and independently of one another, a first support coupled to said first motor and a second support coupled to said second motor which receive the substrate in the respective loading positions, processing heads in a first and a second processing position of the respective substrates. Said processing can alternatively comprise silk-screen printing, ink jet printing, laser ablation or laser etching; the apparatus can comprise a system controller intended to acquire information on the position and orientation of the substrate placed on the mobile support.

In conclusion it is reasonable to consider as known:
- automatic silk-screen printing systems, with at least one printhead comprising a screen and doctor blade wherein, below it, the substrates to be printed are moved by means of electric motor-driven automatic handling systems of the mechanical type, with conventional continuous translation means such as conveyor belts, rollers, pilgrim process mechanisms and rotary tables; there are even several printheads or stations arranged in series;
- automatic metallization systems for electronic circuits, photovoltaic cells or wafers wherein the main handling occurs with conveyor belts, intended to draw near and align the semi-finished products to the workstation, in rows, which then are picked up and/or locally translated below the printhead with rotary tables or even linear motor-driven sliding shoes, wherein the stroke of the sliding shoe is limited to said translation and positioning;
- automatic alignment systems for silk-screen printing of cells or wafers wherein the printing screen can rotate and translate, or wherein the alignment of the single cells on a conveyor belt occurs with mobile arms according to the printhead, or wherein the printing plane is mobile for the purpose of alignment and/or wherein the cell is lifted from the bottom upwards for the purpose of printing;
- an integrated system of the type with autonomous shuttles, that is to say, motorized and independent on a passive rail, with an on-board accumulator as well, intended to handle materials on a tray along loop or articulated paths;
- an integrated electromagnetic drive LSM system with multiple shuttles provided with on-board permanent magnets which are moved along a rail that integrates over its entire length selectively controlled and supplied coils, also with a loop path for continuous and multistation processing cycles;
- an isolated electromagnetic drive LSM system of the moving coils type wherein a shuttle, provided with selectively supplied coils, slides along a rectilinear rail comprising the permanent magnets, it being of limited length as for example occurs in the modern CNC machining centres wherein the shuttle acts as a mobile support for the product to be processed or for the tool and is directly connected via cable for the purpose of power supply and control.

Drawbacks

In conclusion, we have observed that all the known solutions have some drawbacks or anyway some limits.

First of all, in the known silk-screen printing solutions we have observed the serious problem of serial contamination; in more detail, in all the systems for large production volumes in which the movement of the cells or wafers occurs on belts, rollers, pilgrim process conveyor belts, rotary tables or similar conventional handling means, in case of any contamination thereof and particularly in case of breaking, spilling, loss or leakage of inks and/or pastes in the printing phase, said contamination often affects the whole flow of transported and inevitably dirtied cells. Such a phenomenon is translated into serious problems of quality, waste, plant downtime, removal of parts, cleaning, which inevitably negatively affect global productivity.

Secondly, in the known solutions we have observed a low printing quality due to insufficient stability and/or rigidity of the support element on which the wafer is printed, with respect to the printhead, also with poor repeatability of the positioning. For example, in D1 the transfer and the printing are carried out by laying the cell on supports of the partial type, that is to say, incomplete in the support, because it is necessary to have a sufficient space under the cell for the conveyor belts, which are lowered during printing and are lifted again to carry the cell away when printing has been completed; sometimes such a solution is little stable and may jeopardize the final quality of the silk-screen deposition. Furthermore, in the many solutions providing a rotary table with a reference and cell laying function, as for example in D2 and D3, sometimes we have observed a relevant projection or range between the rotation fulcrum of the table itself and the printhead; such a solution provides great structural rigidity, with consequent oversizing of the construction elements, thus increasing the inertias of the movements with greater slowness in the translations, that is to say, preventing rapid movements; furthermore, sometimes in these solutions the integration of means for holding and/or translating the pieces is problematic. Moreover, the solutions with the rotary table have the known problem related to the variable offsets, which is particularly relevant in case of precision positioning, that is to say, micrometric positioning, as it occurs in silk-screen printing on photovoltaic cells. In more detail, in fact, the operators of the sector know that, in order to decrease the cycle time, sometimes the wafer constituting the cell is laid in a first position, then said table is rotated, the image is taken from the camera for the purpose of aligning the screen, then it is rotated to reach the final printing position having already positioned the screen; however, such a method provides that the arc of a circle between the acquisition of the image and the printing position is exact and constant, that is to say, it is perfectly repeated for the entire rotation of the table, namely for a complete circle angle. Therefore, it is evident that said rotary tables, in order to be effective and ensure high quality and repeatability, must provide oversized and preloaded bearings for the purpose of maintaining the correct position at every partial rotation, without clearances, therefore being expensive and of difficult maintenance.

Thirdly, the solutions in which the silk-screen printing occurs directly on shuttles which translate below the printhead, as for example in D7 and particularly in D8, namely acting as a support for the printing of the cells or wafers, may solve said problems of precision and repeatability but, however, they are not suitable to solve the serious problem of plant downtime, in the frequent cases of breaking or contamination as stated above, there being no intermediate support of the removable type like an automatically interchangeable tray. More generally, with reference to the above, it has been observed that the breakage rate of the wafers during processing is sometimes high and is one of the main parameters of a plant for silk-screen printing on cells, it being desirable to have a value as low as possible.

Fourthly, in general it has been observed that the known and conventional solutions intended to improve said printing on cells or wafers are limited to some specific aspects such as the alignment of the cells with respect to the printing matrix with external mechanical means as for example in D6, or the automatic alignment of the printing screen as for example in D5, or the control of the interfacing between the screen and the surface of the cell or wafer using vision systems and/or systems for linear motor-driven axial movement systems or eccentric or piston systems for lifting the cell, as for example in D3 or D4. Solutions are also known in which the whole printhead translates to get aligned above the cell or wafer, the excessive weight, the inertia, the cost, and the complexity of the system being however disadvantageous.

Fifthly, as to said integrated electromagnetic drive LSM industrial handling systems with multiple shuttles provided with on-board permanent magnets and a rail provided over its entire length with selectively supplied coils, it has also been observed that there are significant control problems and that they are also little versatile, particularly in the case of articulated configurations. Instantaneous, continuous, constant and always effective communication with each shuttle is necessary to correctly control such a complex system, which is essentially centralized. Therefore, it has been observed that such an aspect is particularly relevant when said shuttles are passive, that is to say, not powered and without on-board processing and logic capability; one should consider, for example, not driving shuttles but multiple wagons with on-board magnets, that is to say, attracted and/or pushed depending on the commands given to the rail. Particularly, it is known that coordination occurs depending on the position of each shuttle and also that the interaction between the coils and the single shuttle in order to ensure independent missions, that is to say, isolated with respect to the other shuttles, is difficult. To this purpose, one should remember in these integrated systems some phenomena of electromagnetic interference between close shuttles or even positioning control problems in the passage between independent rail sections.

Sixthly, it has also been observed that the known and conventional integrated handling systems are very rigid, that is to say, little versatile, and particularly they are not suitable for articulated configurations like lines of silk-screen printing on cells or wafers; in fact, the operators of the sector know that the making of the rails with selectively supplied coils is complex and expensive in case of small-sized shuttles with precision positioning. In particular, the difficulties of operation in curve are significant since the positioning of the coils with respect to said shuttles is problematic; therefore, such systems allow for limited and simple paths. Nowadays, in the modern continuous production industrial lines there are large production volumes with many automated workstations having different functions; in these cases, due to all the above-mentioned disadvantages, a similar handling system is little flexible and constraining, it being difficult to make complex and variable paths with rail switches as well. Furthermore, it has been observed that said integrated solutions occupy wide spaces and also provide a considerable increase in the space used by every new adopted apparatus; moreover, it is known that such solutions generally imply high investment and maintenance costs.

Furthermore, it has also been observed that said industrial handling systems with independent shuttles on a passive rail, of the self-powered type by means of incorporated accumulators, feature particularly complex and expensive shuttles, difficult to be coordinated, with a high level of wear and defectiveness and also not easy to be reloaded; such shuttles, moreover, feature inertias and heavy weights, such parameters being fundamental for the duration and the performance of the whole handling system. It has also been observed that the above-described system generally implies high consumption and low energy efficiency. Therefore, these disadvantages make such a system mainly suitable for the transfer of materials in the assembly lines or for storage, being however little suitable for the automated, consequential and asynchronous precision processing of small-sized semi-finished products as for example occurs in the case of photovoltaic cells and circuit boards.

It has also been observed that said LSM moving coils drive solutions, that is to say, with permanent magnets on a rail and coils on the shuttle, are extremely reliable and precise in positioning but, however, they are of easy implementation only in the case of simple configurations, substantially of the isolated type wherein the rail is short and rectilinear and wherein one single shuttle or at most a homogeneous group of synchronized shuttles slides; such configurations are of difficult implementation where the path is long or articulated, or where multiple shuttles must simultaneously carry out missions which are independent but coordinated and interacting with each other.

In more detail as to the control systems, it has also been observed that in said LSM isolated or moving coils configurations there is no need to integrate complex sensors, and the processing of information is substantially limited as well; on the other hand, it has been observed that the control solutions of conventional use are not suitable in case of complex LSM drive applications, that is to say, in the integrated industrial handling systems in which multiple shuttles simultaneously perform, on the same rail, missions which are diversified with respect to each other and particularly if they interact in an independent but coordinated way. Moreover, it has been observed that said shuttle of the moving coils type is generally connected via cable in such a way as to correctly supply power to said coils and simultaneously check feedback; however, said cable is an obstacle in complex applications, it is a serious limitation on maximum accelerations and is often a cause of breaking or malfunction, as well as being expensive.

Finally, it has been observed that the known solutions, in particular, do not allow to realize an evolved handling and silk-screen printing system with adjustable and adaptable positioning of the single cell or wafer with respect to the screen, completely integrated along a rail, with high efficiency and productivity, modular, versatile, clean, safe and cost-effective; in particular, the known solutions do not provide that each cell is individually mounted from the beginning to the end of the path on a smart shuttle, namely independent but coordinated and provided with an equipped tray for the purpose of translation and printing, in such a way as to ensure: complete movement autonomy with the absolute and precise control of its own positioning and of the positioning of the cell, automatic loading and unloading, automatic alignment and inclination of the cell also during the passage of the doctor blade, automatic release of the tray with controlled and adjustable lifting of the cell in correspondence of the workstations placed along the path, automatic coordination between the shuttles and the different operating phases, complete electronic management of each shuttle and of the whole system, automatic quality control, automatic safety systems. Furthermore, it has been observed that said systems intended to improve the interfacing between the fixed matrix or printing screen and the surface of the cell by lifting, are difficult to be adapted to the particular conditions of the printhead, for example a more precise and adaptable control of the printing support, in particular of its inclination, being desirable.

Hence the need for the companies of the sector to find solutions of silk-screen printing on cells or wafers, with automated handling, which are more effective and advantageous with respect to the existing solutions; the aim of the present invention is also to solve the described drawbacks.

SHORT DESCRIPTION OF THE INVENTION

This and other aims are achieved by the present invention according to the characteristics as in the appended claims, solving the above-mentioned problems by means of an innovative method and related automatic production plant (30) for the silk-screen printing of inks or conductive pastes on photovoltaic cells (40) or wafers, with an integrated handling system of the LSM moving coils drive type wherein multiple shuttles (10) with on-board coils (102) act on a rail (20) with permanent magnets (201) in an independent but coordinated way, synchronous and/or asynchronous with respect to each other, to simultaneously perform missions different from each other in such a way as to advantageously carry out the printing operating steps (F1-10) provided by said method; to this purpose, each shuttle is provided with an equipped tray (12a) of the removable type which is specifically configured to carry out the automated processing of the single cell, it also being intended to interact with said plant.

Aims

In this way by the considerable creative contribution the effect of which has allowed to reach a considerable technical progress, some aims and advantages are achieved solving the main drawbacks pointed out.

A first aim of the invention was to eliminate, or anyway considerably reduce, said problem of contamination and serial propagation; in particular, in the invention said phenomenon affects one single tray, which is readily controlled, removed and replaced with a clean tray in such a way that there is no serial propagation to the following trays. Therefore, such a solution allows to restrict any discard to the single cell and prevent plant downtime.

A second aim of the invention was to considerably improve the handling of the wafers for the purpose of printing; in particular the stability, the rigidity and the repeatability of the positioning of the support on which the wafer is printed, with respect to the printhead. The invention allows to handle at high speed, with linear motors, rigid but lightweight trays which constitute a perfect support base in the printing phase and which are also automatically and rapidly removable in case of contamination, in such a way as to overcome the prior art problems. More generally, the invention allows to improve printing quality, also increasing productivity per hour and reducing said breakage rate.

A third aim of the invention was to implement an innovative handling system for printing on cells or wafers, industrially advantageous and long-lasting, of transport with shuttles which move on potentially variable paths with single independent variable and/or interconnected missions, in a synchronous and/or asynchronous way with respect to the other shuttles and to the stations where said shuttles are stopped for operations to be carried out according to variable programs and sequences. In particular, it is versatile and of simple configuration, being modular and compact, and is also easy to be integrated into already adopted systems. Every mission can be modified in real time by means of simple software control, without changing or adapting the mechanical components; the shuttles operate freely, without movement restrictions, thanks to the absence of the conventional power supply and communication wiring. Furthermore, the number of the necessary input/output devices is significantly reduced; a system simulator easily integrates the different functions and the different components. Said system has a variable configuration, being based on a technology which adapts with precision to the different production requirements, with an arbitrary number of shuttles and a path of the rail.

A fourth aim of the invention was to increase the flexibility of use, in order to also transport, position and print simultaneously cells of different configuration or even to add, remove or easily combine several shuttles, coordinating them in the same mission or for different missions. Moreover, it is possible to easily adjust the speed and the acceleration of the single shuttles, which are independent or which can be grouped by function, and therefore spaced apart with a pace which can be variable. Therefore, said system allows to handle the single shuttles in a synchronous or asynchronous way with respect to each other depending on the planned processing sequence, which can thus be variable. Basically, the invention proposes a versatile system in which each translation motor is individually controlled, in an active or passive way, and can also be easily integrated into different, already existing, plants or systems, thus optimizing general efficiency.

A fifth aim of the invention was to considerably reduce the wear of the printing plant and the costs for use and maintenance. In fact, it can be pointed out that the technology used is based on electromagnetic drive and does not require the use of ball recirculation screws, gears, belts, racks or clamps, which are notoriously subject to wear and malfunction. Moreover, thanks to the high positioning precision, there is no need to compensate for any inaccuracies as, on the other hand, is required in the conventional transport solutions. For example, one should consider the elongation of the chains due to load and wear, the re-tensioning of the toothed belts or the mechanical clearances during the load variations. In particular, there are a significantly reduced number of moving components; the invention provides to move, in addition to the load, only the shuttle comprising the mobile part of the LSM motor. Moreover, it can be observed that energy consumption is reduced with respect to the traditional handling systems for serial production and that the shorter inactivity times provided by the invention, in addition to increasing productivity, also decrease the movements of the shuttles. All this considered, the burdens concerning the ordinary and extraordinary maintenance of the system were thus reduced; finally, it can be observed that the main components can be cleaned thoroughly and/or washed without removing them.

A seventh aim of the invention was to occupy a reduced area for the installation of the whole plant. The use of an LSM motor as provided by the invention is effective and advantageous, enabling engineering progress as far as this type of plant and handling system is concerned. Moreover, the handling system provided for the purpose of printing is constructively compact and lightweight, of the modular type, with significantly reduced industrial costs.

An additional aim of the invention was to enable a rapid and flexible adaptation to the format and/or type of cell to be printed, it being mainly suitable for cells of crystalline silicon having a side of 156 mm but being easily adaptable to any type, format or size. Modifications can be made rapidly by changing the parameters of the control program; to this purpose, empirical values can be saved like sets of parameters which can be recalled at any time and which are also interchangeable with applications of the same type. In this way, it is possible to eliminate most of the mechanical adjustments during the processing cycle.

Another aim of the invention was to increase the speed of the printing cycle. It is possible to carry out, in any of the workstations, operations of synchronization with respect to a given law of motion, stop and start, anyway ensuring an extremely continuous workflow also in a printing cycle including the stop and the re-start in correspondence of multiple stations, carrying out independent operations which, anyway, can be coordinated with one another. Moreover, the proposed system is provided with improved dynamics being controlled with high positioning precision, that is to say, up to a micrometric order of magnitude. The rapid signal processing and the large bandwidth of the communication protocol, of the type called Fast Ethernet bus, allow to considerably improve the response and the control of the system during use, with respect to the known systems. For example, it is possible to adjust the operating and setting parameters of the system during use; moreover, the monitoring of positioning delay prevents damage to the product in case of mechanical malfunctions.

A further aim of the invention was to increase safety, reducing volumes; in fact, smaller masses of the single shuttles are potentially less dangerous. Moreover, the invention provides an LSM system with smart shuttles equipped with on-board sensors and individual logic, although they are coordinated; therefore, the possibility of error is further reduced and said safety is increased.

Another aim of the invention is to provide automatic control and detection systems of the effective and inexpensive type. The proposed handling system of the cells or wafers with independent and coordinated shuttles can impose in specific sections of the path a law of motion with constant speed in such a way as to enable the use of line scan cameras which are considerably cheaper with respect to the known and expensive matrix cameras, the overall image being reconstructed with the interpolation of the axis of translation with respect to the frequency of the scanning beam of the camera transverse and perpendicular to the axis of motion of the shuttle.

These and other advantages will appear from the following detailed description of some preferred embodiments, with the aid of the schematic drawings enclosed whose details of execution are not to be considered limitative but only illustrative.

CONTENT OF THE DRAWINGS

Figure 1B:
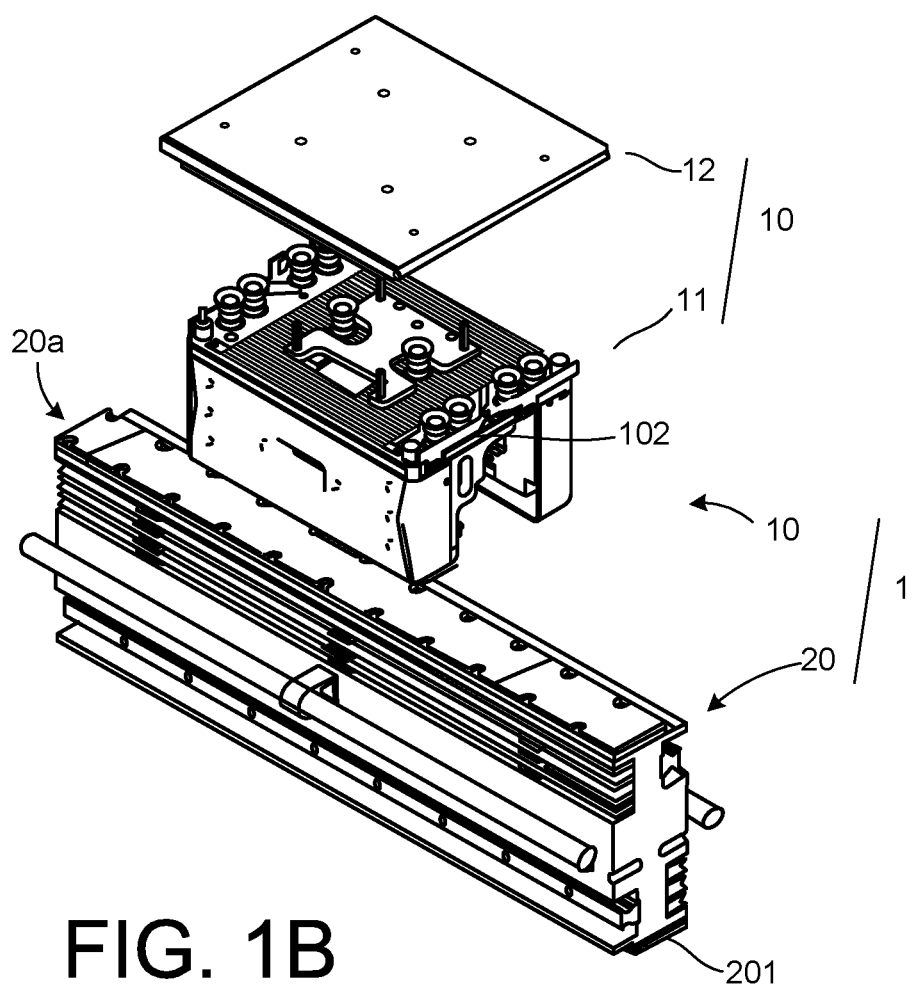

FIGS. 1a-b show, in an axonometric view, the self-propelled sliding shoe and the sectioned portion of rail on which the handling system according to the invention is based, they being represented assembled (FIG. 1a) and separate (FIG. 1b) respectively, wherein a tray for transporting the products is also associated with the self-propelled sliding shoe.

Figure 2A:
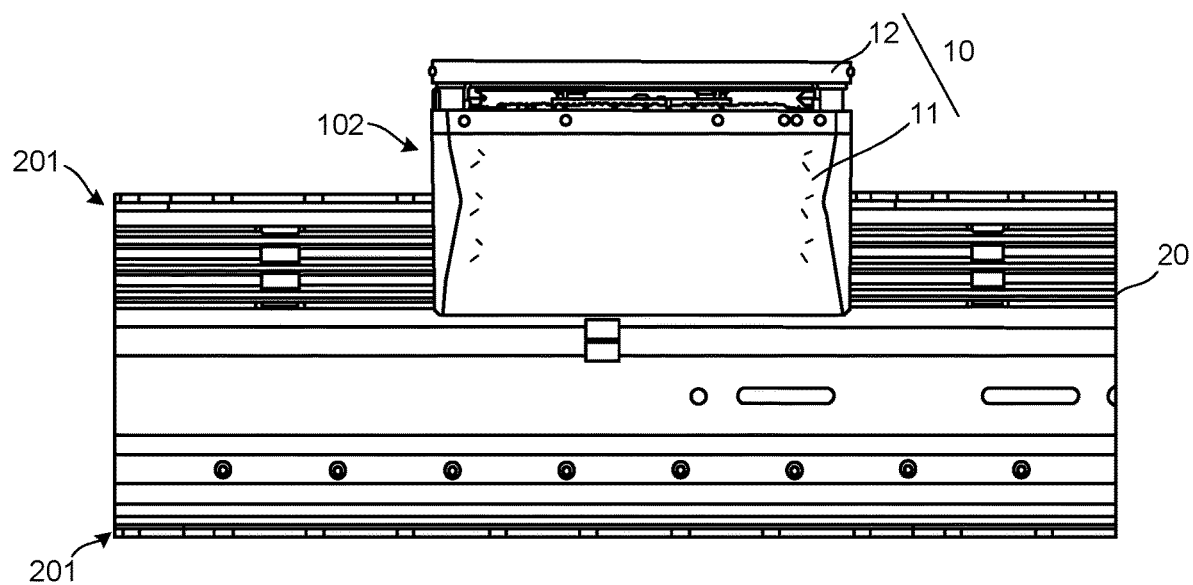
Figure 2B:
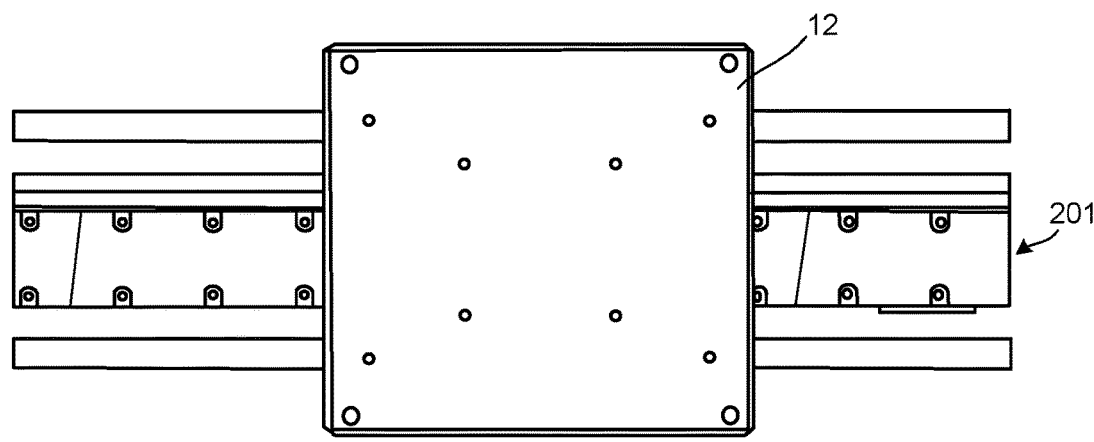
Figure 3A:
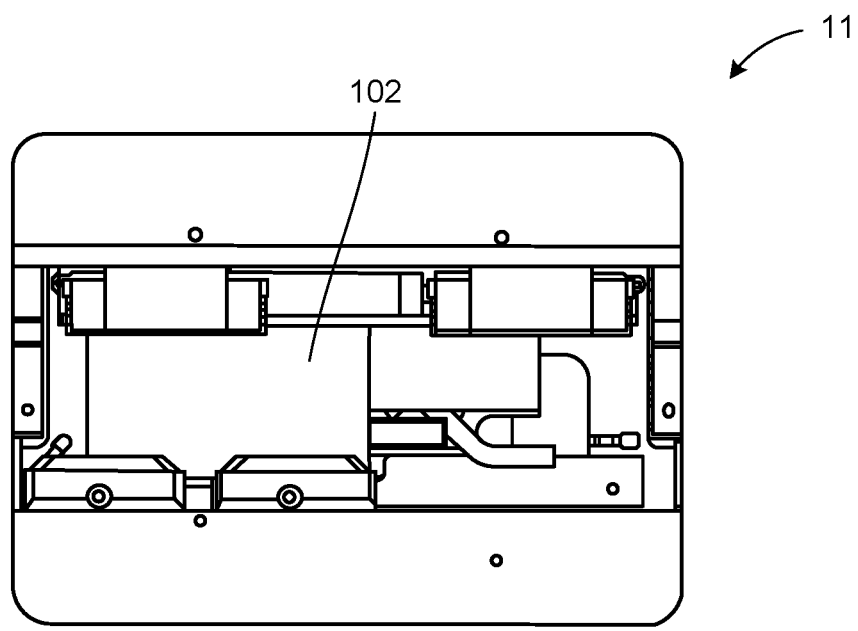
Figure 3B:
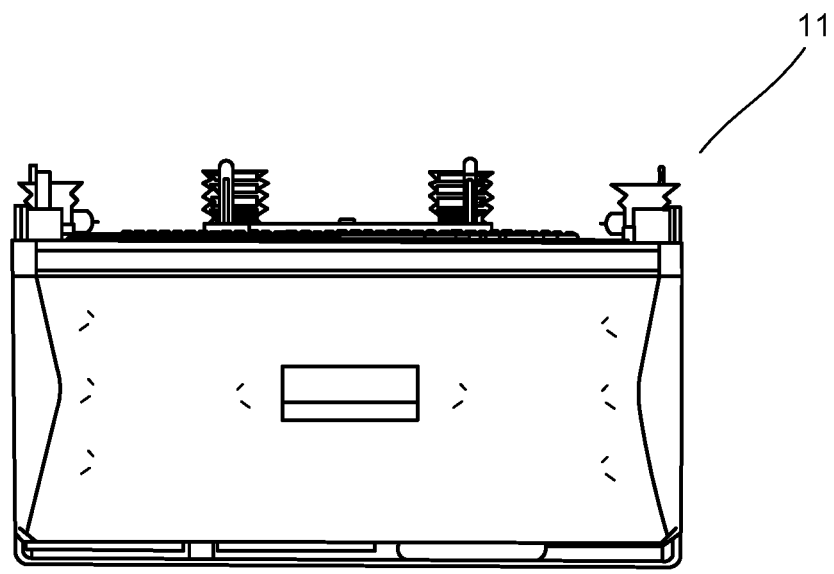
Figure 3C:
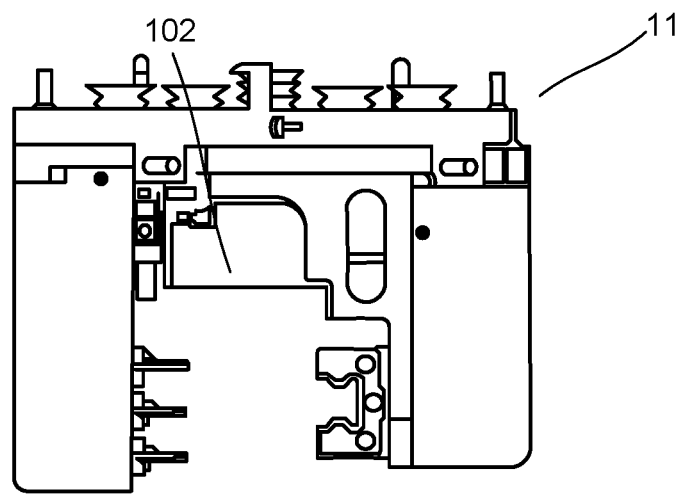
Figure 3D:
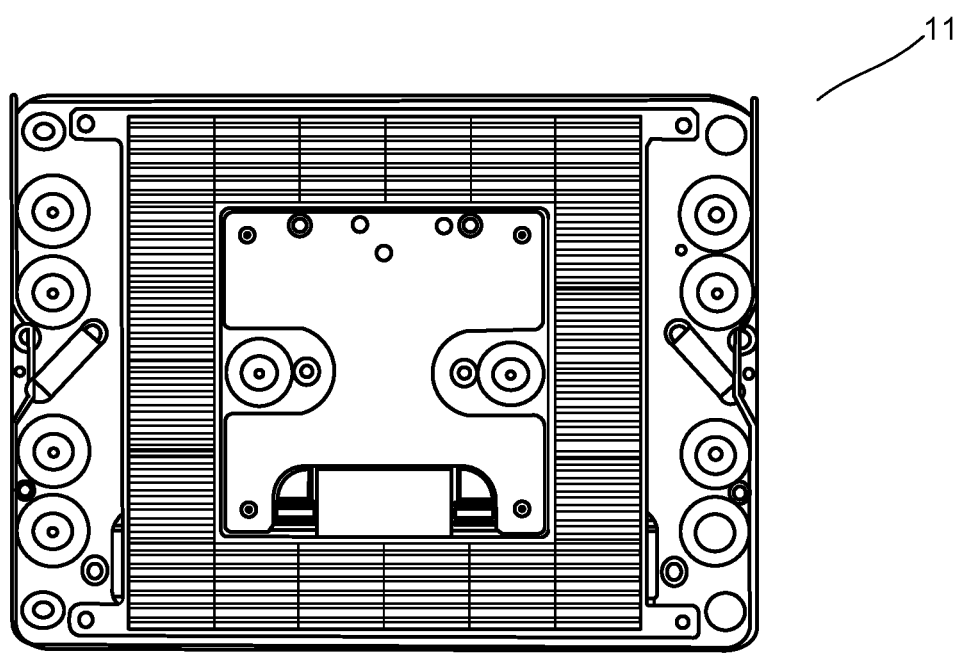

FIGS. 2a-b orthogonally show, from the side (FIG. 2a) and from the top (FIG. 2b), the shuttle and the sectioned portion of rail as in said (FIG. 1a).

FIGS. 3a-d orthogonally show the self-propelled sliding shoe, from the bottom (FIG. 3a), from the side (FIGS. 3b-c) and from the top (FIG. 3d) respectively.

Figure 4A:
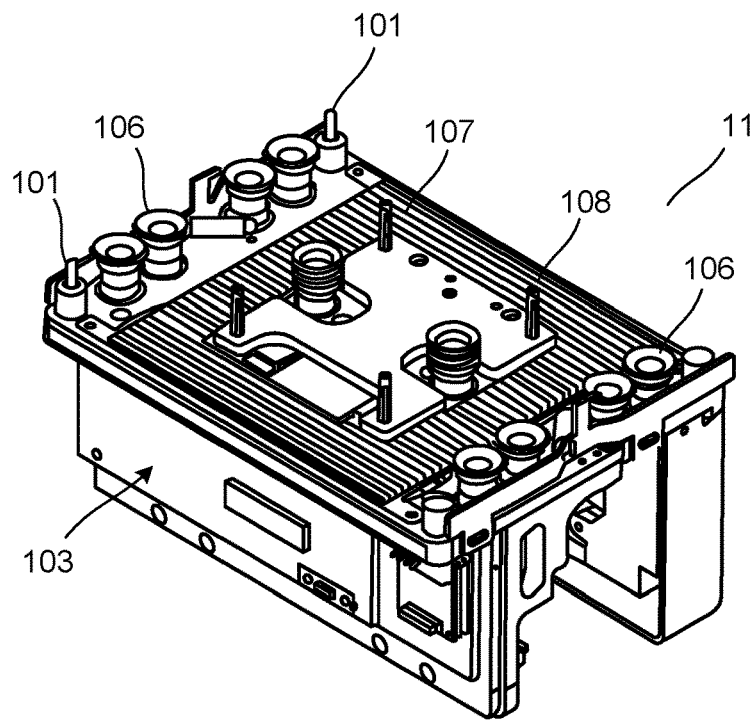
Figure 4B:
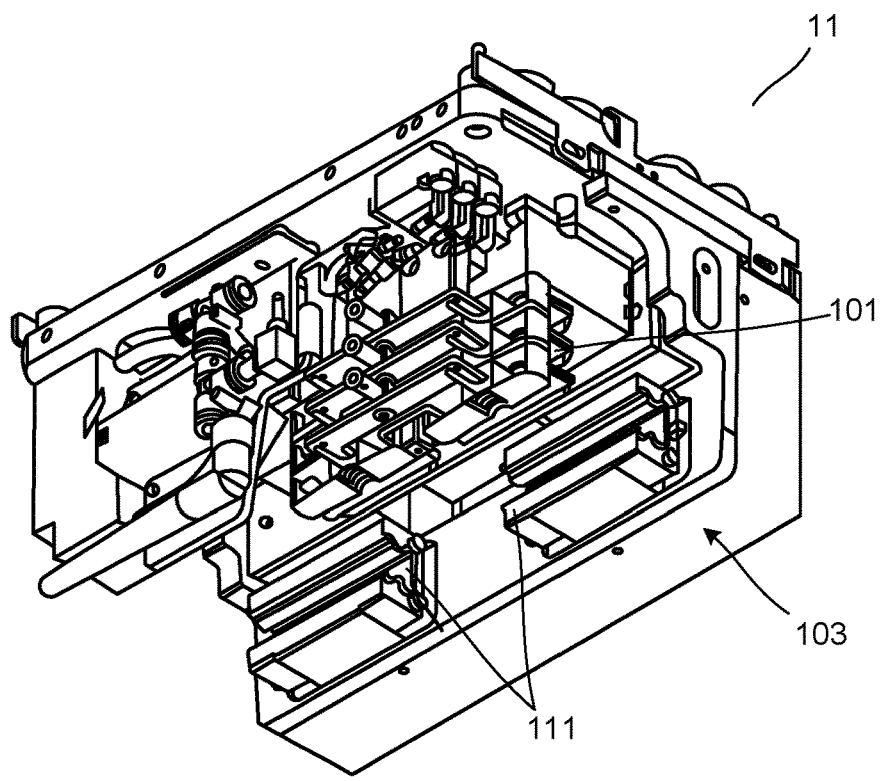

FIGS. 4a-b show the self-propelled sliding shoe in an axonometric view, from the top and from the bottom respectively.

Figure 5A:
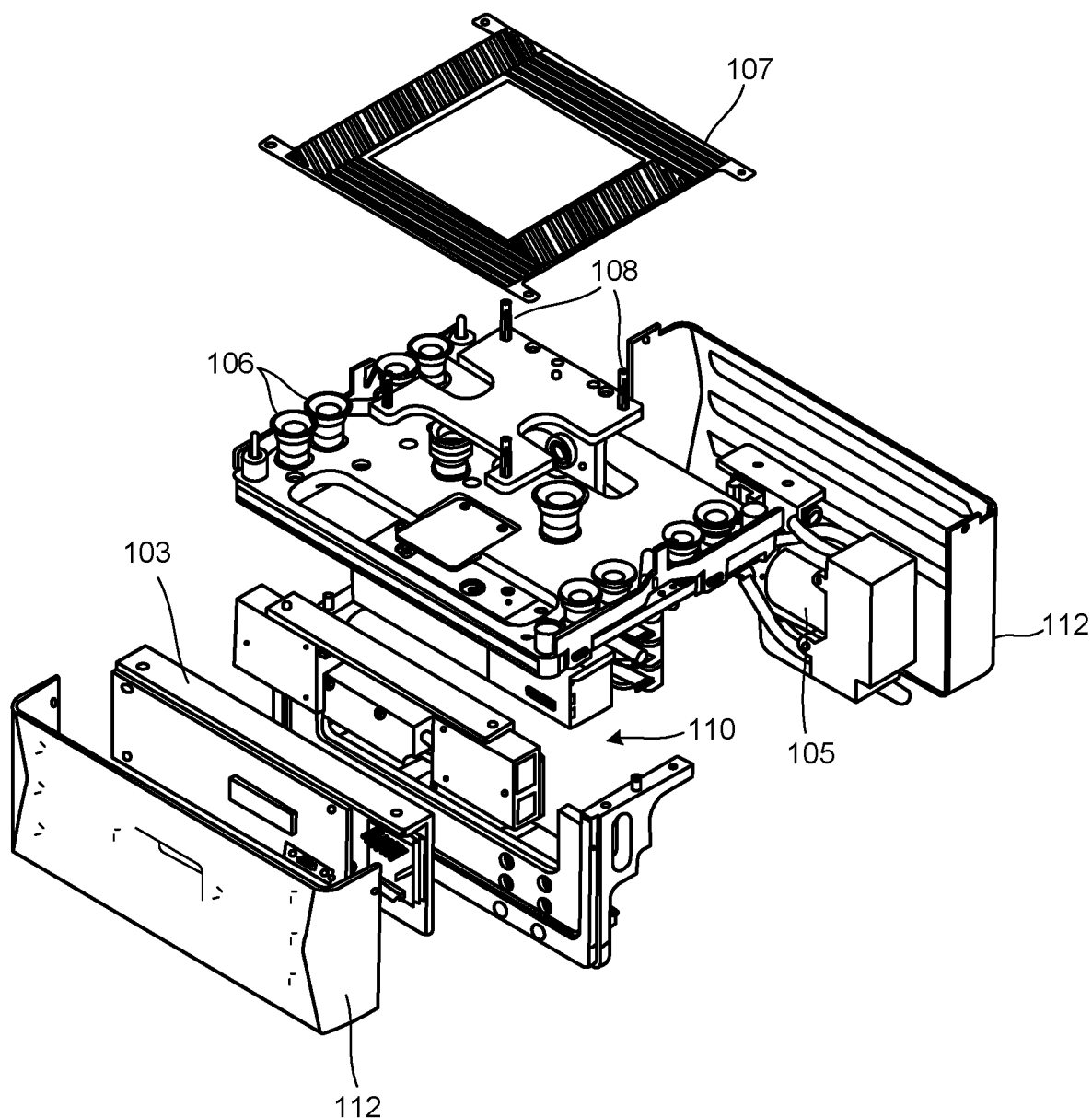
Figure 5B:
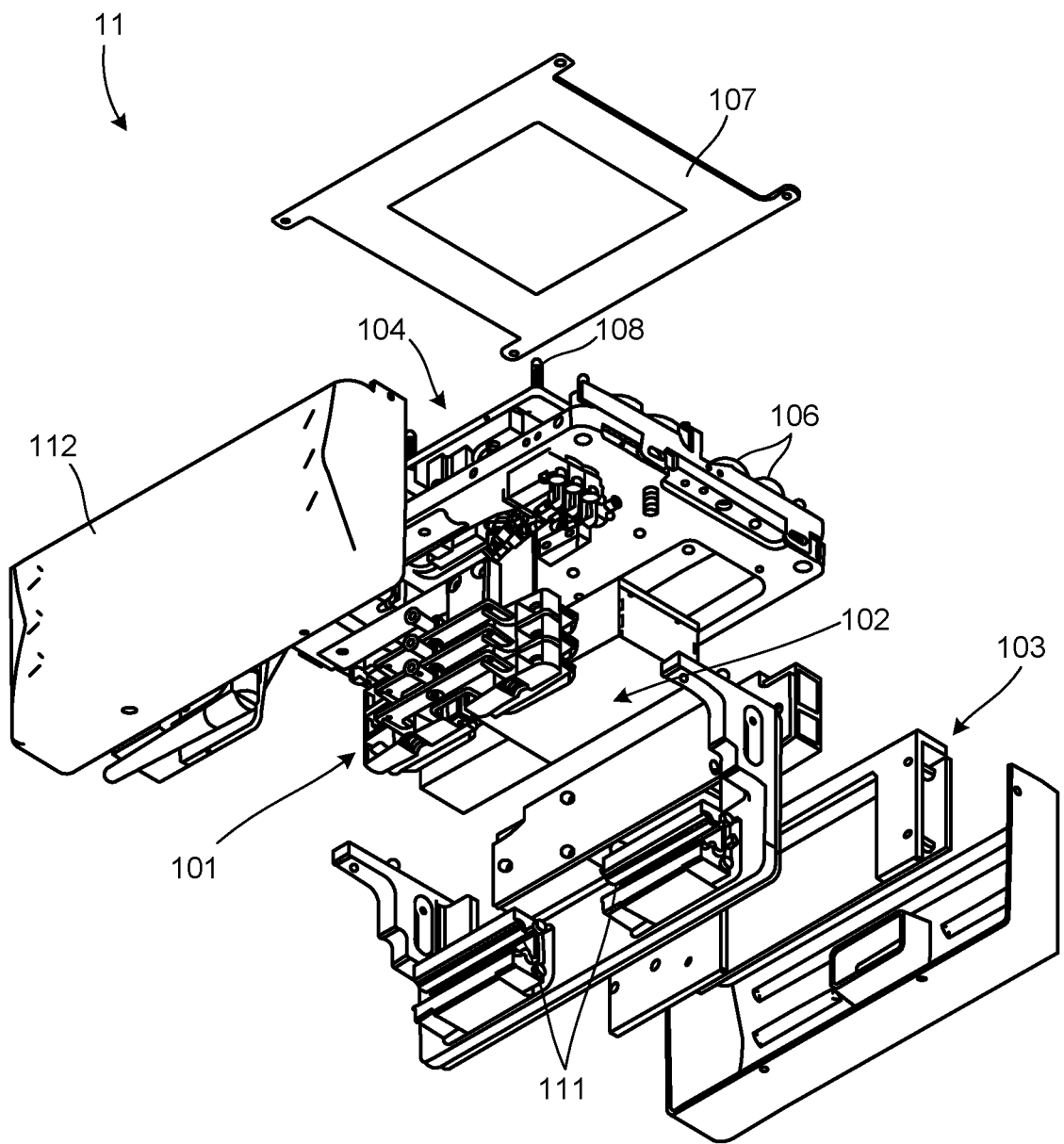

FIGS. 5a-b show, in an exploded axonometric view, the self-propelled sliding shoe as in (FIGS. 4a-b).

Figure 6:
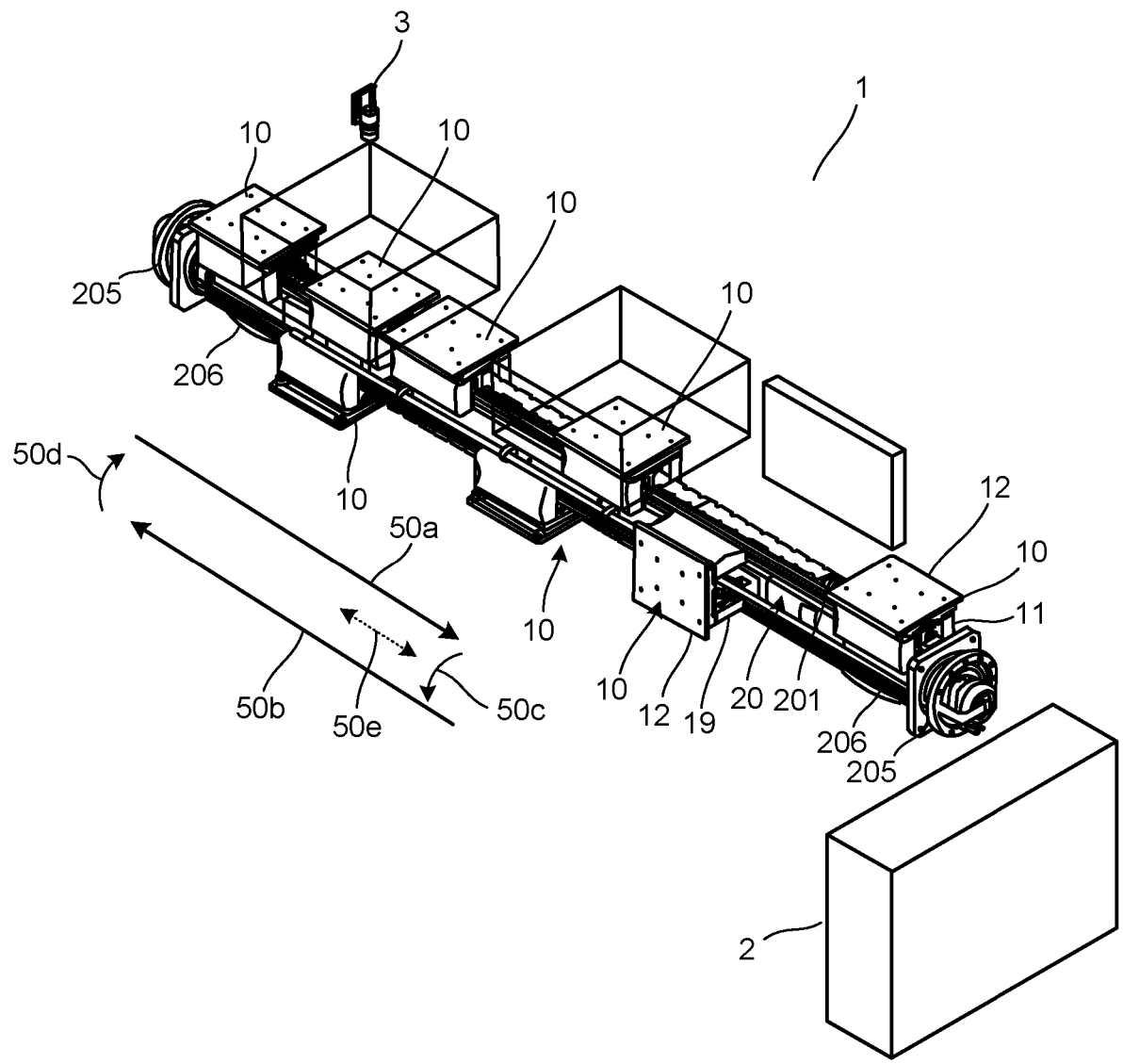

FIG. 6 is an axonometric view of the handling system according to the invention wherein the shuttles comprise trays for flat semi-finished products, and wherein the handling direction, the central server and workstations are schematically represented, in a linear vertical loop configuration with top-bottom rail and lateral overturning of the shuttles; the accessory components are represented in an unrealistic way, also including the electrical and electronic elements necessary for operating the apparatus.

Figure 7A:
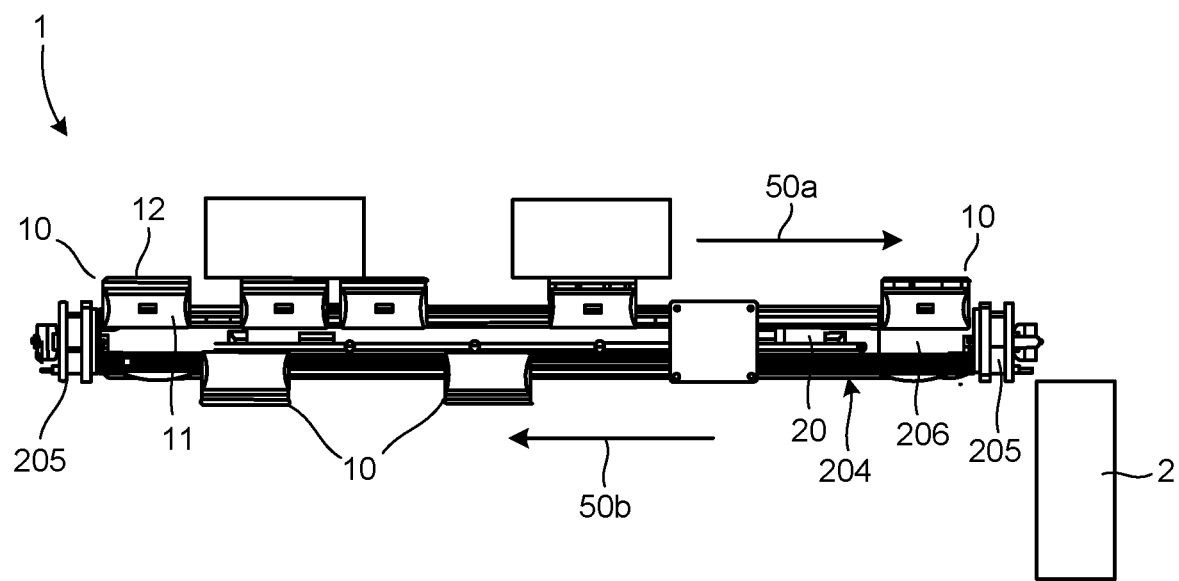
Figure 7B:
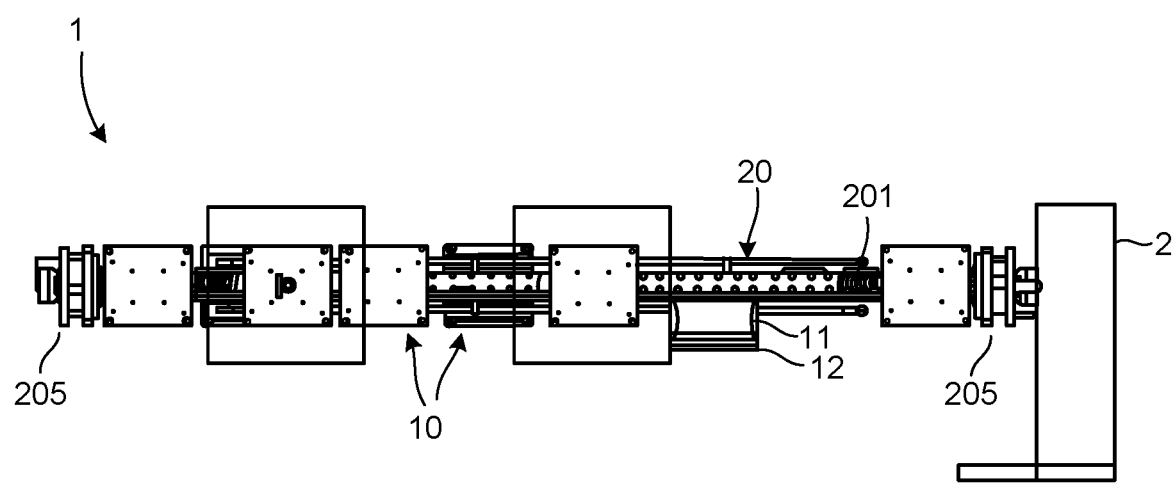

FIGS. 7a-b orthogonally show, from the side (FIG. 7a) and from the top (FIG. 7b) respectively, the handling system according to the invention as in (FIG. 6); the accessory components of the system are represented in a schematic way.

Figure 7C:
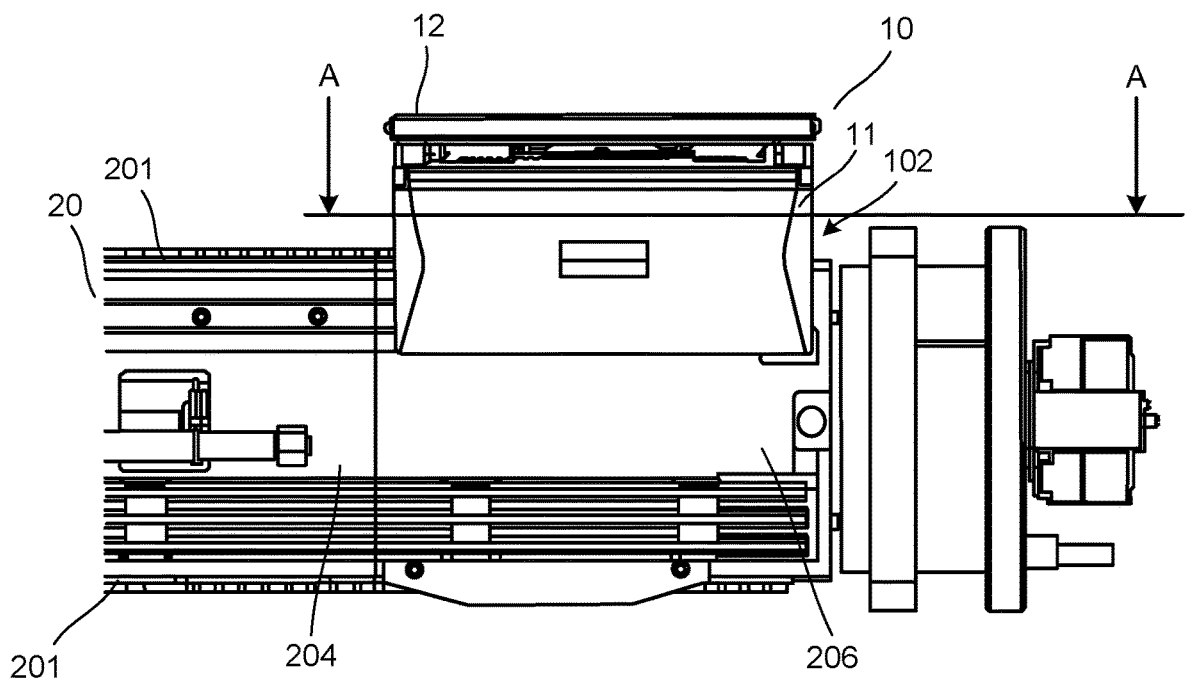
Figure 7D:
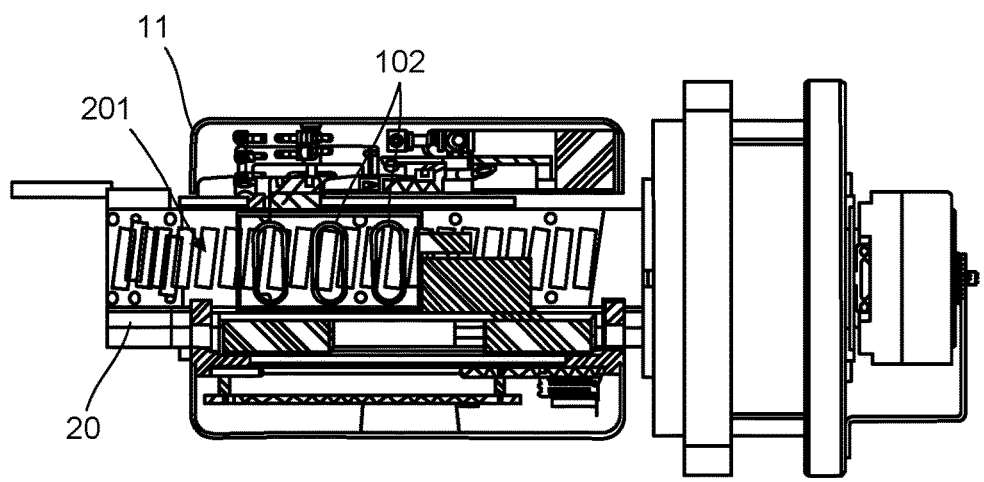

FIGS. 7c-d are detailed orthogonal views of the invention, from the side and in section A-A, with the self-propelled sliding shoe or mover provided with on-board coils represented in correspondence of the permanent magnets which are integrated in the rail.

Figure 8:
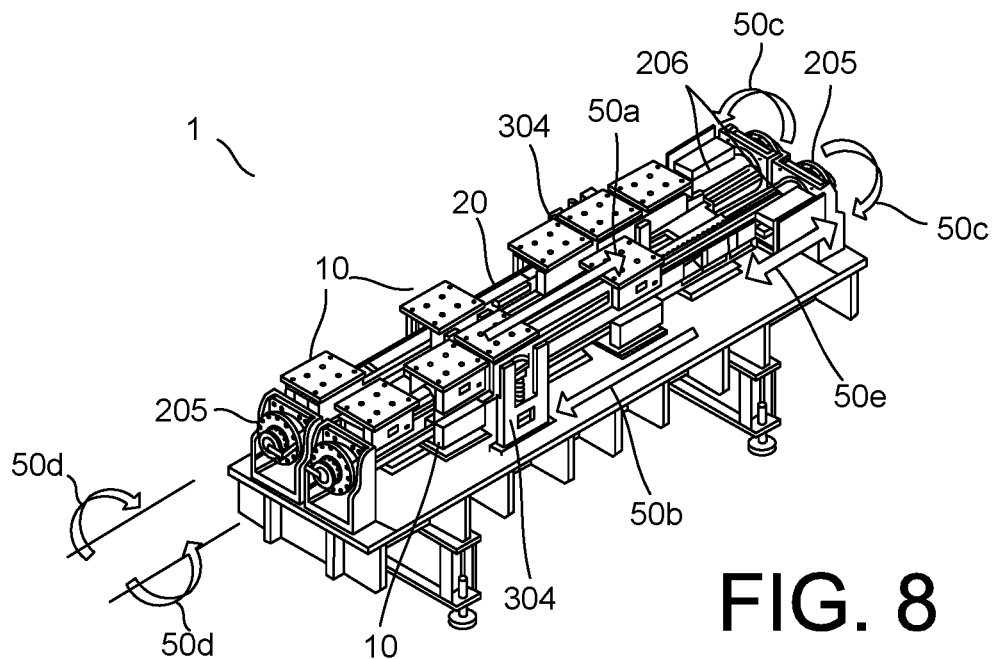
Figure 9A:
Figure 9B:
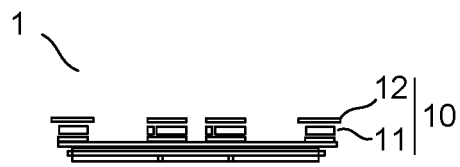
Figure 9C:
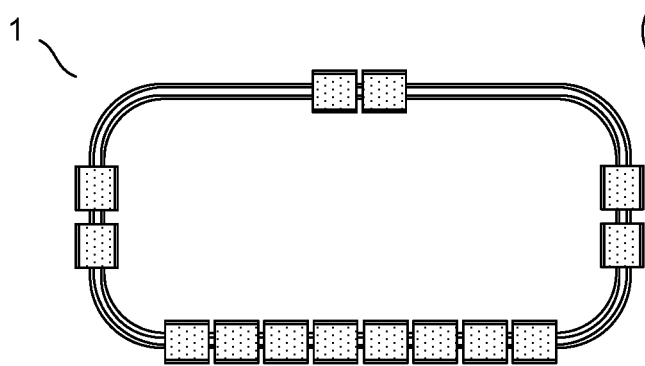
Figure 9D:
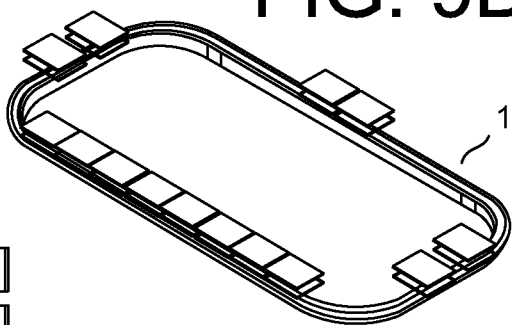

FIG. 8 is a schematic axonometric view of the handling system according to the invention, in the compact linear configuration with double and adjacent vertical loop, of the top-bottom type with opposite lateral overturnings.

FIGS. 9a-d are schematic orthogonal (FIGS. 9a-c) and axonometric (FIG. 9d) views of the handling system according to the invention, in the simple horizontal loop configuration in the form of a circuit; FIGS. 9e-g are alternative views of the loop configuration also comprising a central server and display, workstation, vision systems; the stations, the accessory components and the central server being represented in a schematic, unrealistic way.

FIG. 9h shows a detail of the variant of the invention with the sliding shoe provided with rollers which slide on guides and induction power supply system.

Figure 10A:
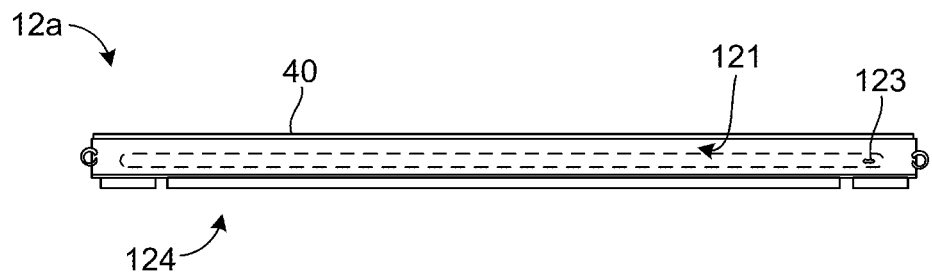
Figure 10B:
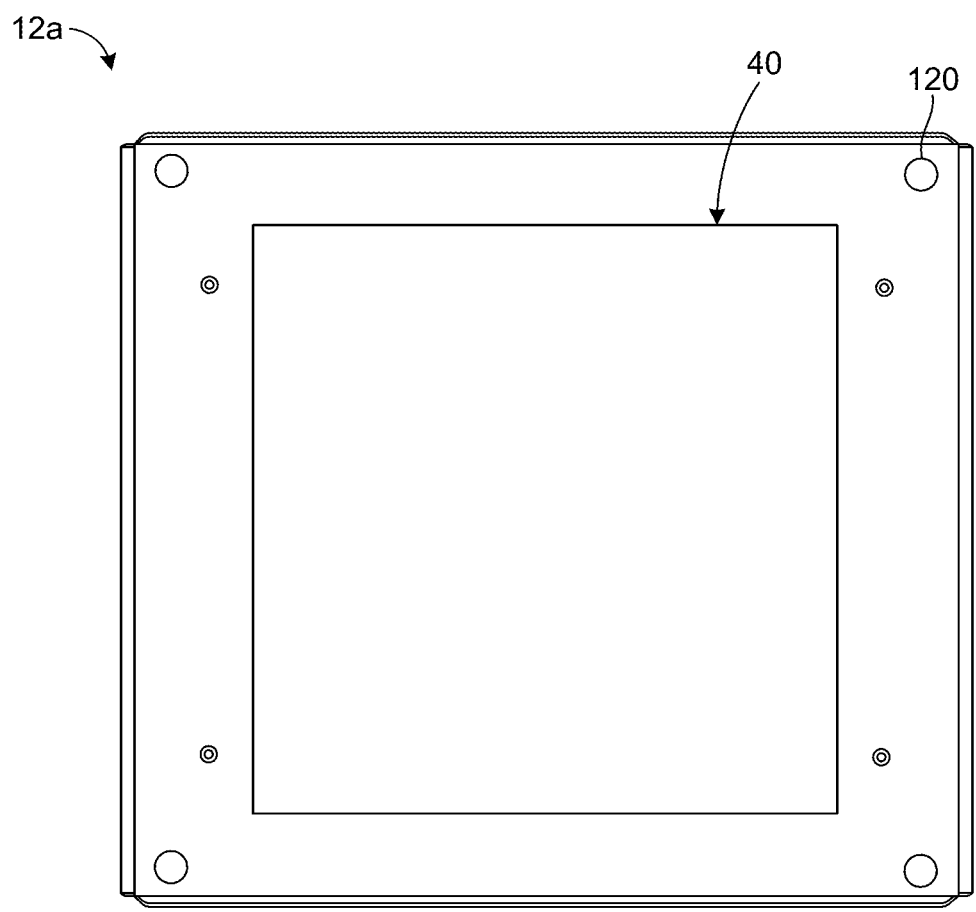

FIGS. 10a-b orthogonally show, from the side (FIG. 10a) and from the top (FIG. 10b), the equipped tray for flat semi-finished products such as a photovoltaic cell or wafer, which is represented therein to facilitate understanding.

Figure 11A:
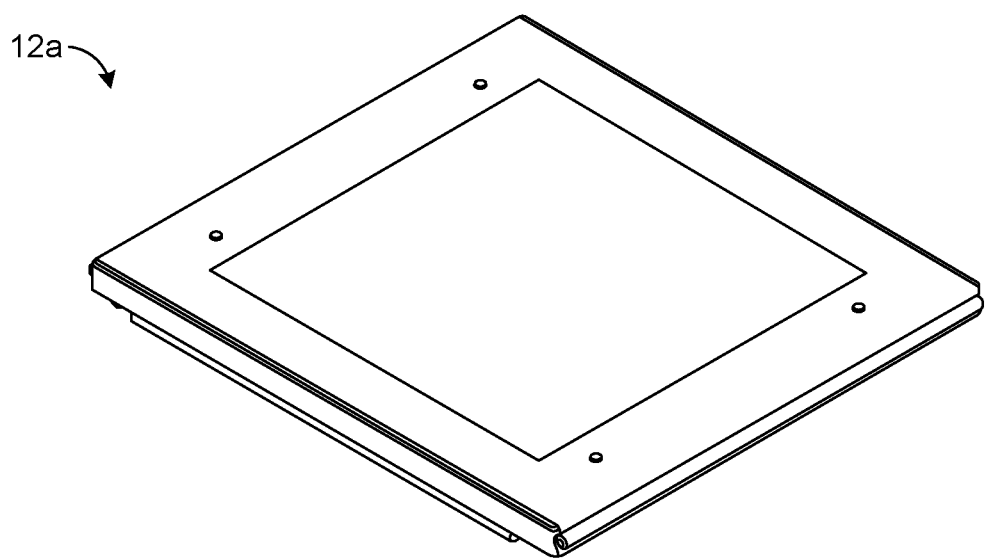
Figure 11B:
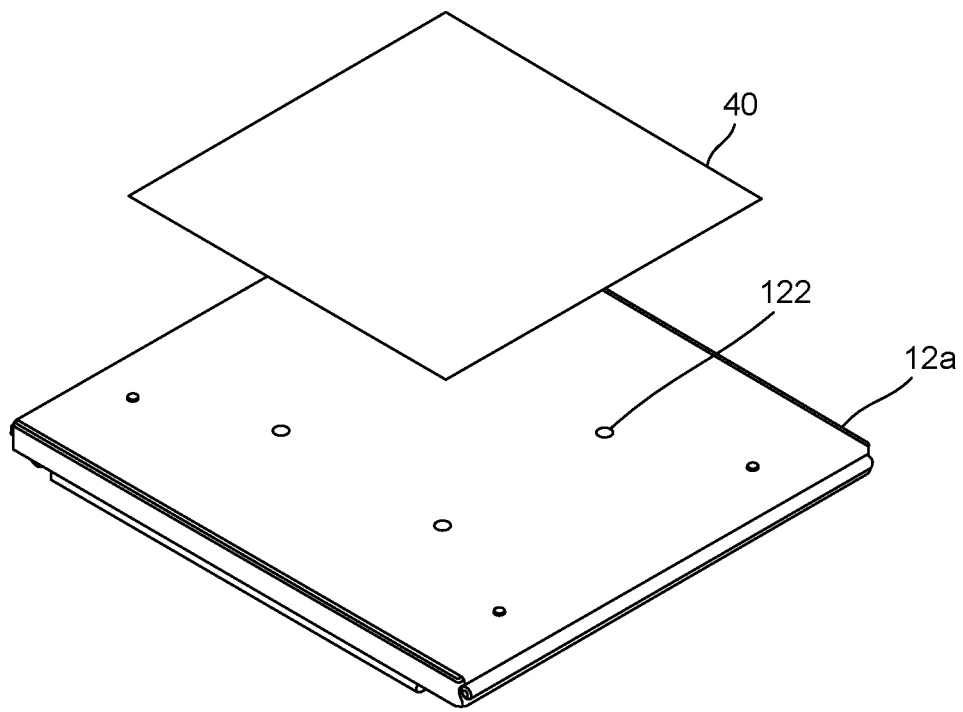

FIGS. 11a-b show, in an axonometric view with a respectively assembled and separate photovoltaic cell, the tray as in (FIGS. 11a-b).

Figure 12A:
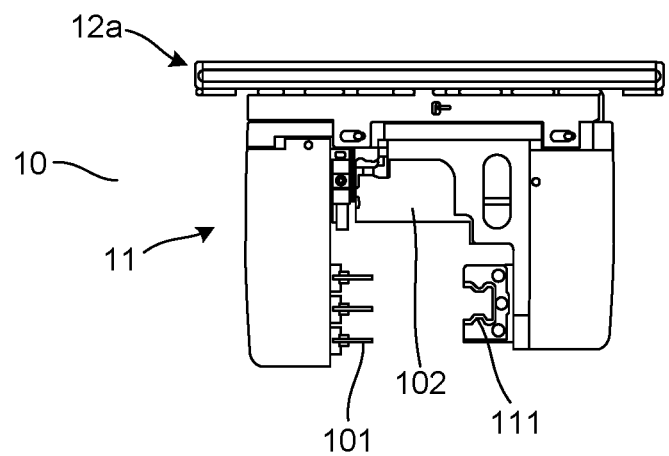
Figure 12B:
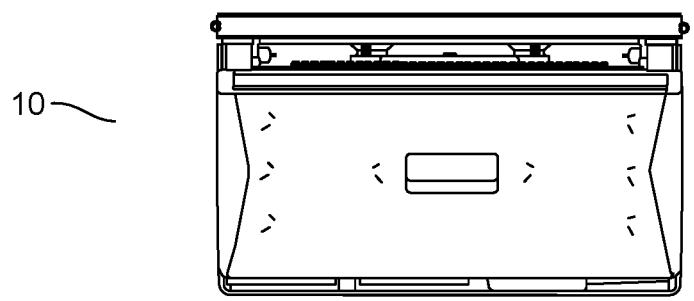
Figure 12C:
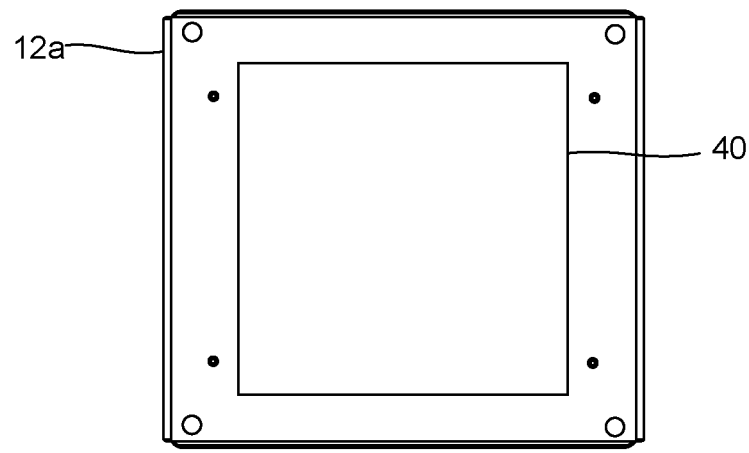

FIGS. 12a-c orthogonally show the shuttle according to the invention from the bottom (FIG. 12a), from the side (FIGS. 12b) and from the top (FIG. 12c) respectively.

Figure 13A:
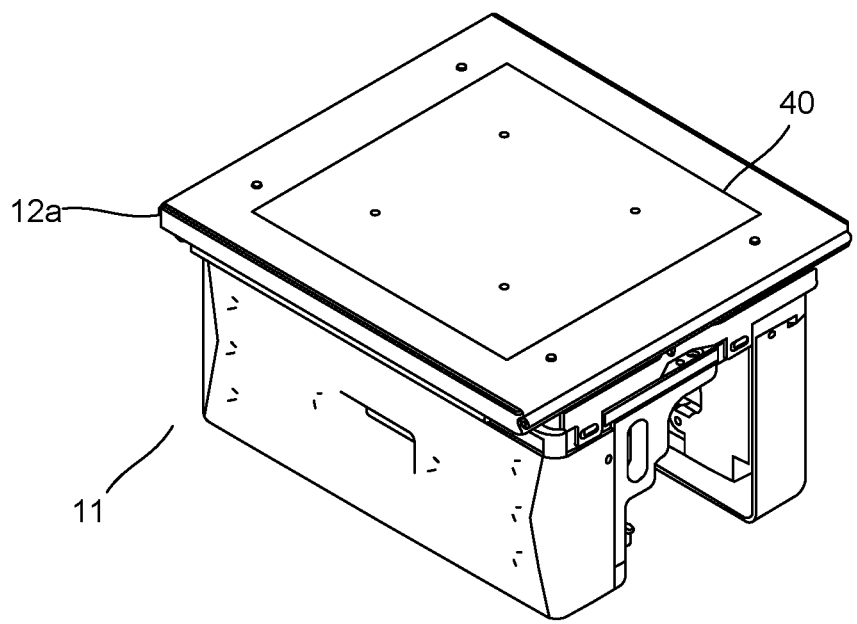
Figure 13B:
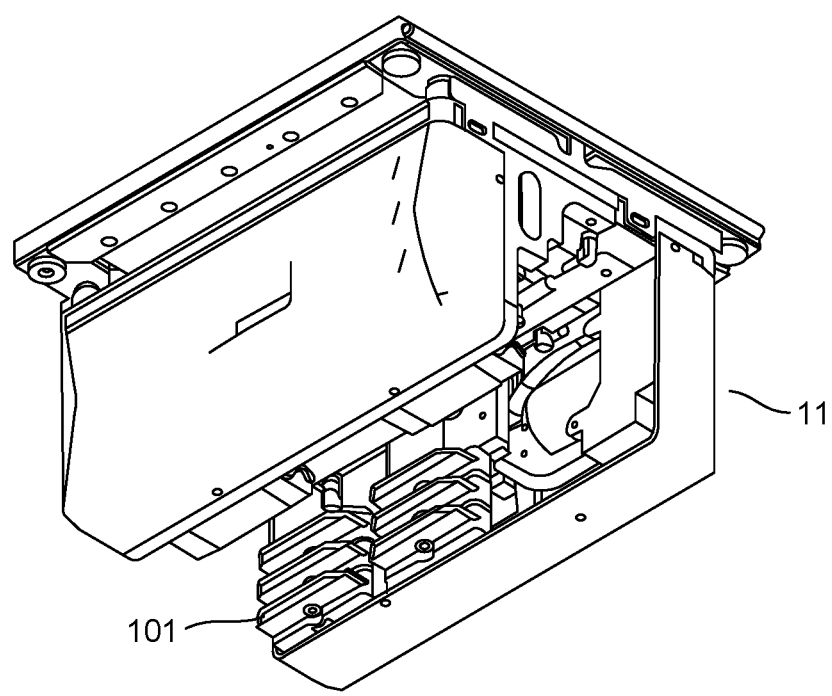

FIGS. 13a-b show the shuttle according to the invention in an axonometric view, from the top and from the bottom respectively.

Figure 14A:
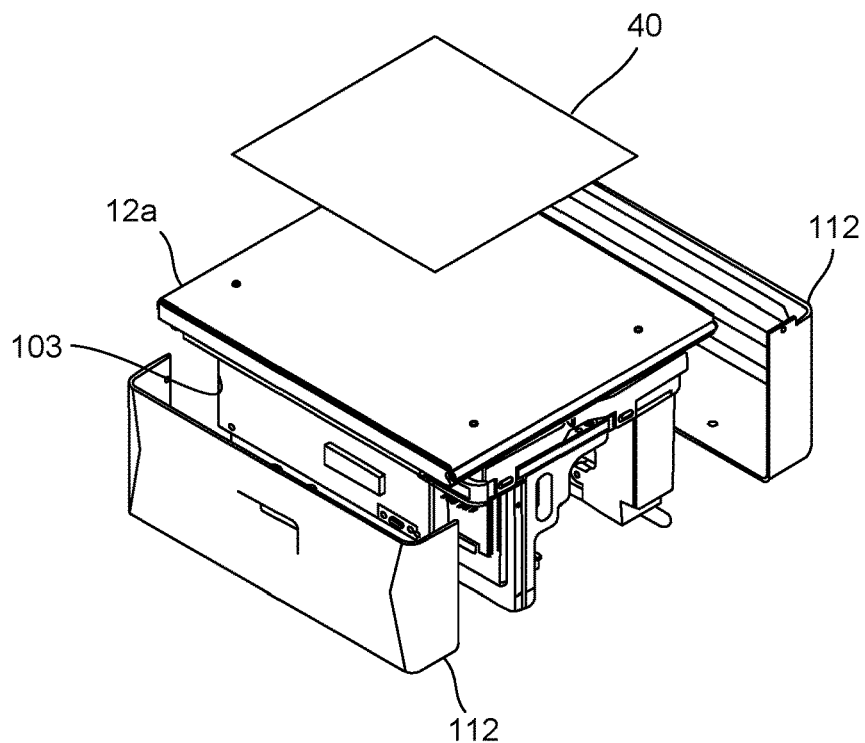
Figure 14B:
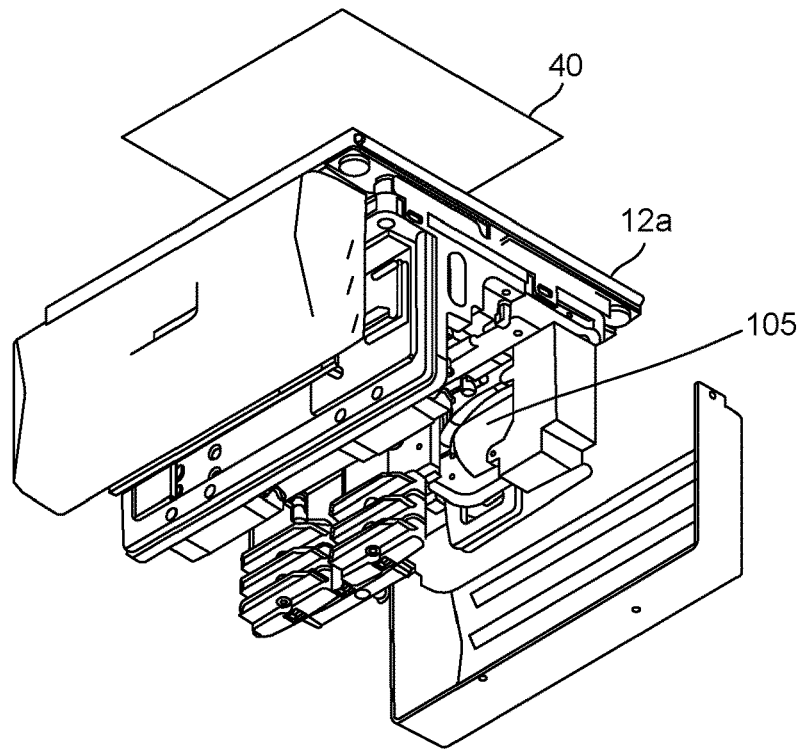
Figure 15A:
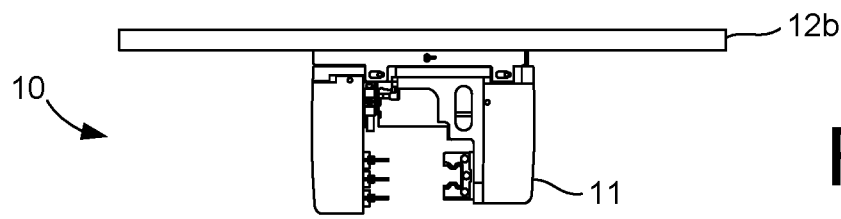
Figure 15B:
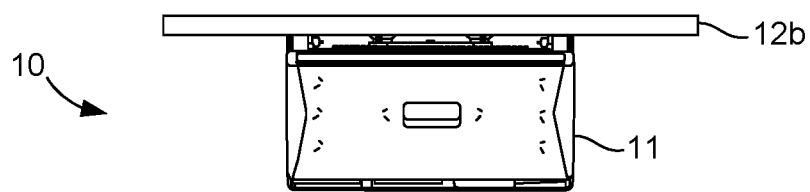
Figure 15C:
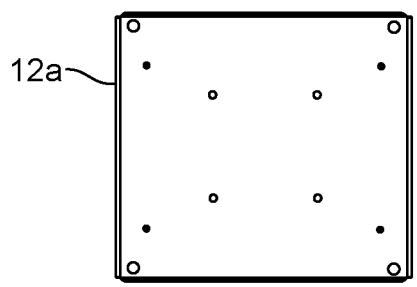
Figure 15D:
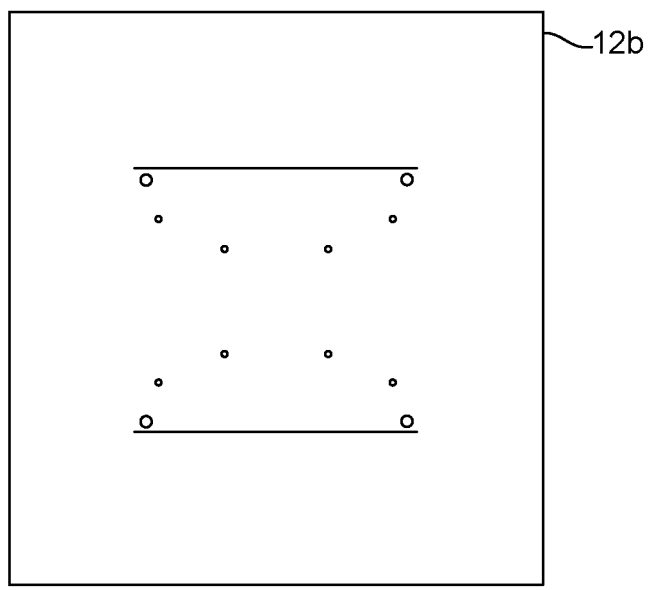

FIGS. 14a-b show the shuttle according to the invention in an exploded axonometric view, from the top and from the bottom respectively.

FIGS. 15a-d orthogonally show the shuttle according to the invention in the variant with an enlarged tray.

Figure 16A:
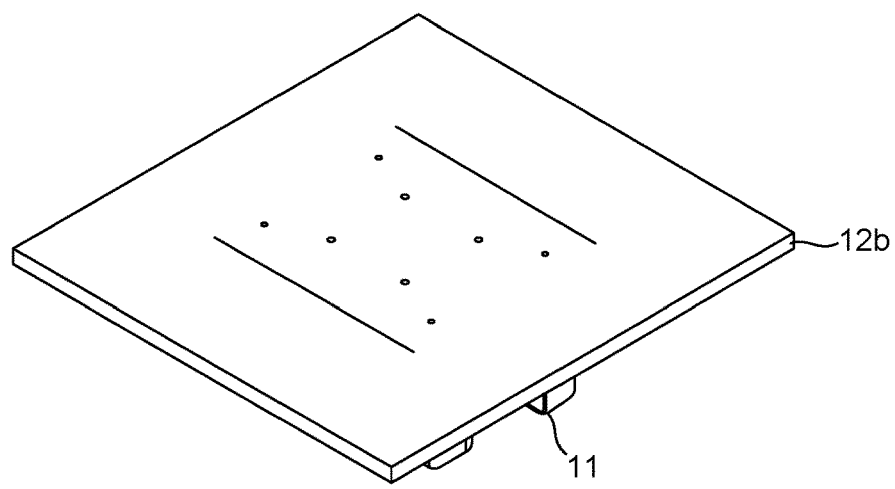
Figure 16B:
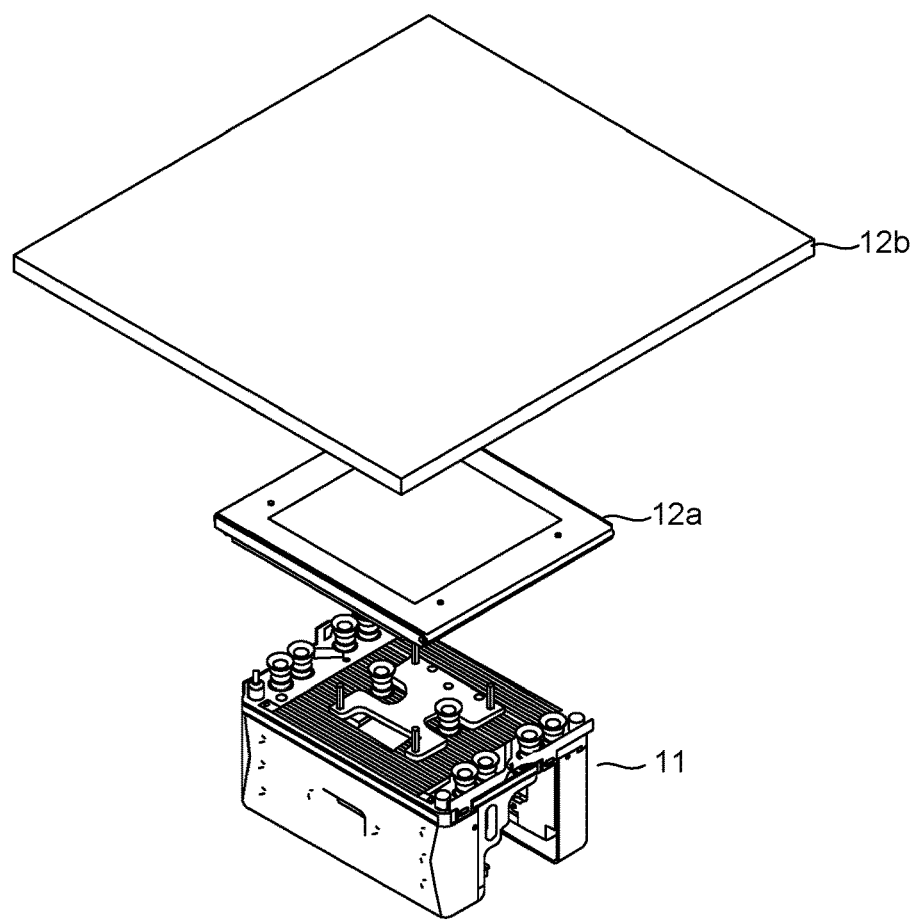
Figure 16C:
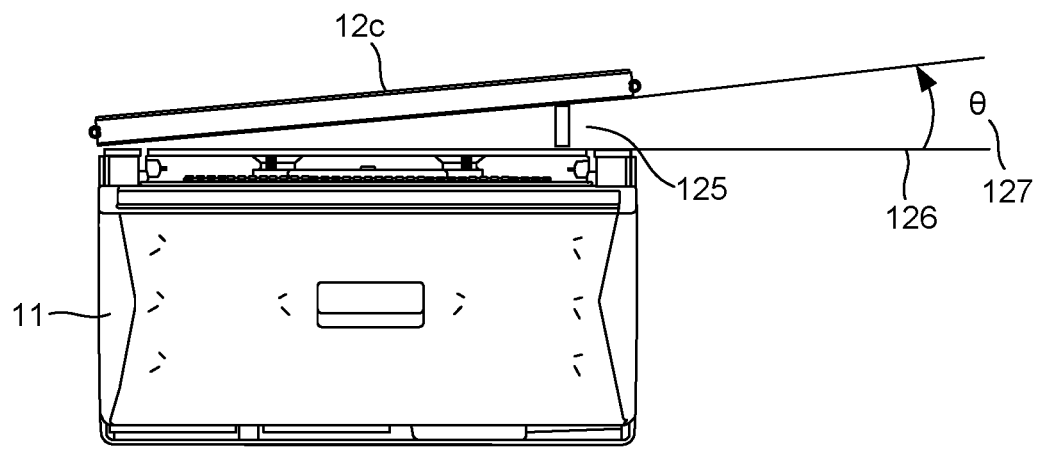
Figure 16D:
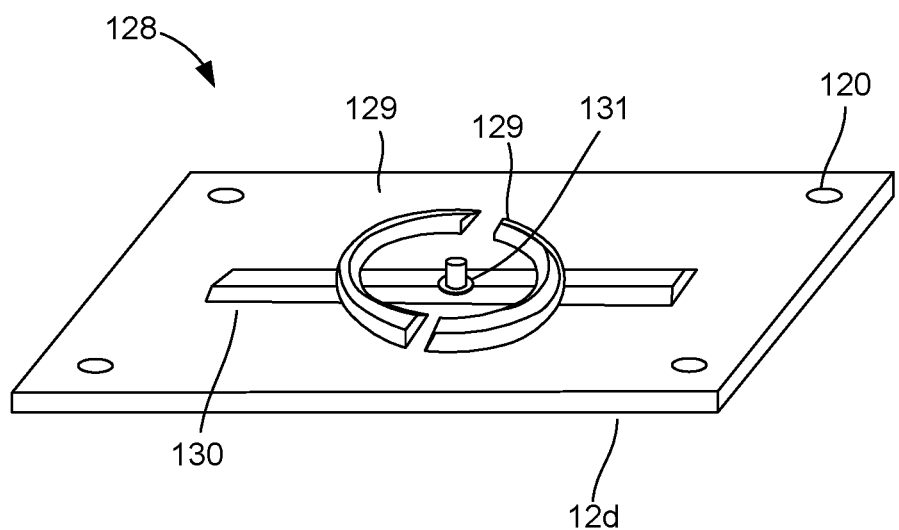

FIGS. 16a-b show, in an axonometric view, the shuttle according to the invention in the variant with a double tray, assembled or separate respectively.

Figure 17:
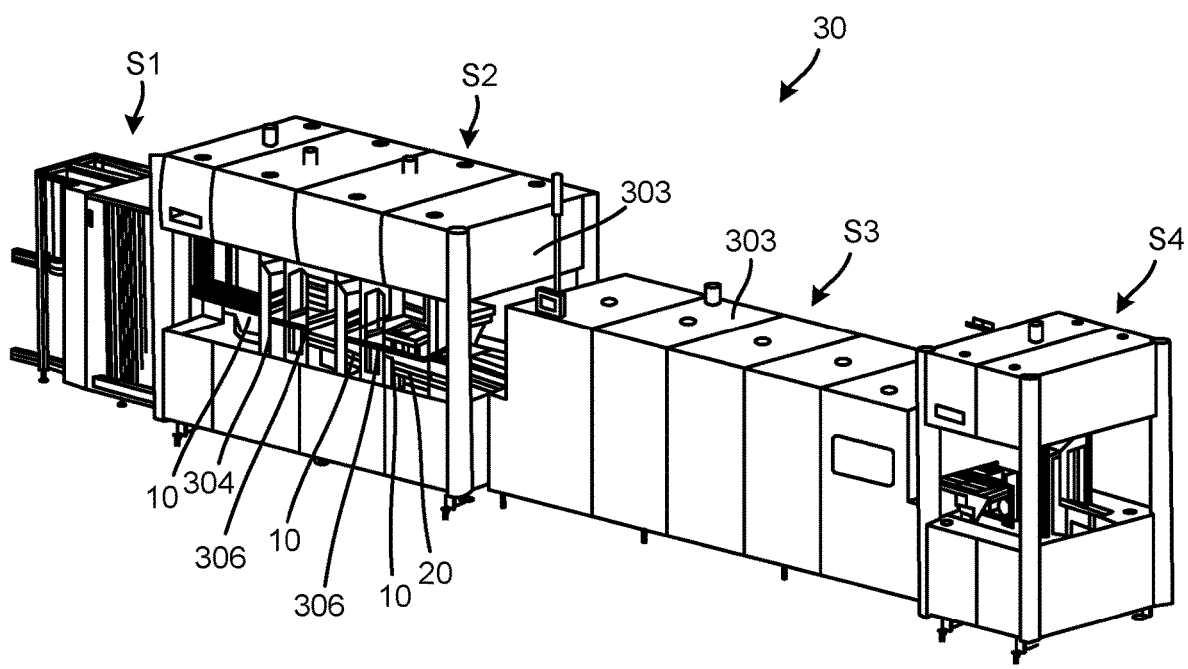

FIG. 17 is an axonometric view of the automatic production plant, according to the invention, of the automated silk-screen printing line type for printing on photovoltaic cells or wafers, with modular workstations with a continuous rail handling system provided with permanent magnets and shuttles with on-board coils.

Figure 18A:
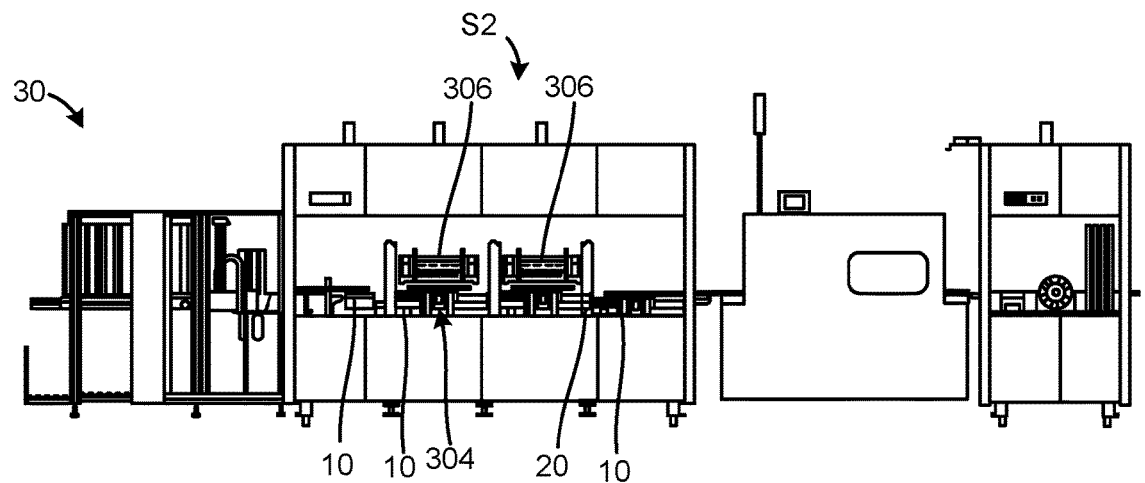
Figure 18B:
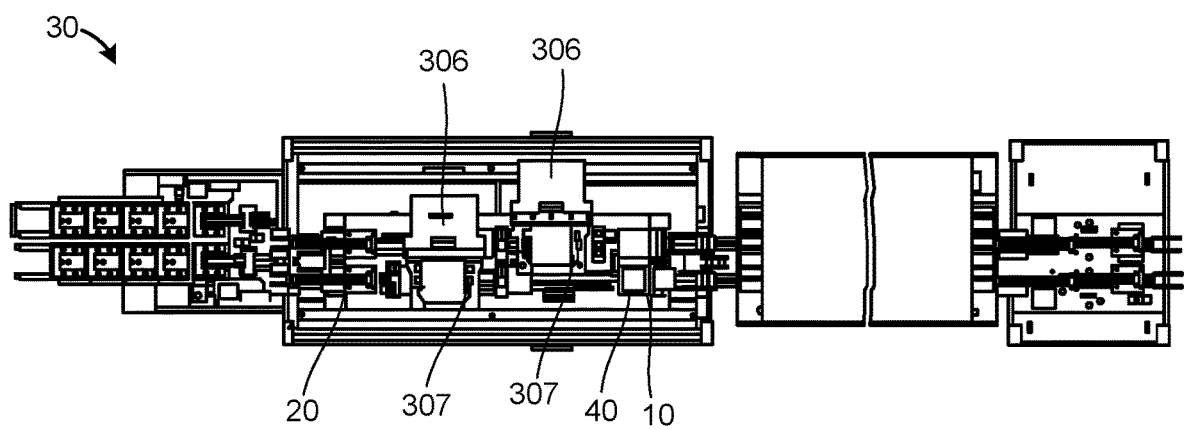

FIGS. 18a-b orthogonally show the production plant according to the invention as in (FIG. 17), from the side (FIG. 18a) and in section from the top (FIG. 18b) respectively.

Figure 19A:
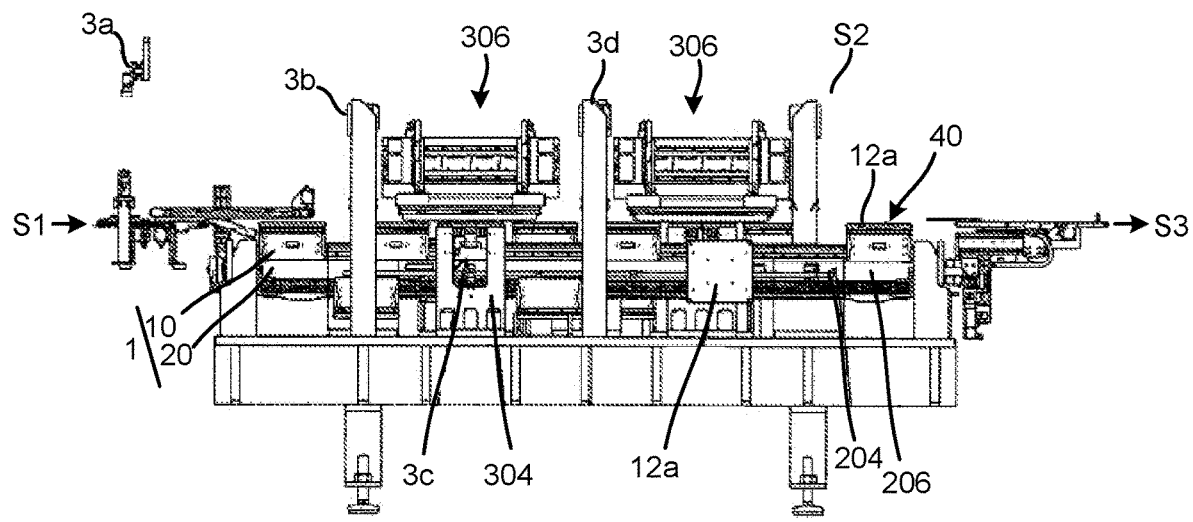
Figure 19B:
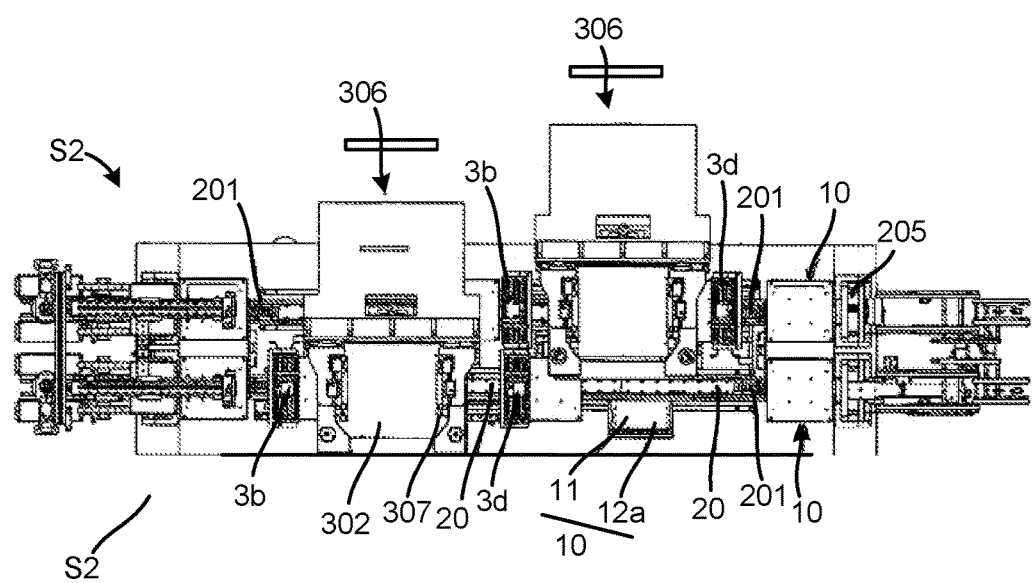

FIGS. 19a-b orthogonally show, in detail, the inside of the second station of the plant as in (FIGS. 17-8) wherein the silk-screen printing occurs with the shuttle handling system as in (FIGS. 1-16), and the various cameras of the vision and control system.

Figure 20A:
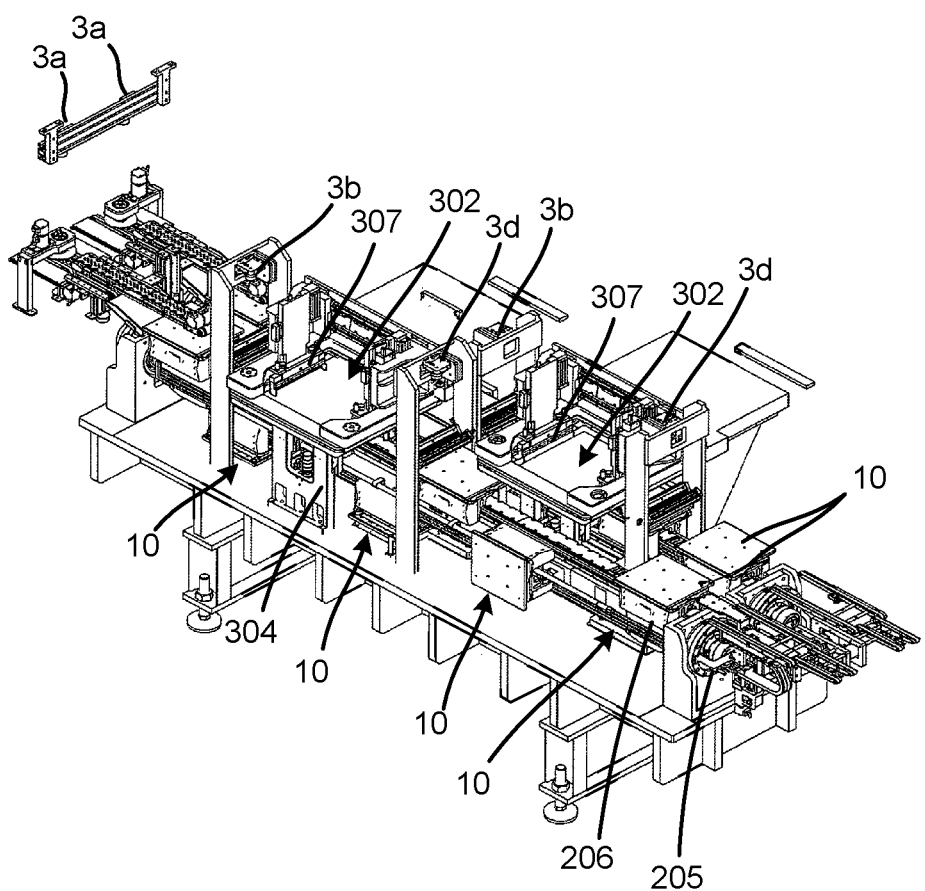
Figure 20B:
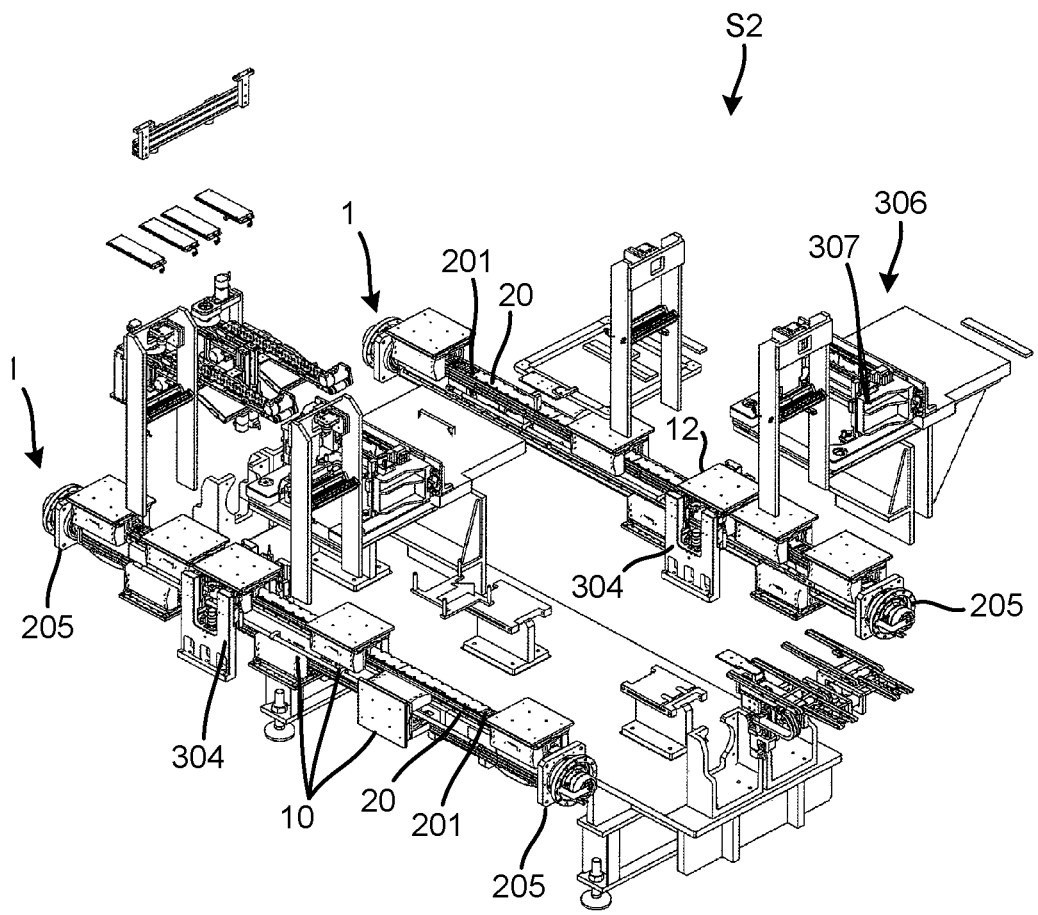

FIGS. 20a-b show, in an axonometric view, assembled (FIG. 20a) and exploded (FIG. 20b) respectively, the apparatus as in (FIGS. 19a-b).

Figure 21A:
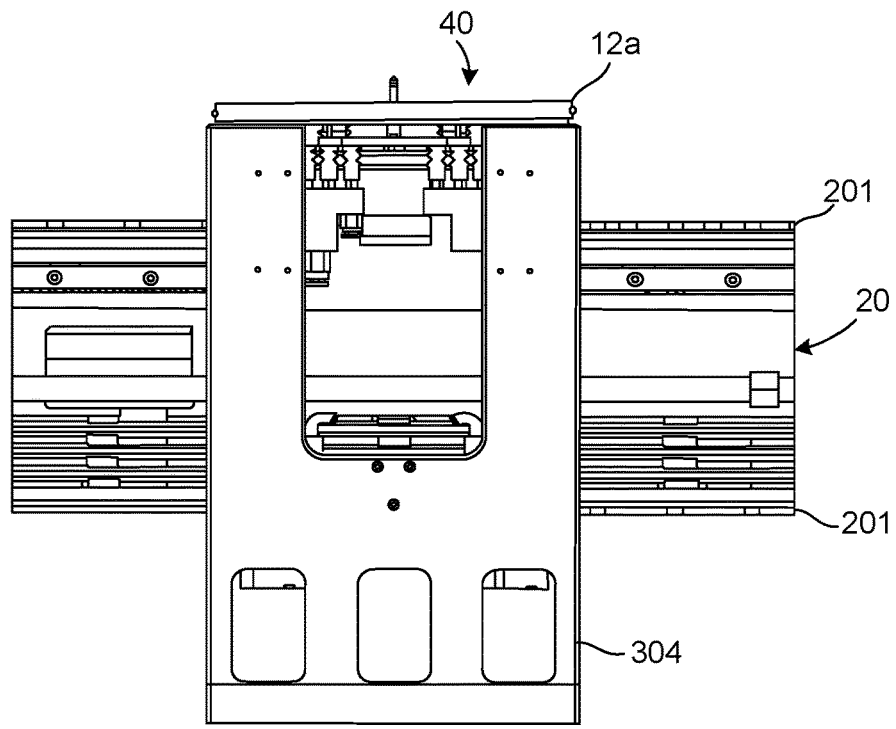
Figure 21B:
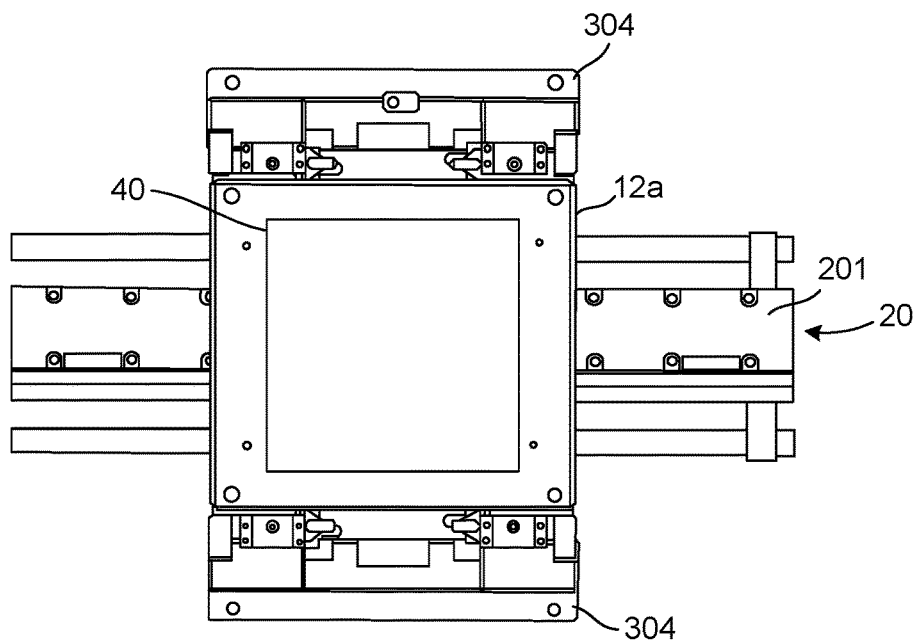
Figure 21C:
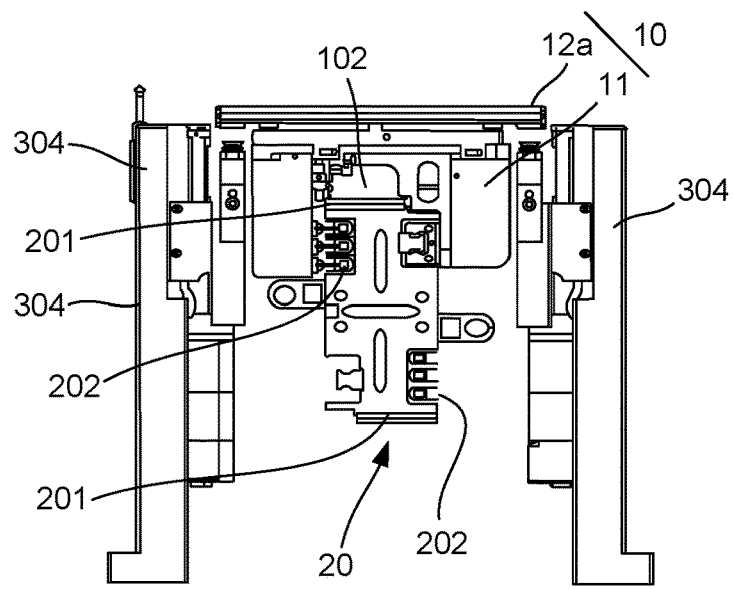

FIGS. 21a-c orthogonally show the shuttle according to the invention mounted on a portion of rail, in correspondence of the portal of calibrated lifting for the silk-screen printing of a photovoltaic cell, that is to say, from the bottom upwards.

Figure 22A:
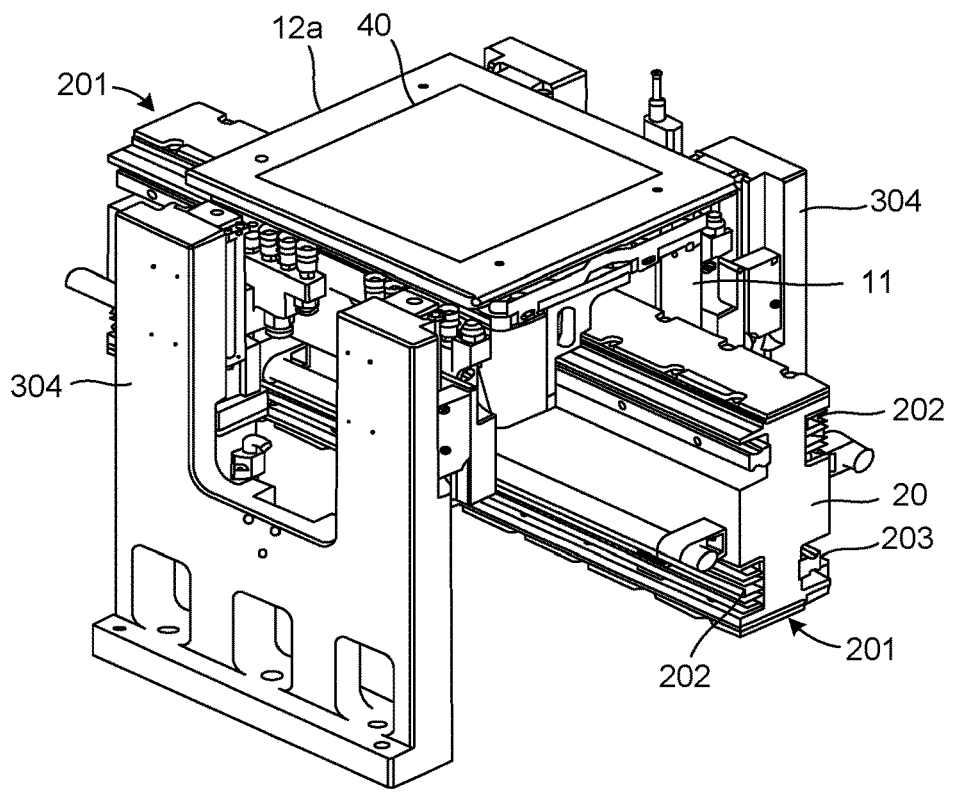
Figure 22B:
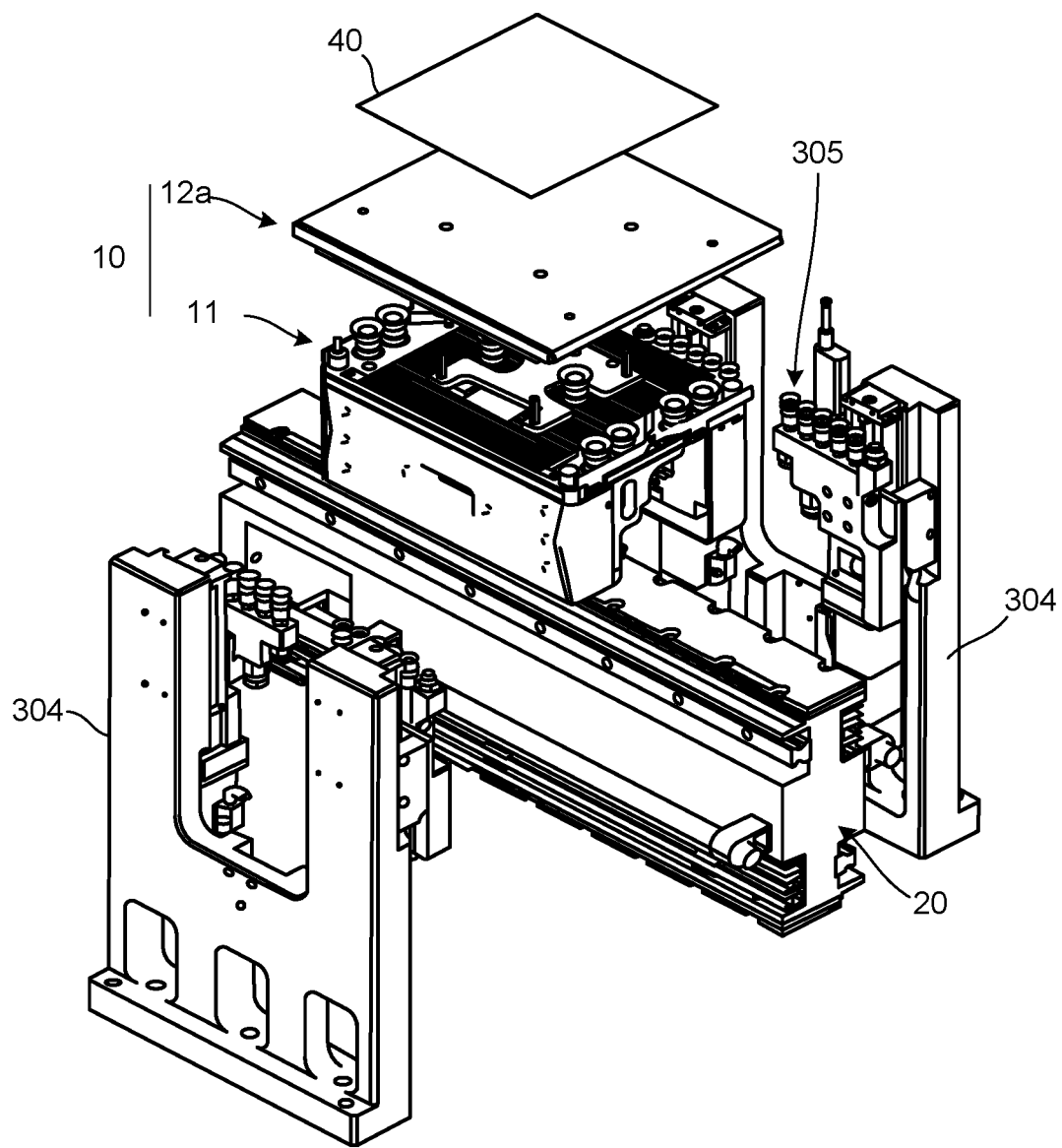

FIGS. 22a-b show, in an axonometric view, assembled (FIG. 22a) and exploded (FIG. 22b) respectively, the shuttle according to the invention mounted on a portion of rail as in (FIGS. 21a-c).

Figure 23A:
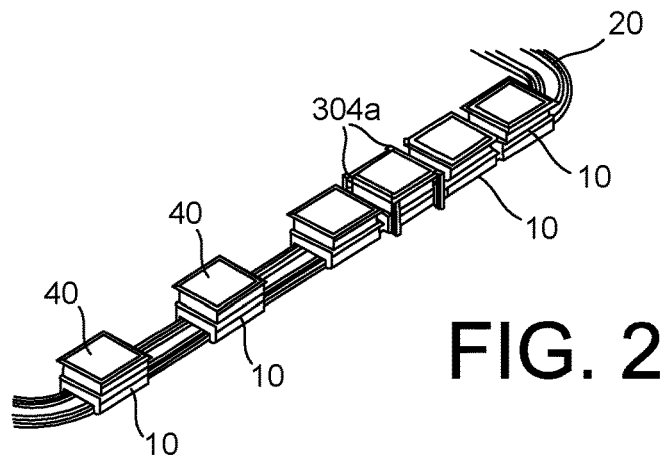
Figure 23B:
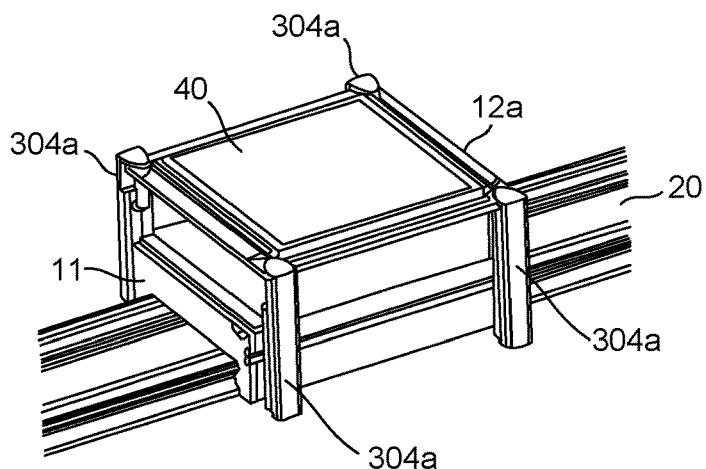
Figure 23C:
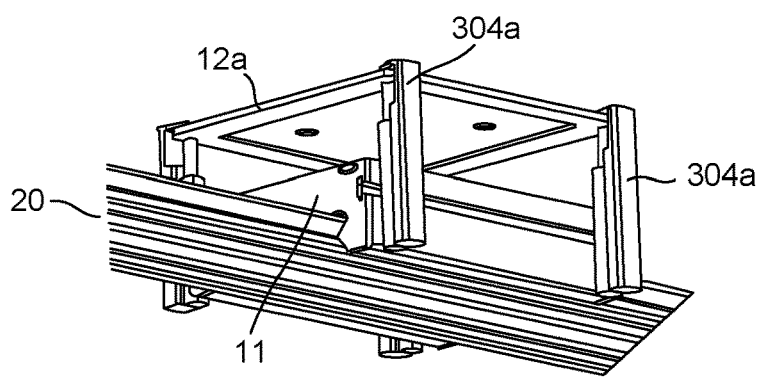

FIGS. 23a-c are simplified and detailed axonometric views of the shuttle according to the invention in action on the portion of rail, in correspondence of the portals of calibrated lifting with release of the tray.

Figure 24:
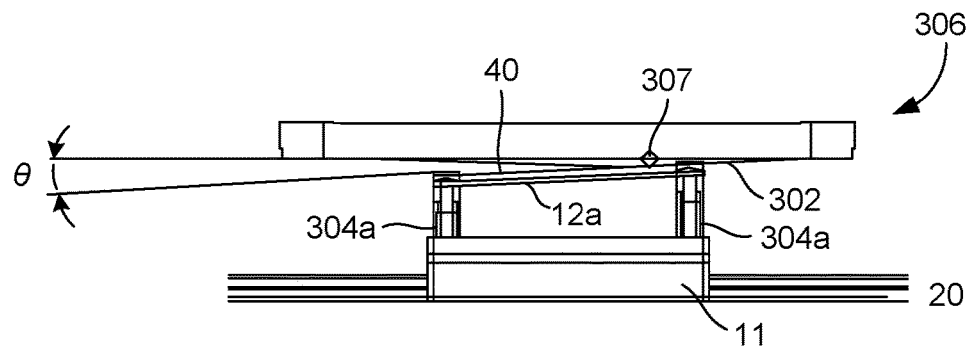

FIG. 24 is a detailed orthogonal view, from the side, of the plant in which the silk-screen printing of the cell occurs by means of portals of calibrated lifting, the contact surface being inclined to adapt to the deformation of the silk-screen surface, that is to say, performing a tilting function.

Figure 25A:
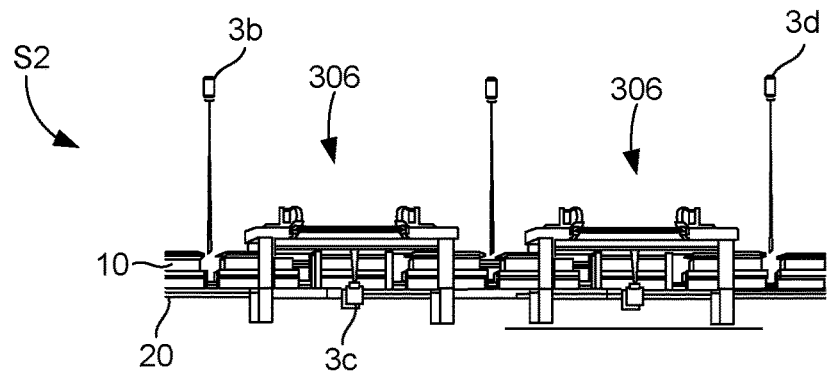
Figure 25B:
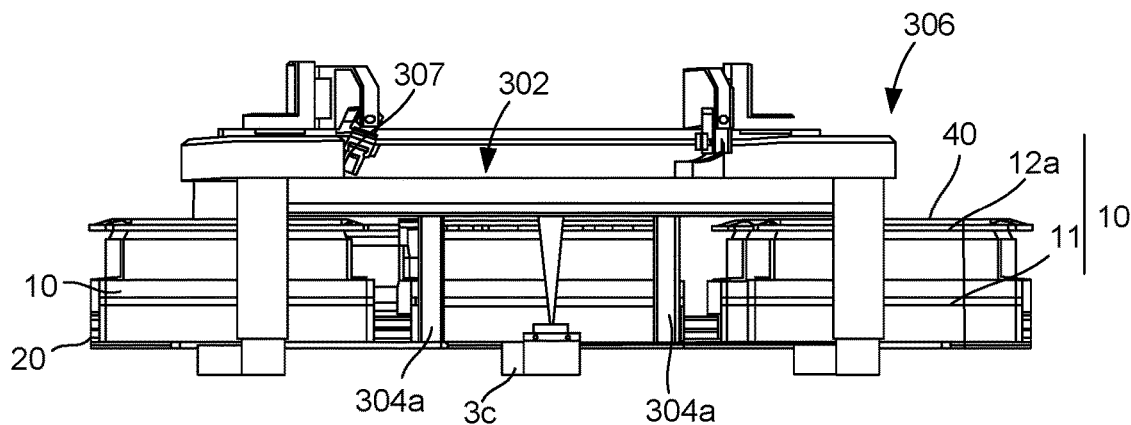

FIGS. 25a-b laterally show in detail the shuttles with the photovoltaic cells in correspondence of the printheads with the portals of calibrated lifting and the various cameras.

Figure 26A:
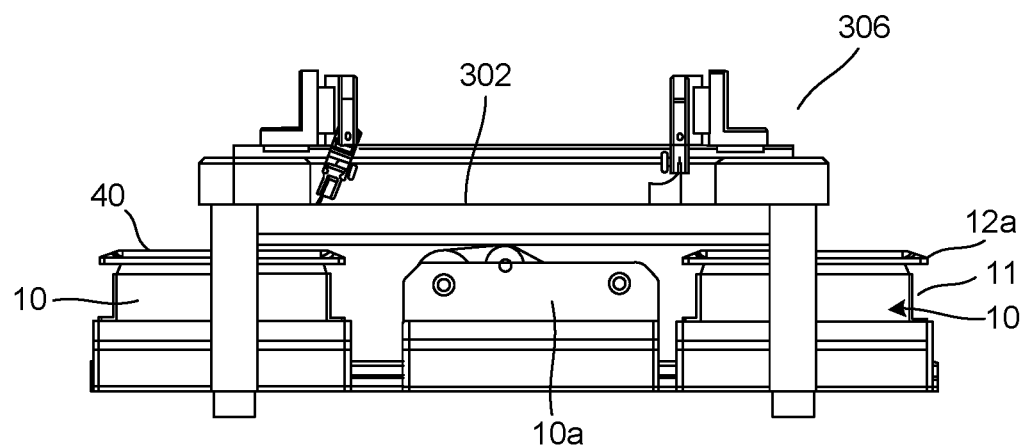
Figure 26B:
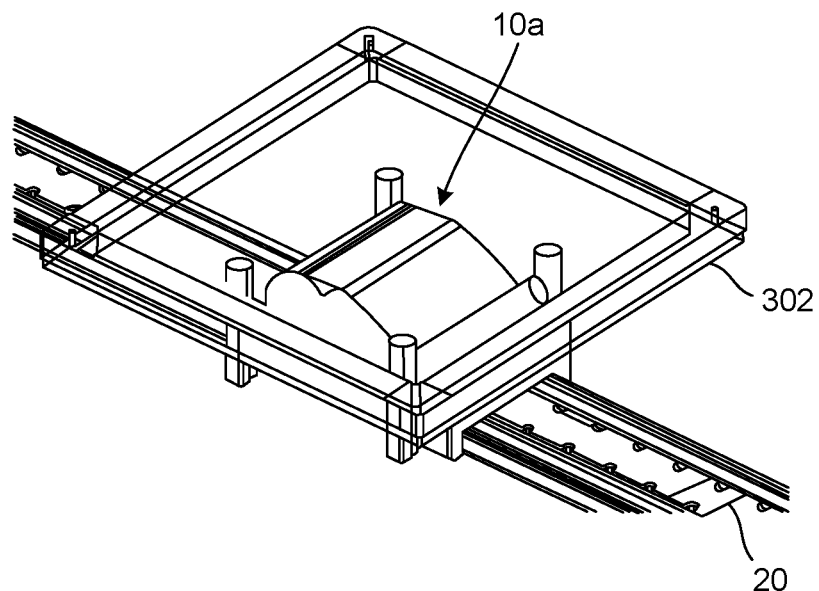

FIGS. 26a-b schematically show from the side and in axonometry the variant of shuttle equipped for the automatic cleaning from the bottom.

Figure 27A:
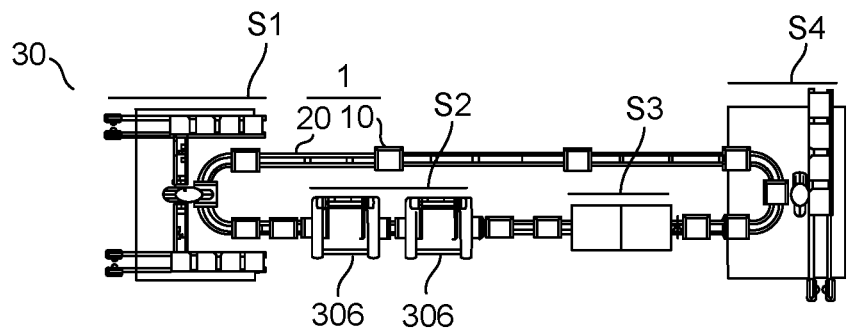
Figure 27B:
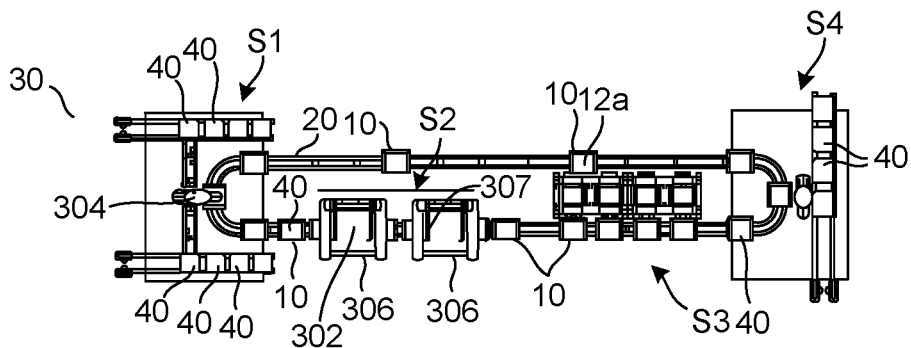
Figure 27C:
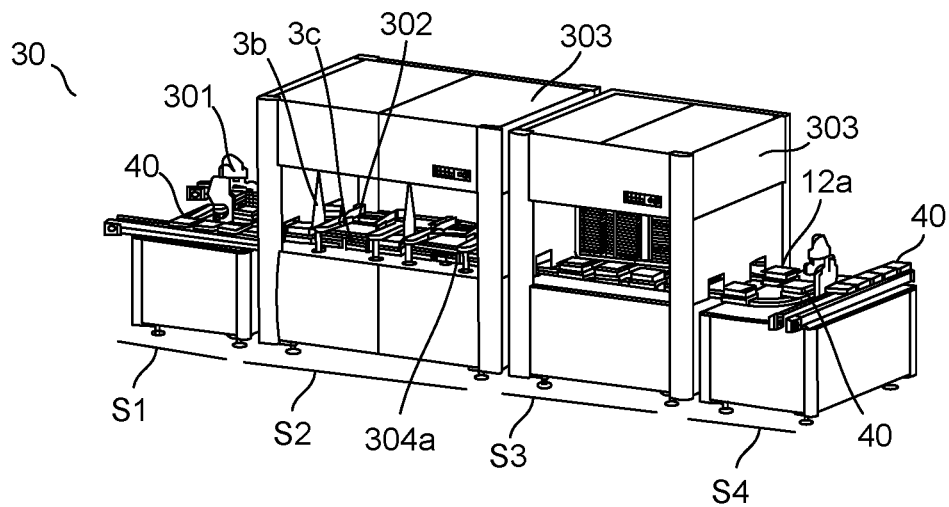

FIGS. 27a-c schematically show the stations of the plant in the particular continuous horizontal loop configuration and without protective structures of the stations, in the variant with UV (FIG. 27a) or radiant (FIGS. 27b-c) furnace.

Figure 28:
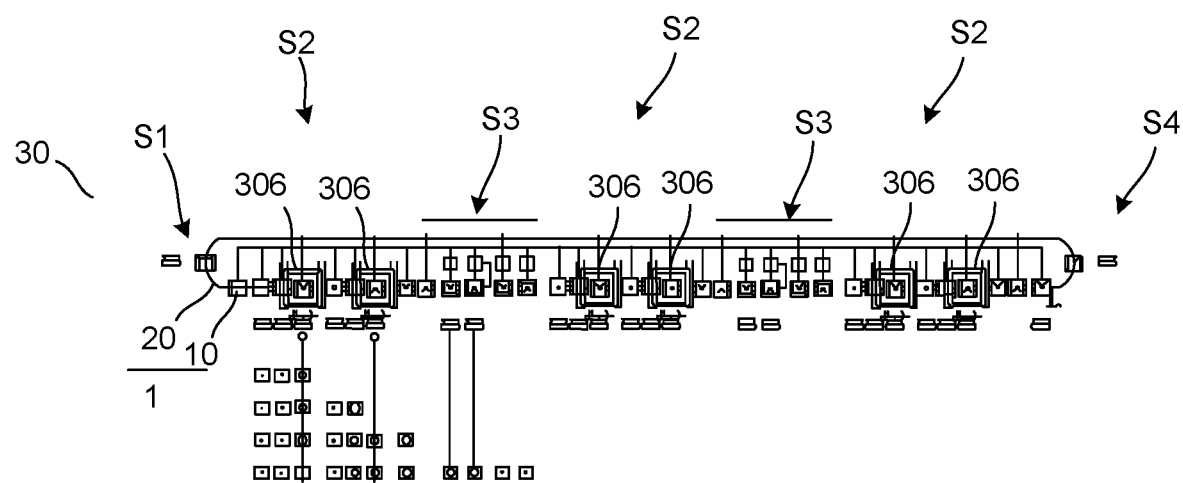

FIG. 28 schematically shows a high-productivity plant, with a continuous rail in the form of a circuit also with partial return of the shuttles, wherein the printing and hardening stations are adjacent and repeated several times using the same shuttle transport device.

Figure 29:
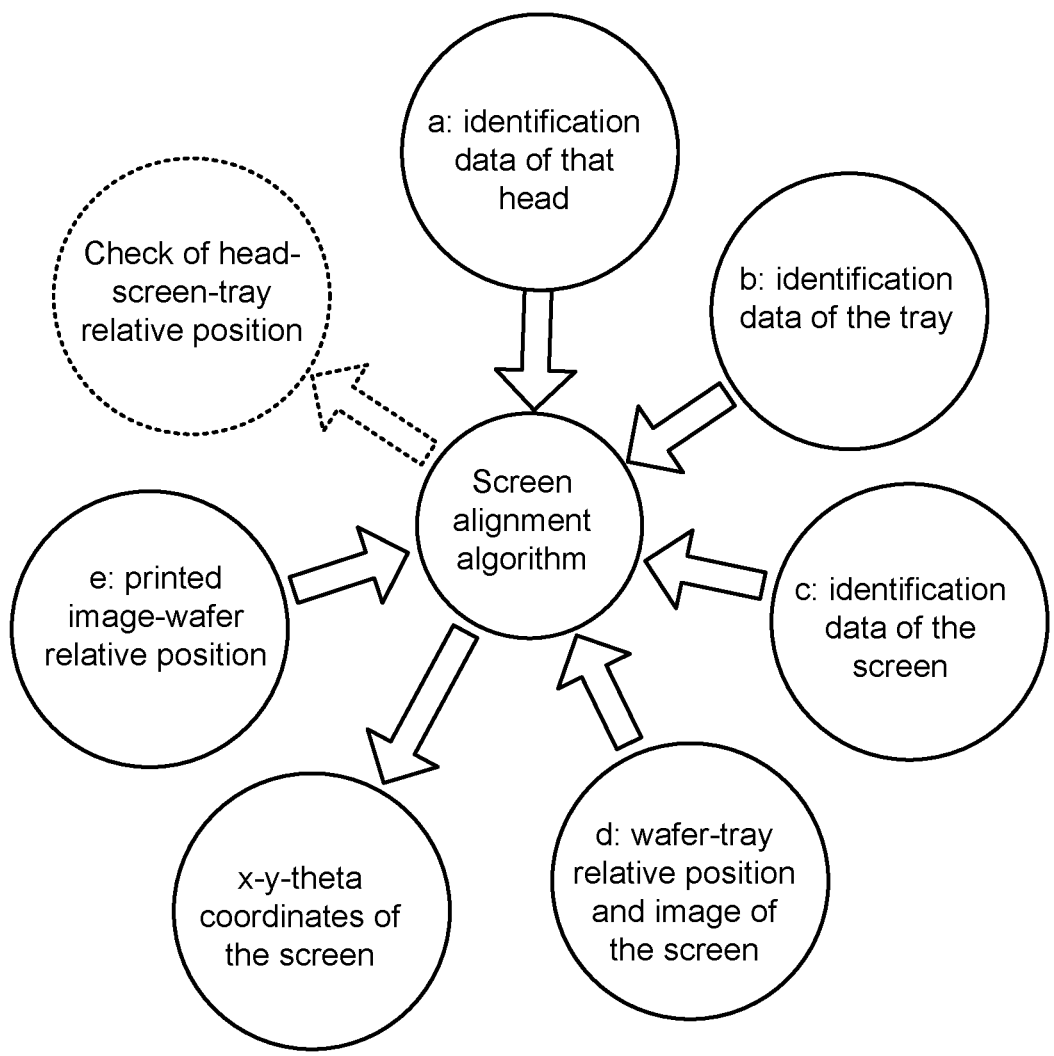
Figure 30C:
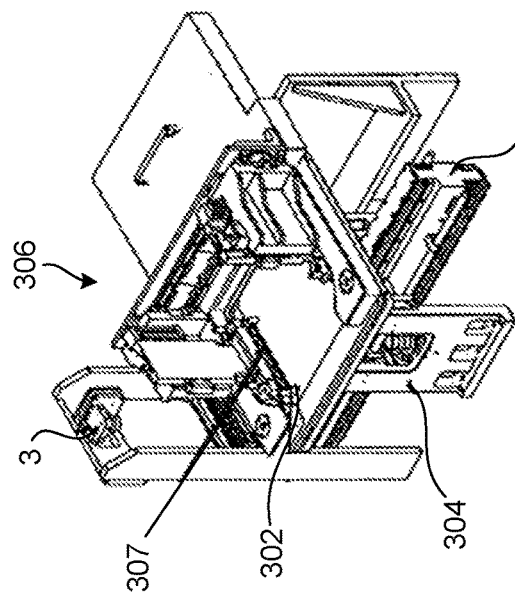
Figure 30D:
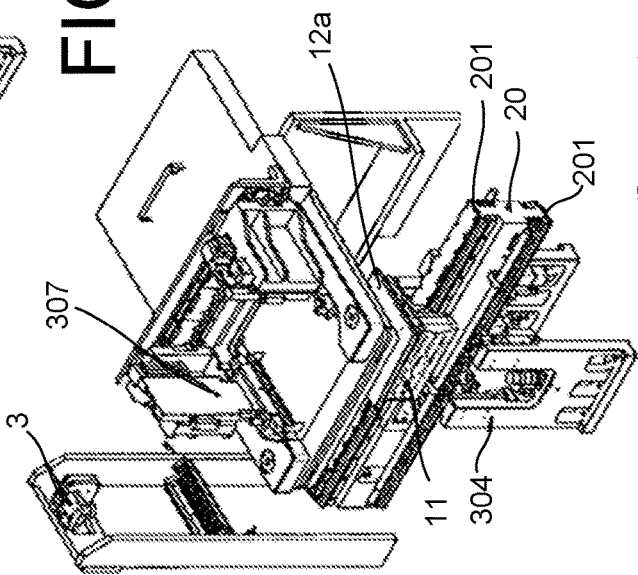
Figure 30A:
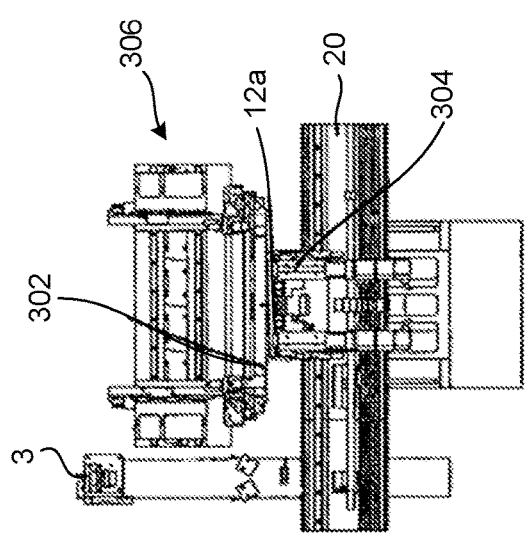
Figure 30B:
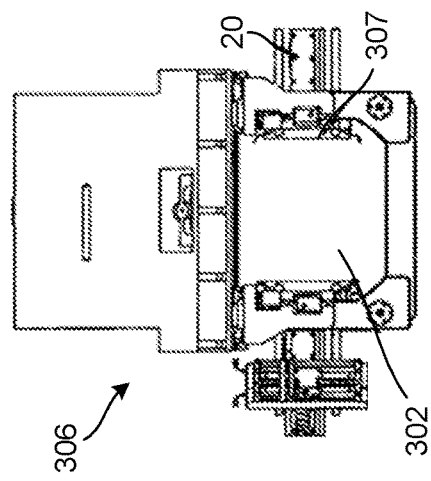

FIG. 29 is a simplified diagram of processing of the printing screen alignment algorithm.

FIGS. 30a-d are images of the silk-screen printing machine according to the invention in correspondence of the tilting system, they being orthogonal views from the side (30a) and from the top (30b) and axonometric overall (30c) or exploded views (30d) respectively, which show the linear motors as well.

DESCRIPTION OF AT LEAST ONE EMBODIMENT OF THE INVENTION

With reference to the Figures (FIGS. 1-30) as well, the invention describes an innovative method and automated plant (30) for silk-screen printing on photovoltaic cells (40) or wafers providing linear synchronous motor LSM drive of the moving coils type in an advantageous modular and integrated system (1) of industrial handling with shuttles (10) aimed at said printing. In the following description the terms cell (40) and wafer indicate in any case, for clarity purposes, the substrate on which the silk-screen deposition is carried out. To this purpose, one should remember that a photovoltaic cell is generally obtained starting from a wafer of crystalline silicon which, following successive working processes among which said metallization, assumes the configuration of a finished product intended to exploit photovoltaic conversion; therefore, for the purposes of the invention said substrate, although being conventionally called cell (40) during the various processing phases, is preferably a virgin wafer but it can also be an already metallized cell on which an additional silk-screen deposit is applied or a different flat substrate, for example of a semiconductor material or of alumina or vetronite or another material, on which a silk-screen deposit is applied.

Particularly, for the purpose of said silk-screen printing on cells (40) or wafers a system (1) is implemented in which multiple shuttles (10), of the smart type, that is to say, provided with a logic on the shuttle processable according to signals received from on-board optical or electromagnetic sensors or received via antenna, are intended to translate on the same rail (20) in an independent but coordinated, synchronous and/or asynchronous, way, facilitating the different processing phases of printing.

Each shuttle (10) is mainly made up of two portions:
- a lower portion is a self-propelled sliding shoe (11), which is conventionally called sliding shoe or mover, which acts as a slider constrained to the rail (20) in a removable way and comprises all the active means for performing the advancing movements and enabling the secondary drives, according to the secondary working and printing axes, also with the respective control and communication means;
- an upper portion is an interface means, in particular an equipped tray (12a) for actuating the secondary working drives, which is supported and/or constrained in a removable way with respect to said sliding shoe (11) in such a way as to support and/or transport and/or position said cell (40) or wafer according to the working processes of printing.

Each sliding shoe (11) is autonomous and independent, comprising on-board coils (102) selectively supplied and controlled for the purpose of electromagnetic drive, also with its logic control unit (103), sensors and means for receiving and transmitting information; therefore, each shuttle (10) is connected wirelessly for power supply and data transmission (FIGS. 1-5,13-4).

The rail (20), on the other hand, integrates a continuous series of permanent magnets (201) along its entire length and also integrates absolute reference means of the encoder type which can be used simultaneously by each shuttle (10, 110) and by the central server (2) which acts as a centralized logic unit of control and support of the system (1, 10, 103), for the purpose of instantaneous localization and adaptations (FIGS. 5-7). To this purpose, the invention provides a system of smart sensors which interact both on a local level and on a global level, which consists of readers and proximity sensors mounted on the shuttle (10, 11) and a linear position transducer or linear encoder which is fixed in a continuous way on the rail, along the entire path like a fixed and preferably absolute reference. In this way one simultaneously enables the centralized or localized control of the positioning of each sliding shoe (11), also allowing each shuttle (10) active in the system (1) to know the position of the other shuttles in any direction of travel; such a solution is particularly useful in case of maintenance, machine downtime or system re-setting and overcomes the known problems of the systems with encoders of the incremental type, which are substantially intended to detect the relative positioning from one point to another. Furthermore, said rail (20) can advantageously integrate the means for the power supply of the shuttles and/or for data transmission.

It can be observed that said shuttle (10) is basically a smart, autonomous drive motor module, that is to say, of the active type, having on board the electromagnetic coils (102) and all the necessary functions for operating in the integrated system (1), that is to say, only requiring power supply and connection for communication. In particular, said active module does not contain moving parts and is not subject to wear, it being substantially a mechatronic unit formed by a fully integrated linear synchronous motor, that is to say, including its own logic control unit and some means for the exact detection of position, of the absolute reference type. Therefore, the arrangement of the on-board supplied coils and the structural configuration of the shuttle allow to realize a ready-to-use handling unit, easy to be removed or added, which allows to optimize control electronics and reduce assembly costs.

The measure of the translation of said active module is autonomous, each shuttle (10) being provided with its detector of a univocal and absolute reference along the entire rail, like the permanent magnets, that is to say, said rail (20) being of the passive type. Therefore, for each shuttle added or replaced in the system, one can clearly see the advantage of not having to adjust, or calibrate or add any device or equipment for the purpose of control, the instantaneous detection of the position of the shuttle and also of the other connected shuttles being automatic. In this way, the system is always calibrated and tolerances are automatically compensated for. Moreover it can be observed that, once the mission of each shuttle has been programmed on its logic unit, the system is autonomous there not being the need for a general control board of each function, but only for a centralized server to which and from which each shuttle sends and receives information. Each shuttle is thus of the lightened type, that is to say, of less than 5000 g, and also the load-bearing structure consisting of the rail and of the respective supports is lightened and of compact size. Finally, the path of the shuttles is easily composable by joining in series straight and/or curved sections of rail and/or overturning means and/or rail switches.

The rail (20) comprises permanent magnets along its entire operational length, adapting in an optimal way to the configuration of said shuttles (10) thanks to the optimized geometrical shape and to the surface preferably of high-resistance anodized aluminium which houses the sliding linear guides for roller or ball bearings, housed on the shuttle, and enables rapid movements and without wear; in this way lubrication is not provided and is not necessary. The insertion or the removal of the single shuttle (10) in the rail (20) is particularly easy both on the main section of translation of the rail or on secondary sections of shunting and maintenance; the translation movement is rapid but gentle, that is to say, without sudden movements, the tolerances being minimum and the elements in contact being preloaded. In more detail, the sliding shoe (11) engages and translates in the rail (20) thanks to the guides with preloaded rollers or balls, substantially acting as an idle bearing; in this way the wear is minimum because the loads and frictions are minimum. The motor, with on-board coils and fixed magnets on the rail, does not have parts in contact or moving parts, therefore the degree of wear is null.

Said shuttle (10) integrates coils (102) which are selectively supplied in such a way as to generate the propulsive force absorbing from the rail (20) the forces of attraction provided by the permanent magnets (201), in particular maximizing the component parallel to the direction of travel of said force and compensating for the other components as much as possible, and thus with minimized loads, friction and wear of the rotating elements (FIG. 7d). It can also be observed that also in the curved portions of the path, such a solution has a high dynamics of movement without generating heat. In particular, the invention provides:

maximum flexibility of movement of the shuttle in both translation directions, along the entire path; the shuttle can brake, accelerate, position itself or exert a force, both when stationary and during motion. It can move independently or, like every linear motor, it can synchronize with other motors, and always without cables which would reduce its mobility. In the case in which the path is of the loop type the shuttles can circulate continuously following the flow of the product, if necessary with reverse flow portions to facilitate processing, to shorten the cycle-time, reduce the number of workstations or to make the plant more compact;

maximum flexibility of movement for multiple shuttles at the same time; they can translate independently of one another, all referring in any case to an absolute position transducer or encoder. Moreover, they can position themselves with respect to one another also preventing collisions in an automatic way, or they can move in a synchronous way in groups. Such a solution is particularly useful near the workstations in which a group of some shuttles can transit together, stopping at or crossing the station at a predefined speed depending on the specific working process or control, to then proceed in an independent way according to its own mission or repeating said operation many times; therefore, it is evident that the size of each group, in the number and pace between the shuttles involved, can be varied dynamically;

system without limits of configuration of the path and number of shuttles, in such a way as to be adapted in an optimal way to the different application requirements; basically, the only limit in the expansion of the system is intrinsic in the processing capabilities of the central server;

constant and uniform force, also to operate in synergy between the shuttles one behind the other; for example, it is possible to handle in pairs a large-sized product holding it like a necking, or providing load relief or opposition according to particular operating conditions;

acceleration and centrifugal forces can advantageously be limited, as for example occurs for the transport of liquids in open containers;

the control of the variable inclination of the plane of the tray (12a) transported by the sliding shoe (11) or mover, by means of one or more secondary controlled axes on the sliding shoe which are synchronized with the law of motion of the sliding shoe itself, can be advantageously performed.

In more detail as to said shuttle (10), the following active and control and communication means can be included on board:

means for receiving power supply from the rail (20), wirelessly, for example with sliding contacts of the brushes (101, 202) type or without contacts, for example for the energy transfer by means of electromagnetic induction, to the moving coils (102);

said moving coils (102);

logic control unit (103) for managing the primary advancing movement, or motion control, along the axis of the rail and for the entire path, and the control of the secondary working axes;

driving means (104), or driver units, for managing the drives related to the working processes along the controlled axes further with respect to said primary movement, such as the drives of passing-through and hollow lifting means (108) with vacuum for holding the cell (40) or wafer;

means for making pressure or vacuum for the purposes of the working processes, for example a vacuum pump (105) with pipes or a pump with a Venturi device, with interface means such as contact suction cups and with differentiated circuits for holding the equipped tray (12a) and for holding the cell (40) or wafer;

circuit board for managing on-board communication, with access ports for software update and/or for control diagnostics;

antenna for wireless communication, for example for the update of data and/or of the missions and/or of the positions;

collision sensor means for preventing the collision of shuttles;

transducer means with position sensors (110) of the mobile reader type for the fixed, continuous and absolute reference, which is in the rail, or absolute encoders, for a micrometric control of position;

means for proximity communication, such as systems of the optical type, with a high transmission speed, in such a way that for the fine positioning in a given position it is advantageous not to wait for the response of the conventional central wireless transmission system;

furthermore, an equipped tray is provided (12a) to actuate the secondary working drives, which is supported and/or constrained in a removable way by said sliding shoe (11) in such a way as to support and/or transport the product according to the provided working processes; said equipped tray (12a), specifically for supporting and positioning said photovoltaic cell (40) or wafer or substrate during silk-screen printing.

In particular, an equipped tray is provided (12a) for the specific printing operation to be performed on the cell (40) or wafer, which comprises: pin centering bushes (120), internal ducts (123) for vacuum connected on the top and on the bottom for the purpose of holding the cells (40) or wafers, differentiated from the vacuum circuits made in the trays to facilitate the operations of filling with the printed paste in the holes of the cells of the MWT (Metal Wrap Through) type or the like, holes made on the surface in correspondence of said ducts for vacuum, such as the superficial holding holes (121) of the cell or wafer or the lower holes (124) of connection of the vacuum circuit; holes of passage (122) for the lifting means (108); references for optical reading for the purpose of identification, references for optical reading for the purpose of positioning, centering elements and/or angular references for the picking-up by external means and systems of release of the tray by the sliding shoe in correspondence of external means such as in a workstation (FIGS. 10-11, 16, 22-5). In an embodiment variant and for particular printing requirements, said equipped tray is of the conditioned type, being for example thermostatically controlled.

For the purposes of the invention, said external picking-up means are preferably tray lifting means, integral with the workstation, acting as vertical sliders to lift, release and/or incline said tray (12a, 40) for printing, with a tilting function as well; said means being for example configured as a portal (304) of calibrated lifting or, in an embodiment variant (304a), being like corner pusher means which engage to the tray on the respective seats and act in pairs for the purpose of said tilting of the tray (FIGS. 23-25).

In more detail said rail (20) comprises:

power supply means, with a fixed line of electrical power to be transferred to the moving shuttles, in two alternative ways: by contact (202), with brushes (101) on the shuttles (FIGS. 3-5), or without contact, for example by means of electromagnetic induction, where instead of the brushes there are some specific receivers on the shuttles (FIG. 9h);

fixed permanent magnets (201), for concatenating the magnetic flux of the linear motors of the coils on said shuttles;

fixed magnetic line of the encoder type, for providing the position sensors on the shuttles with an absolute reference;

signal line for data and communication transmission from and to the moving shuttles.

Such a system allows for multiple configurations of the automated path:

fixed paths or variable paths by means of switches, which are easily allowed by the simplified nature of the rails with respect to the conventional solution with supplied coils, which does not allow it or anyway limits it. For example, it is suitable for linear configurations of the top/bottom type with lateral overturning, simple (FIGS. 6-8) or coupled in pairs (FIG. 20a), or for continuous loop configurations in the form of a circuit (FIGS. 9, 27-8);

closed or open;

linear, curved or combined, that is to say, both linear and curved, consisting of only linear portions and joined to each other by the transfer of the shuttles by means of translation or overturning and/or rotation platforms, along the path there are operating stations which perform operations with the possibility of synchrony with respect to the presence or non-presence of the shuttles.

Therefore, such a system provides new and advantageous operating possibilities:

precision and accuracy in the positioning of every single shuttle, shuttles moving in an independent but coordinated way, management and communication of the missions from the central level to every single shuttle, management and execution of the mission autonomously by the single shuttle, both in terms of movement and in terms of control of the movement and/or working axes on the shuttle, each shuttle acts from time to time as a master or as a slave, depending on the particular traffic situation or on the particular mission or also in case of specific encodings or occurred and detected accidents, each shuttle can simultaneously carry out different missions, for example with a specific path, operating cycle, number of stops, each shuttle can carry out operations according to assigned logics independently of whether it is moving or it is stationary, in the queue at a workstation or being machined in the latter.

The whole integrated system (1) is coordinated by a centralized control system consisting of a central server (2) provided with programs which are intended to superintend the overall management, it being able at least to:

send and receive information to and from the shuttles;

hold the details of the possible missions for the shuttles;

assign missions to the single shuttles;

receive progress states from the shuttles;

synchronize events and operations, for example between shuttles and stations;

control and store the progress of the working processes, for example with datalog and/or data warehouse and/or system statistics, overall diagnostics and safety and alarm management.

Said configuration of the system and shuttles can also easily include special shuttles (10a), that is to say, intended to perform diversified missions, with particular and different purposes with respect to the other shuttles (10) of the system which carries out the printing cycle, for example the cleaning of the silk-screen printing screen (302) or other components of the plant (FIGS. 26a-b); said special shuttle (10a) maintaining the same handling and coordination logic as the system (1, 2, 11, 20).

In more detail, said integrated handling system (1) with independent and coordinated shuttles (10) provided with an equipped tray (12a), as described above, allows to industrially realize an innovative and advantageous method of silk-screen printing on photovoltaic cells, that is to say, of the type metallization of wafers of crystalline silicon. Said method for example can be carried out in a plant (30) with workstations, modular as well, with: an initial automated loading station (S1) of the cells on the shuttles; at least one silk-screen printing station (S2) with mobile doctor blades with a portal of release and calibrated lifting of the tray wherein handling implements said shuttle system (1, 10, 12a, 20); a final automated unloading station (S4) for example with buffers; and wherein the drying station (S3), which is also called hardening station or dryer, is possibly included or it is alternatively provided as a separate element, after unloading. In more detail said method, with particular and specific reference to silk-screen printing on cells (40) or wafers, includes the following operating steps (F1-10):

(F1) Loading, in correspondence of a loading station (S1), of at least one container of cells (40) or wafers, for example four containers with one hundred cells each, individually inserted in superimposed housings in the internal rack of said container, which is preferably loaded in a loading device intended to translate it up to a position equipped with an automatic lowerator which progressively descends at every extraction of a cell or wafer, which is individually extracted from said housing by an extractor device of the conventional type which enters the housing, lifts said cell or wafer, extracts it by translation and, by lowering, lays it onto a conveyor belt which translates said cell or wafer under a vision system (3a) which scans it and checks its integrity for the purpose of the following positioning. If from this check it emerges that said cell (40) or wafer is undamaged, it is translated and picked with a robotic picking device for example of the pick and place type (301), then it is moved and laid already aligned according to a desired orientation, for example that of the direction of movement of the printing doctor blade as it is preferable in the case of fingers and/or busbars, onto said equipped tray (12a) with vacuum and fiducial references, which is associated in a removable way with said self-propelled sliding shoe (11) to form said shuttle (10), which is in a loading waiting position. Said shuttle is therefore included in an industrial handling system (1) of the type with independent shuttles (10) on a rail (20) as described above. The repeatability of the positioning of said cell or wafer on the tray occurs with a tolerance of +/−2 mm. If, on the other hand, the vision system (3a) finds that said cell or wafer is not undamaged, it is discarded in a specific container. Said container of the cells or wafers progressively descends as they are extracted, in such a way as to always provide the following cell or wafer to be unloaded at the correct extraction level; when the container is empty, it descends completely to be discharged on a belt outlet way where various empty containers, for example four containers, can progressively queue up. The time needed to change the container of the cells or wafers, from the just emptied one to the full one, can be concealed by the previous accumulation in a conventional storing system of the buffer type, intended to maintain the continuity of the flow of said cells or wafers while the container is being changed.

(F2) Translation, with a ride on the shuttle (10), up to a vision system (3b) which checks alignment: as soon as said cell (40) or wafer is laid on said empty equipped tray (12a), a vacuum system (105, 123) on the shuttle (10) is activated which is intended to hold said cell or wafer on said equipped tray (12a). At the same time, said shuttle starts its transfer mission, which consists in going from said loading station to the position of control of alignment, realizing an assigned law of motion, namely with a given acceleration ramp, reaching of a maximum speed which is kept constant and then progressive deceleration until reaching the planned position. This law of motion is realized by means of the activation of the control system of the linear motor which realizes the translation of the shuttle, whose correct position is checked with an on-board absolute decoder, of the proximity sensor type, with respect to the magnetic band on the rail. The law of motion can advantageously be varied by said shuttle (10) upon occurrence of some random conditions, which it will assess from time to time while performing the assigned mission. For example, a condition which may occur is the constant speed queuing to another shuttle reached on the same rail; in this case the proximity sensor on the shuttle, activated in the direction of travel, warns the reaching shuttle within a time limit of the order of milliseconds, informing the logic unit which is on the shuttle and checks it, in such a way as to immediately reduce speed until adapting it to that of the reached shuttle. In the case in which the reached shuttle on the same rail stops or had already stopped, the reaching shuttle will stop in proximity thereto; as soon as the reached shuttle leaves again, the following shuttle, too, will start its motion again according to the assigned law of motion until completing its mission. Therefore, there is a control system of the alignment of the cell (40) or wafer on said tray (12*a*) comprising at least one automatic vision system (3*b*) intended to determine its position with respect to the fiducial references of the tray; as soon as the shuttle (10) reaches said vision system, in case it is of the type with matrix camera it will stop framed by the camera placed above the rail for the image grabbing of the position of the cell or wafer with respect to said fiducial references placed on said tray (12*a*); on the other hand, in case the vision system is of the line scan camera type, the shuttle will transit at a constant speed without stopping framed by the camera placed above the rail for the progressive image grabbing of the position of the wafer, interpolated with the advancement of the shuttle, always for determining its position with respect to said fiducial references.

(F3) Alignment of the printing screen (302): the information concerning the positioning of said cell (40) or wafer on the plane of said tray (12*a*) is one of the inputs to the algorithm of positioning of the silk-screen printhead (306) which orientates the printing screen (302) aligning it with micrometric precision according to said positioning of the cell or wafer on the tray, in such a way as to reproduce with precision and repetitiveness the desired image, or pattern, of said screen on the surface of the cell or wafer adapting to the change in its position on the tray, always in the positioning tolerances given from time to time by said loading station. Basically, the screen chases the position of said cell or wafer. The following information (FIG. 29) contributes to the processing of the alignment position of the screen (302):

a—Saved calibration parameters of the printhead (306): a one-time activity carried out upon installation or maintenance of the silk-screen printhead, for which the offset parameters for the translations, rotations and orthogonality of the controlled axes are defined, said parameters being also defined as identification data of that head;

b—Saved calibration parameters for each tray (12*a*), as tray identification: according to the construction repeatability and precision of each tray, a set of parameters defining the offsets determined by the variability of the position of the fiducial references on the front surface of each tray with respect to the centering bushes on the back of the tray is saved and associated with each tray, said parameters being also defined as identification data of that tray;

c—Saved calibration parameters for each printing screen (302): according to the construction repeatability and precision of each screen, a set of parameters defining the offsets determined by the variability of the position of the fiducial references on the screen with respect to the image to be printed contained in the screen itself is saved and associated with each screen, said parameters being also defined as identification data of that screen;

d—Information received from the vision systems which are intended to determine from above the exact position of said cell or wafer with respect to the fiducial references of that tray (3*a*-*b*), called wafer-tray relative position, and intended to determine from the bottom the exact position of the image of the screen by means of its fiducial points (3*c*);

e—Information received from a vision system (3*d*), positioned after the execution of printing, which grabs the image and controls the printed cell, that is to say, it determines the position of the actually printed image with respect to the wafer or cell.

(F4) Printing: after said image grabbing (3*b*), the shuttle (10-2, 40) translates to below the printhead (306), provided that this position is free. During this positioning, the shuttle (10) suspends the vacuum for holding the tray (12*a*). When the shuttle is in the printing position, under said printhead (306) in correspondence of said already aligned screen (302), pusher means (304, 304*a*) of calibrated lifting are activated, which are integral with the structure of the printing station which also integrates the printhead (306) and the screen (302), and which are intended to lift said tray (12*a*) from the shuttle (10), that is to say, from the centering pins which constrain it thereto, up to the printing height. To this purpose, said pusher means (304, 304*a*) are equipped with centering systems, which are calibrated and centred with respect to said position of the screen, in such a way as to ensure micrometric precision with high repeatability in the positioning of the tray (12*a*). The latter, when it is released from the shuttle (10), is held by a system which keeps it in adhesion to the pushers, preferably with suction cups; the latter act on the external periphery of the tray in such a way as to enable the excursion and oscillation of the tray, namely its tilting, around a horizontal axis orthogonal to the advancing direction of the doctor blade (307). The pushers (304*a*) are in pairs, are operated by vertical linear motors, engaging at the four corners of the tray (12*a*) in whose back face the engagement seats of the top of the pushers are obtained. Preferably, a pair of pushers (304*a*) with spherical head engages firmly on a side of the tray having engagement seats with spherical or conical cap, like hinges which enable the rotation of the tray (12*a*) only around a horizontal axis orthogonal to the advancing direction of the doctor blade (307); the other pair of pushers, acting as a mere support and opposition to the push of the silk-screen printhead (306), on the other hand engages seats on the back of the tray (12*a*) such as to enable its relative sliding with respect to said pushers (304). This inclination potential of the tray allows to maintain a constant angle, or anyway a desired angle, between the surface of the tray itself and the surface of the screen behind the doctor blade, upon change of the position of the doctor blade itself during its printing stroke, for improved and constant printing quality. Therefore, such an advantage is obtained by realizing a gradual and progressive inclination of the tray by means of the two pairs of pushers having the axes controlled and coordinated with the movement of the doctor blade which, in its turn, is performed on an axis which, in its turn, is controlled and coordinated by the Plc system that manages the printing station. Therefore, printing occurs by means of a doctor blade (307) which is operated vertically and along its stroke by a pair of coordinated linear motors; said doctor blade has a horizontal stroke which allows the operator controlling the station to see the whole printing operation, the dynamics of the paste on the screen and near the doctor blade itself. If the tray (12*a*) is kept stably horizontal, the doctor blade (307) by pushing the screen (302) with its lower side creates an angle of the screen itself with respect to the surface to be printed, on the cell (40) or wafer, which is greater at the beginning of the stroke or angle of attack, as compared to the angle at the end of the stroke or departure angle; in particular, it is known that upon departure there occurs a condition close to the tangency of the screen to the just printed surface, with a high risk that the just deposited paste or ink, instead of remaining on the printing support, that is to say, on said cell or wafer, is sucked by the screen itself with serious damage to printing quality. In order to avoid this problem, one traditionally increases the distance between the screen and the surface to be printed, also called snap-off, and the printing pressure; basically, a screen larger than the image to be printed is used. However, it is known that such remedies have limited effectiveness and in any case lead to negative consequences on the service life of the screen, on the stability and on the quality of the printed image; in fact, it often happens that there is a different amount of paste or ink at the attack with respect to departure, with equal geometry to be printed, for example in the fingers of a photovoltaic cell, with a consequent waste of printed material. In particular, in case of said photovoltaic cells the wasted material consists of a paste which is mostly based on silver and which is thus very expensive, to the detriment of printing quality as well. The invention solves said drawbacks with the gradual and progressive inclination of the printing support, that is to say, the tray (12a), with respect to the position of said doctor blade (307), as described above, in such a way as to always ensure a constant or desired angle between the surface of the screen and that of the printed substrate. At the end of the stroke of the doctor blade the tray (12a) is lowered and taken back by said pushers (304) in a horizontal position, until it engages again with the centering pins of the shuttle (10). The suction cups of the printing station cease the vacuum and thus the holding, the holding vacuum being instead activated on the shuttle (10) which acts with separate circuits on the holding, that is to say, both of the cell (40) or wafer to the tray (12a) and of the tray to the shuttle (10). Said vertical movement of the tray (12a) in correspondence of the silk-screen printhead (306) performed by linear motors with micrometric positioning in height, substantially reduces the vertical movements of the head itself with consequent advantages in terms of reduction in wear and in the vibrations of the head, as well as of reduction in processing times, since the tray (12a) is extremely more lightweight than said head (306).

(F5) Translation, with a ride on the shuttle (10) up to a vision system (3d) which performs the image grabbing and the control of the printed cell. This mission consists in going from the printing execution position to the printing control position realizing an assigned law of motion. This station comprises at least one automatic vision system (3d) with a line scan camera and high definition; the shuttle (10) transits at a constant speed without stopping over framed by the camera placed above the rail (20) for the progressive image grabbing by scanning of said cell (40) or wafer, interpolated with the advancement of the shuttle. On the basis of the analysis and computerized processing of this image one can define and classify printing quality on the basis of pre-assigned criteria and determine a judgement of suitability or non-suitability of the printing operation which has just been carried out. According to this judgement said cell may proceed in the working process by a following unloading station or be destined for a different destination for further analysis or reprocessing or discard. The information acquired from said image grabbing of the printed cell is thus used for determining and controlling the position of the actually printed image with respect to the cell or wafer, that is to say the printed image-wafer relative position; this information can then be advantageously provided to the screen alignment algorithm for the successive tray, that is to say, for an updated and revised determination of the alignment coordinates of the screen or to provide reports on the deterioration of the screen and the need for its replacement. In this way it is possible to correct and prevent printing drift. Furthermore, in the same station in which said image grabbing and control of the printed cell take place, a check and/or update can be carried out by means of a special algorithm of the adjustment data or offset for the screen-head-tray combination in such a way that, when it occurs again afterwards, it can have a more up-to-date determination of the screen alignment coordinates (FIG. 29).

(F6) Translation, with a ride on the shuttle (10), up to an unloading system: the shuttle transports said just printed and controlled cell to a following unloading station realizing an assigned law of motion. The possibility of reaching other shuttles (10), stationary or moving, will always be managed as described above. When approaching the stop in the unloading position, in order to save cycle time, said shuttle (10) accomplishes in advance the rise of on-board lifting means (108) in such a way as to pre-arrange said cell already lifted from the tray (12a) and ready for unloading; such lifting means (108), acting as passing-through extractors, are operated by the same control logic as said handling system (1) with shuttles (10) on a rail (20) and are integrated in the shuttle (10) being of the internally hollow sliding pin type, equipped with suction cups at the top, and hold said cell during the operation of lifting to the unloading level, thanks to the vacuum created by means of a generator device which is on the shuttle (10) itself.

(F7) Unloading, in an unloading station: the shuttle (10) suspends the surface vacuum which holds the tray and a fork is inserted below said cell already lifted with respect to the tray but in any case held by said suction cups placed on the top of said lifting means (108); said fork further lifts the cell disengaging it from said top suction cups of the sliders on the shuttle which simultaneously cease the holding vacuum and, with the control by an overlooking vision system, translates it onto a transport system, for example a belt transport system, which takes it out of the printing station for the following destinations.

(F8) Overturning of the shuttle (10), with an overturning means (205): the shuttle emptied from said transported cell is overturned by 180° degrees (50c) by means of a device intended to overturn a whole section of rail (206) including guides, magnets and power supply system by a rotary motor with slip-rings for the control and the continuity of power supply. The control of rotation is performed with an encoder which provides high positioning precision, so as to allow the shuttle (10) to exit when the rotation has been completed and to take a new section of rectilinear rail (50b) placed at a lower level with respect to the forward one (50a), for the return of the shuttle to the initial loading station. Said overturning means (205) can also make partial rotations, for example of 90° degrees (50e) for making said shuttle (10) exit on a section of rail intended for particular purposes such as maintenance or other purposes. The overturning means can rotate every time and not before a shuttle has finished transiting completely into or out of the section of rail belonging to the overturning means itself (FIGS. 6-8, 19-20).

(F9) Translation, with a ride of the shuttle (10) up to an automatic system of control and replacement of the trays (12a): said shuttle translates overturned on the return rail realizing an assigned law of motion up to an automatic system of control and replacement of the trays. The possibility of reaching other shuttles (10), stationary or moving, is always managed as described above; therefore, during return the direction of travel is opposite to the previous one and the activated anti-collision proximity sensors are opposite to the previous ones. The automatic station of control of the trays comprises at least one automatic vision system which acquires the image of the surface of the tray (12a) during the coordinated translation of the shuttle at constant speed. This control particularly checks the state of cleanliness of the paper that covers the tray; if from this control, with respect to preassigned comparison parameters, it emerges that this surface is not clean, the shuttle stops in an automatic station of tray replacement. In said station the shuttle (10) releases the tray (12*a*) suspending the vacuum for holding the tray which, made free, descends and rests on sliding means which in the meantime have risen in contact with the tray itself and accompany it downwards on a belt unloading way. Clean trays (12*a*), which have been previously prepared, are in a queue waiting to be translated, always by means of a belt, into the position in which said sliding means, going up, can take a new clean tray (12*a*) up to the contact and engagement of the centering pins (109) in the waiting shuttle (10), being placed in correspondence thereof. Therefore, said shuttle (10) activates the on-board vacuum and holds the new tray, said sliding means of the replacement station descend and the complete shuttle can leave again.

(F10) Translation, with a ride of the shuttle (10) towards the loading and overturning station: said shuttle translates upside down on the return rail (50*b*) realizing an assigned law of motion up to the other end of the rail where it enters an overturning means (205) which is identical and symmetrical with respect to that described above (F8). Said shuttle is thus overturned again by 180° degrees (50*d*) in such a way as to go back to the initial position, in the loading station, being ready to start a new cycle.

In a preferred configuration of the invention, the described method is simultaneously applied to two adjacent but independent twin vertical-loop systems with superimposed rails (FIGS. 21-3). In said configuration the two silk-screen printheads (306) are side by side and overlooking and overhanging, each being centred on the vertical of the respective handling rails (20) of the trays. In this way the operator can access, always remaining on the same side of the two adjacent rails, both printheads for the normal operations of cleaning, screen control or replacement and paste restoration. The overturning means (205) near the ends of the rails (206) can carry out simultaneous rotations, as counter-rotating, without the risk of collisions. This configuration allows for great compactness and ergonomics of the machinery, ease of management and cost-effectiveness as a whole.

Therefore, such a solution allows for the advantageous repetition of said printing method for all the cells to be printed, in a continuous cycle. In addition, there is provided the automatic periodic cleaning of the screen and/or other silk-screen printing means by said special shuttle (10*a*) equipped with the cleaning means, instead of the shuttle with the cell (10, 40).

Said production method can be industrially carried out in an advantageous way by means of an automatic and modular production plant (30) (FIGS. 17-25, 27-28, 30), of the multistation type, which alternatively provides:

a path of the substantially horizontal loop type, in the form of a circuit, articulated as well, with the rail equipped with one single track facing upwards in such a way as to enable the continuous circulation of the shuttles (FIGS. 9, 27-8). It can be observed that, in that case, said Steps of overturning and upside down return of the shuttle (F8-10) are not provided, on the other hand all the other steps (F1-7) being provided;

a path of the linear type with a rail with a double vertically superimposed track, wherein a track is placed on the top for the working processes in sequence and one is placed on the bottom for the return of the shuttles with the empty tray, in such a way as to act as a vertical loop thanks to the lateral overturning by 180° of the single shuttles (F1-10). Said linear and compact path, possibly having a coupled configuration in which two rails with a double superimposed track are adjacent in such a way as to enable the upside down rotation of the shuttles, for the purpose of overturning, in a reciprocally opposite direction (FIGS. 6-8, 22-3).

Therefore, in order to carry out the above-described printing method, the invention provides the implementation of said handling system (1, 10, 20) at least in the printing station (S2) there further being provided, in the service of said printing station (S2), at least one previous loading station of the cells or wafers, and one following unloading station; and wherein drying may be included in the plant immediately after printing or carried out separately, afterwards. In more detail, the plant mainly provides:

an initial loading station (S1), wherein a robotic device of the pick and place type (301) picks the single cells or wafers from boxes arranged in rows, for example on two lateral lines coplanar to the rail (20), and places them in the empty tray (12*a*) of each waiting shuttle (10);

at least one silk-screen printing station (S2) wherein in correspondence of the printing equipment, which has a horizontal screen with mobile spatulas and is placed above the rail, there is a mobile device of calibrated lifting (304) of the tray shaped as a portal, for example on four retractable pillars which release and pick the tray at the corners and lift it rotating it in such a way as to position the cell correctly, if necessary tilting it, lifting it until contacting the screen from below, this operation being controlled by means of a combined vision system from above for scanning the position of the cell and also the fiducial points with the bar code of the tray (FIGS. 20-5, 30);

a possible drying station (S3) or dryer, to carry out the hardening or curing of the silk-screen printing application, being for example of the UV furnace type or with resistors (FIGS. 27*a-c*). The invention provides to implement said shuttle handling system (1, 10, 20) at least in said silk-screen printing station (S2); therefore, said drying station (S3) can be included in order to realize a continuous-loop completely automated plant (FIGS. 27-8), with said shuttles (10) which horizontally cross said hardening station (S3) as well or, for construction simplicity and comfort, said drying (S3) is outside said shuttle system (1, 10, 20) which is thus implemented in the printing station (S2) only in a compact vertical-loop configuration with lateral overturning (FIGS. 6-8), preferably with a double adjacent rail and opposite overturnings (FIGS. 20*a-b*). In that case the drying (S3) can be after the automated unloading station (S4), therefore said printing station (S2) directly interfaces the loading (S1) and the unloading (S4), or it can occur between the printing (S2) and the unloading (S4), the portion between the two stations (S2, S4) being served by a conveyor belts handling system which crosses said drying station (S3).

the final automated unloading station (S4).

At least said printing station (S2), and possibly the hardening station (S3), is of the modular and compact type, individually enclosable in a protective structure (303) of the box type, for example in the form of a right-angled parallelepiped, formed by vertical posts and horizontal crosspieces and closed by opaque closing panels and/or transparent plates removable for vision, also with side openings at the height of the working plane to be crossed by the rail/rails (FIG. 17).

Moreover, since said stations are of the modular and compact type, they can be easily repeated several times along the path in order to increase the productivity of the plant in such a way as to configure it advantageously and make it in scale according to production requirements and/or to the available spaces. For example, it has been experimentally observed that a plant with two printing stations enables a productivity of about 3500 wph, while a solution with three printing stations makes 5250 wph, substantially with the same handling system (FIG. 28).

In order to maximize positioning and facilitate the operations of the printing station (306, S2), the printing doctor blade (307) preferably moves actuated by linear motors on horizontal and vertical axes, in a separate but coordinated way. Furthermore, for greater efficiency and cleanliness, in combination with it an additional doctor blade operates for the collection of the ink or conductive paste, which similarly performs movements on vertical and horizontal axes of the separate but coordinated type by means of linear motors, in such a way as to perform the movements at the end of the printing stroke in superimposition and simultaneously, reducing the cycle time. As an alternative, the movements of said doctor blades during printing are synchronous, adjacent and close in such a way as to create a closed space interposed between them, preventing the spilling of paste or ink on the screen (302); in another version, with a specific command given via software by the printing operator, the movements of said doctor blades during printing are synchronous but spaced-out in such a way as to allow the operator to see the behaviour of the paste or ink.

In the plant (30), in order to determine and control the relative positions of the cell (40) or wafer with respect to the tray (12*a*) and of the image or printing pattern on the tray, and therefore with respect to said cell or wafer, multiple vision systems (3) are advantageously integrated. Preferably, for the purposes of the invention, the plant (30) provides four vision systems (3*a-d*) for each printhead (306) or processing line (FIGS. 19-20, 25, 27):

the first vision system (3*a*), from above and with a matrix camera because said cell (40) or wafer is stationary in correspondence of the loading station (S1), is combined with the robotic loading system; depending on the feedback of the last camera positioned after printing (3*d*), it allows to load said cell or wafer in a position which is as aligned as possible to the printing direction of the doctor blade (307) of said head (306); if, on the other hand, it (40) is broken or damaged, it is automatically discarded. This solution is fundamental for the invention, for the purpose of obtaining maximum printing quality, since the screen (302) is rotated in a position such as to chase said cell (40) or wafer but sometimes this characteristic implies an inclination of the screen, although minimum, with respect to the direction of the movement of said doctor blade (307). In more detail, since today one tries to obtain increasingly thin metallized elements also with screens (302) having printing openings of a size of 35 microns for each finger, for the purposes of the invention it is advantageous to pre-arrange said cell or wafer as oriented as possible in such a way that said thin openings of the screen remain parallel to the direction of movement of the doctor blade, or aligning said cell or wafer from the beginning of the printing cycle without moving it any longer, it then being held firmly on said equipped tray (12*a*), as a consequence the screen will then be placed depending on the orientation of the wafer;

the second vision system (3*b*), from above, is placed before the printhead to check the actual position of the cell (40) or wafer with respect to the fiducial points of that tray (12*a*);

the third vision system (3*c*), from below, is placed below the printing screen (302) to identify where the image of the screen or printing pattern exactly is, detecting the fiducial points of the screen itself. In more detail, in said printhead (306) said screen is advantageously driven by axes or linear motors, controlled with positionings of the micrometric type in such a way as to manage its positioning in X, Y and Theta (θ) rotation on the plane parallel to the plane of printing and position of said cell or wafer; furthermore, it can be observed that the vertical axis Z, too, is controlled, that is to say, said positioning is managed both locally, with the vertical control of the doctor blade (307), and as a whole by means of the control of the head (306);

the fourth vision system (3*d*), from above and with line camera, detects during the outgoing transit of the tray after printing the actually printed image with respect to said cell or wafer.

Therefore, said algorithm (FIG. 29) for determining the coordinates of the screen (302) in action during the normal working operation comprises the processing of the information or input from said vision systems (3*a-c*) to instruct said head (306) in such a way as to correctly orientate the screen (302) and then also the check with the successive vision system (3*d*) of the correctness of the printing carried out; depending on the result of this check, the central server (2) of the plant carries out an analysis which is intended to determine whether a progressive drift is taking place comparing the last printed image with an average of a parameterized mobile interval, for example relating to the last 50 cells or wafers. In more detail and for example, if a deviation higher than a given parametric value V1 emerges from this analysis, one intervenes on said algorithm introducing a correction offset to compensate for said drift; if, on the other hand, the deviation is still greater, namely higher than a parametric value V2, then one can wait for a N number of successive cells or wafers, for example greater than or equal to 1, to check the passing of this value V2 to then raise the alarm and stop the plant (30), or in case of an accident or damage to the screen. With said algorithm, therefore, from time to time and for each cell (40) or wafer it is possible to determine with precision the coordinates of the printing screen (302); such adjustment is additional to the procedure of calibration of the head (306) with respect to the tray (12*a*), which is carried out upon installation or maintenance, or to the procedure of calibration with respect to the screen which is carried out at every screen change.

In practice it has been ascertained that the implementation of said handling system (1) with shuttles (10, 20) with on-board coils is particularly suitable for printing photovoltaic cells (40) or wafers according to the method according to the present invention and with the above-described automatic production plant (30), simultaneously allowing to implement a new class of functions, also operable at the same time in different positions of the plant. Such a system for printing cells or wafers is innovative and advantageous, and is particularly flexible and effective in solving the problems found in the known solutions in a cost-effective way. Furthermore, it has been ascertained that the method and the plant according to the invention allow to obtain significantly better performances than the known solutions in terms of printing quality, productivity and overall costs; moreover, in case of breaking of a cell or wafer the contamination of the handling equipment is prevented, thus avoiding any consequence for the successive cells.

REFERENCE (1) industrial handling system with independent and coordinated shuttles, synchronous and/or asynchronous, on a power-supplied rail which integrates the permanent magnets, wherein said shuttles are made up of self-propelled sliding shoes which integrate the coils, the logic unit, the means for communication and the secondary drives, which are individually associated in a removable way with an equipped tray to actuate the secondary drives according to processing.
(2) central server;
(3) control camera for vision system, being as a non-exhaustive example: in correspondence of loading (3a) for the detection and control of the single cell or wafer from above, upstream of the printhead (3b) for the detection from above of the wafer-tray relative position, under the screen (3c) for the detection from below of the position of the image to be printed, downstream of said head (3d) for the detection and control from above of the printed image-wafer relative position;
(10) shuttle;
(10a) special equipped shuttle, for example for the automatic cleaning of the screen and/or of the plant;
(11) self-propelled sliding shoe, called slider or mover, with on-board coils;
(12) interface means, particularly an equipped tray (12a) for actuating the secondary working drives and for supporting and positioning with precision the cell or wafer during the printing processes, also in the variant with increased sizes (12b);
(101) means for the transmission of power from the rail to the trolley, for example brushes;
(102) on-board coils, for the primary movement along the rail;
(103) compartment with the logic control unit, for the primary movement of advancement of the linear motor and the secondary working drives, also intended to manage communication and sensors;
(104) secondary driving means of the driver units type;
(105) vacuum pump;
(106) suction cups for holding and release;
(107) tray backlighting plate;
(108) lifting means of the cell or wafer, integrated in the sliding shoe and passing-through, being intended to lift and hold with vacuum;
(109) centering pins of the tray;
(110) position sensor of the absolute encoder type;
(111) roller or ball sliding shoes of the trolley which engage in the guide;
(112) housing;
(113) variant of equipped tray with increased sizes;
(120) pin centering bushes;
(121) vacuum holding holes on the upper surface of the tray;
(122) passage holes for the lifting and/or extracting means;
(123) ducts for vacuum inside the tray;
(124) connection of the vacuum circuit;
(20) power-supplied rail which integrates along the path the permanent magnets for the primary movement of the shuttles, being of the bidirectional top/bottom type in the vertical loop configurations with lateral overturning, or even of the simple rail type for horizontal loop configurations;
(201) permanent magnets;
(202) power-supplied seat of sliding and contacting of the brushes;
(203) guide integral with the rail;
(204) fixed section of rail;
(205) rotation overturning means;
(206) overturnable section of rail;
(30) automatic production plant for printing on photovoltaic cells or wafers, of the silk-screen printing machine type with even asynchronous and sequential workstations;
(301) robotic device of the pick and place type;
(302) horizontally arranged silk-screen printing screen, of the adjustable, that is to say, orientable type;
(303) protective structure, of the box type;
(304) tray lifting means, integral with the workstation, acting as a vertical slider for lifting, releasing and/or inclining the tray for the purpose of printing, with a tilting function as well; said means, being for example a portal (304) of calibrated lifting or, in an embodiment variant (304a), being a corner pusher which engages to the tray on the respective seats and acts in pair for the purpose of tilting;
(305) tappet unit;
(306) silk-screen printhead;
(307) doctor blade or spatula mobile on axes, of the adjustable type, for spreading out silk-screen printing ink or paste, being preferably operated by linear motors on a horizontal and a vertical axis in a separate but coordinated way, and wherein in a variant of the invention in combination with it an additional collection doctor blade operates.
(40) photovoltaic cell or wafer;
(50a-e) handling direction in the vertical loop configuration with lateral overturning on a bidirectional rail where (50a) is the forward direction, (50b) is the return in the opposite direction below, (50c-d) is the lateral rotation by 180° of the shuttle or overturning and (50e) is the exit after the rotation of 90° for particular working processes or replacements;
(F1-10) operating steps of the method according to the invention;
(S1-4) main workstations, with at least one initial station (S1) of automated loading of the cells on the shuttles, at least one silk-screen printing station (S2) with horizontal film and mobile spatulas with a portal of release and calibrated lifting of the tray for the purpose of printing, at least one final station (S4) of automated unloading with buffers, with a possible drying station (S3) of the silk-screen deposit which is between said printing and unloading or is external.

The invention claimed is:

1. A method for printing inks or pastes on a photovoltaic cell or wafer on shuttles on a rail in a automatic production plant, the method comprising:
loading the photovoltaic cell or wafer at a loading station, the loading station having at least one container of the photovoltaic cell or wafer, the step of loading comprising automatically individually extracting the photovoltaic cell or wafer from the at least one container and laying the extracted photovoltaic cell or wafer onto a conveyor belt;
translating the extracted photovoltaic cell or wafer on the conveyor belt below a vision system to determine damaged photovoltaic cell or wafer and undamaged photovoltaic cell or wafer;
picking the undamaged photovoltaic cell or wafer with a robotic picking device and aligning the undamaged photovoltaic cell or wafer in a desired orientation on an equipped tray, the equipped tray having a vacuum and a fiducial reference and a centering device, the equipped tray being removably positioned in or on a shuttle on a rail with a linear motor so as to be in a loading waiting position;

discarding the damaged photovoltaic cell or wafer;

translating the photovoltaic cell or wafer on the shuttle to another vision system, the vision system checking alignment of the photovoltaic cell or wafer on the equipped tray relative to the fiducial reference;

vacuum securing the photovoltaic cell or wafer onto the equipped tray and simultaneously transferring the shuttle from the loading station;

orienting a printing screen with a silk-screen printhead so as to align the printing screen relative to the position of the photovoltaic cell or wafer on the equipped tray, the orienting of the printing screen being in accordance with saved calibration parameters of the printhead, saved calibration parameters for the equipped tray, saved calibration parameters for the printing screen, information received from the another vision system as to the position of the photovoltaic cell or wafer on the equipped tray, an image to be printed of the printing screen, and information received from a post-printing vision system;

translating the shuttle to below the printhead so that the photovoltaic cell or wafer is in a printing position in correspondence to the oriented printing screen;

holding and lifting the equipped tray from the shuttle up to a printing height by pushers, the pushers having a centering system that is calibrated with respect to the position of the printing screen, the pushers being operated by vertical linear motors so that the pushers engage in pairs at four corners of the equipped tray so as to enable oscillation or tilting of the equipped tray around a horizontal axis orthogonal to an advancing direction of a printing doctor blade in the printhead, a pair of the pushers having a spherical head that is rotatable and another pair of the pushers supporting the printing doctor blade so as to enable relative sliding and an angle between a surface of the equipped tray and the surface of the printing screen upon a change a position of the printing doctor blade during a printing stroke;

gradually and progressively inclining the equipped tray during printing by two pairs of the pushers having axes thereof controlled and coordinated with a movement of the printing doctor blade, the printing doctor blade moving vertically along a stroke thereof by a pair of motors;

lowering the equipped tray at an end of the stroke of the printing doctor blade by the pushers back to a horizontal position until the equipment tray engages with centering pins of the shuttle;

translating the shuttle to at least one automatic vision system so as to obtain an image and to control the printed cell, the at least one automatic vision system having a high-definition line scan camera that scans a surface of the equipped tray, automatically sending the image of the printed photovoltaic cell or wafer for printing quality control and to determine whether or not to continue the process and to determine a position of the printed image with respect to the printed photovoltaic cell or wafer and to correct the saved calculation parameters of the printhead, the equipped tray and the printing screen;

moving the shuttle to an unloading station such that the printed photovoltaic cell or wafer is at an unloading position;

lifting the printed photovoltaic cell or wafer from the equipped tray, the lifting being by a lifter passing through sliding pins with a suction cup at a top thereof, the suction cup holding the printed photovoltaic cell or wafer during the step of lifting; and unloading the printed photovoltaic cell or wafer with a fork at the unloading station, the fork being inserted below the photovoltaic cell or wafer so as to lift, disengage and transfer of the printed photovoltaic cell or wafer by control of an overlooking vision system, the printed photovoltaic cell or wafer being moved onto a transport system so as to be removed from the unloading station.

2. The method of claim 1, further comprising:

overturning the shuttle with a rotary motor and a positioning encoder such as to empty the shuttle, the step of overturning comprising overturning and entire section of the rail so as to allow the shuttle to exit and move to a new rail section therebelow in order to selectively return to the loading station.

3. The method of claim 2, further comprising:

acquiring an image of a surface of the overturned equipped tray so as to determine a cleanliness of the overturned equipped tray;

releasing the equipped tray from the shuttle if the overturned equipped tray is not determined to be clean;

transporting a replacement clean equipped tray to the shuttle; and engaging the replacement clean equipped tray to the centering pins on the shuttle.

4. The method of claim 2, further comprising:

translating the shuttle from the loading station by causing the shuttle to be upside-down on the new rail; and overturning the overturned shuttle at an initial position at the loading station.

5. The method of claim 1, wherein the rail of the automatic production plant comprises adjacent and independent superimposed rails of a pair of two vertical-loop handling systems, the silk-screen printhead comprising a pair of silk-screen printheads arranged side-by-side.

6. The method of claim 1, further comprising:

drying the printed photovoltaic cell or wafer between the steps of printing and of unloading.

7. The method of claim 1, further comprising:

cleaning the silk-screen printhead after the step of printing.

8. The method of claim 1, wherein the step of printing comprises:

moving the printing doctor blade on a horizontal axis and a vertical axis by use of linear motors, collecting ink or conductive paste by an additional printing doctor blade by moving the additional printing doctor blade on horizontal and vertical axes with additional linear motors.

9. The method of claim 1, wherein the shuttle is at least a pair of shuttles, the method further comprising:

sending and receiving information to and from the at least a pair of shuttles so as to coordinate and control the movement of the at least a pair of shuttles, the information selected from the group consisting of details of missions for the at least a pair of shuttles, assigning missions to the at least a pair of shuttles, receiving progress states from the at least a pair of shuttles, synchronizing events and operations, and performing diagnostics and alarms.

10. An automatic production plant for printing on a photovoltaic cell or wafer, the automatic production plant comprising:

a handling system with independent and coordinated shuttles, the independent and coordinated shuttles being engaged with a common rail, the independent and coordinated shuttles having a linear synchronous motor such that the linear synchronous motor is driven along the common rail by the linear synchronous motor, the common rail having permanent magnet there that interacts with the linear synchronous motor, each of the independent and coordinated shuttles being wirelessly connected to controls for information transmission;

a power supply being connected to the independent and coordinated shuttles by sliding contacts to the fixed power feeding bar or by electromagnetic induction;

absolute encoders with a fixed and integrated reference continuously along an entire path of the rail, the absolute encoders adapted to automatically determine a position of each of the independent and coordinated shuttles;

a reader mounted on each of the independent and coordinated shuttles, said reader cooperating with said absolute encoders;

a centralized controlled processing system having a central server having a control logic with execution programs that are adapted to process the information received from the independent and coordinated shuttles;

a self-propelled sliding shoe on each of the independent and coordinated shuttles, said self-propelled sliding shoe comprising a slider constrained to the common rail in a removable manner, the self-propelled sliding shoes being autonomous and independent, said self-propelled sliding shoe having the linear synchronous motor therein;

an equipped tray on each of the independent and coordinated shuttles, said equipped tray adapted to support and position the photovoltaic cell or wafer thereon;

an automatic loading station cooperative with said equipped tray and with the independent and coordinated shuttles, said at least a pair of shuttles adapted to place a single photovoltaic cell or wafer onto said equipped tray of each of the independent and coordinated shuttles;

a printing station crossed by said handling system, said printing station having a printhead;

vertical pushers cooperative with said equipped tray so as to lift said equipped tray so as to position the photovoltaic cell or wafer below a printing screen and to incline the photovoltaic cell or wafer in a variable manner;

a printing doctor blade movably positioned in said printing screen, said printing doctor blade movable toward the printing screen and the photovoltaic cell or wafer;

at least one automatic unloading station cooperative with the independent and coordinated shuttles and with the printed photovoltaic cell or wafer, said at least one automatic unloading station adapted to remove the photovoltaic cell or wafer from said equipped tray, and a plurality of automatic vision systems arranged in series so as to automatically control an alignment of the printing screen relative to the position of the photovoltaic cell or wafer, said plurality of automatic vision systems comprising:

a first vision system cooperative with said loading station so as to detect and control the photovoltaic cell or wafer prior to loading onto the equipped tray;

a second vision system upstream of the printhead that detects a relative position of the equipped tray and the photovoltaic cell or wafer;

a third vision system below the printing screen that detects a position of the image to be printed; and a fourth vision system downstream of the printing head that detects a relative position of the printed image and photovoltaic cell or wafer.

11. The automatic production plant of claim 10, further comprising:

at least one drying station positioned between said printing station and said automatic unloading station.

12. The automatic production plant of claim 10, wherein the printing doctor blade has linear motors that drive the printing doctor blade along a horizontal axis and a vertical axis in a separate and coordinated manner, the automatic production plant further comprising:

an additional printing doctor blade having linear motors that drive said additional printing doctor blade along a horizontal axis and a vertical axis in a separate and coordinated manner, said additional printing doctor blade adapted to collect ink or conductive paste.

* * * * *